(12) United States Patent
Hidaka

(10) Patent No.: US 6,922,355 B2
(45) Date of Patent: Jul. 26, 2005

(54) THIN FILM MAGNETIC MEMORY DEVICE CAPABLE OF CONDUCTING STABLE DATA READ AND WRITE OPERATIONS

(75) Inventor: Hideto Hidaka, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/842,417

(22) Filed: May 11, 2004

(65) Prior Publication Data

US 2004/0208052 A1 Oct. 21, 2004

Related U.S. Application Data

(62) Division of application No. 10/050,810, filed on Jan. 18, 2002.

(30) Foreign Application Priority Data

Apr. 26, 2001 (JP) .................................... 2001-128962
Aug. 10, 2001 (JP) .................................... 2001-243983

(51) Int. Cl.$^7$ .......................... G11C 11/00; G11C 7/02; G11C 5/08; G11C 11/15; G11C 11/34; G11C 7/00

(52) U.S. Cl. ..................... 365/158; 365/55; 365/66; 365/173; 365/182; 365/189.09; 365/210

(58) Field of Search .................. 365/158, 55, 66, 365/173, 189.09, 210, 171

(56) References Cited

U.S. PATENT DOCUMENTS

| | | | |
|---|---|---|---|
| 5,587,943 A | 12/1996 | Torok et al. | |
| 5,640,343 A | 6/1997 | Gallagher et al. | |
| 5,894,447 A | 4/1999 | Takashima | |
| 6,081,445 A | 6/2000 | Shi et al. | |
| 6,104,632 A | 8/2000 | Nishimura | |
| 6,166,948 A | 12/2000 | Parkin et al. | |
| 6,169,688 B1 * | 1/2001 | Noguchi ..................... | 365/171 |
| 6,178,112 B1 | 1/2001 | Bessho et al. | |
| 6,215,695 B1 | 4/2001 | Ikeda | |
| 6,317,375 B1 | 11/2001 | Perner | |
| 6,396,735 B2 | 5/2002 | Michijima et al. | |
| 6,473,336 B1 | 10/2002 | Nakajima et al. | |
| 6,480,411 B1 | 11/2002 | Koganei | |
| 6,480,412 B1 | 11/2002 | Bessho et al. | |
| 6,482,657 B2 | 11/2002 | Shimazawa | |
| 6,490,190 B1 | 12/2002 | Ramcke et al. | |
| 6,509,621 B2 | 1/2003 | Nakao | |
| 6,519,179 B2 | 2/2003 | Minakata et al. | |
| 6,721,203 B1 * | 4/2004 | Qi et al. ..................... | 365/173 |
| 6,778,425 B1 * | 8/2004 | Odagawa et al. .......... | 365/158 |
| 2001/0012228 A1 * | 8/2001 | Perner ........................ | 365/210 |
| 2001/0021537 A1 | 9/2001 | Shimazawa | |

(Continued)

FOREIGN PATENT DOCUMENTS

KR 1998-024995 7/1998

OTHER PUBLICATIONS

Scheuerlein, et al., "A 10ns Read and Write Non–Volatile Memory Array Using A Magnetic Tunnel Junction and FET Switch in Each Cell" ISSCC Digest of Technical Papers. TA7.2. Feb. 2000, pp. 94–95, 128–129, 409–410.

(Continued)

Primary Examiner—Hoai Ho
Assistant Examiner—Ly Duy Pham
(74) Attorney, Agent, or Firm—McDermott Will & Emery LLP

(57) ABSTRACT

A tunnel magnetic resistive element forming a magnetic memory cell includes a fixed magnetic layer having a fixed magnetic field of a fixed direction, a free magnetic layer magnetized by an applied magnetic field, and a tunnel barrier that is an insulator film provided between the fixed and free magnetic layers in a tunnel junction region. In the free magnetic layer, a region corresponding to an easy axis region having characteristics desirable as a memory cell is used as the tunnel junction region. A hard axis region having characteristics undesirable as a memory cell is not used as a portion of the tunnel magnetic resistive element.

5 Claims, 40 Drawing Sheets

U.S. PATENT DOCUMENTS

| | | | |
|---|---|---|---|
| 2001/0025978 A1 | 10/2001 | Nakao | |
| 2001/0053104 A1 * | 12/2001 | Tran et al. | 365/210 |
| 2002/0018361 A1 * | 2/2002 | Hoffmann et al. | 365/158 |
| 2002/0058158 A1 | 5/2002 | Odagawa et al. | |
| 2002/0080644 A1 * | 6/2002 | Ito | 365/158 |

OTHER PUBLICATIONS

Durlam, et al., Nonvolatile RAM Based on Magnetic Tunnel Junction Elements, ISSCC Digest of Technical Papers, TA7.3, Feb. 2000, pp. 96–97, 130–131, 410–411.

Numata, et al., Magnetic Random Access Memory(M-RAM), Technical Report of IEICE, Mar. 2000, pp. 13–18.

Naji, et al., "A 258kb 3.0V 1TMTJ Nonvolatile Magnetoresistive RAM" ISSCC Digest of Technical Papers, TA7.6, Feb. 6, 2001, pp. 94–95, 122–123, 404–405, 438.

U.S. Appl. No. 09/887,321, filed Jun. 25, 2001.

U.S. Appl. No. 09/834,638, filed Apr. 16, 2001.

U.S. Appl. No. 09/805,043, filed Mar. 14, 2001.

U.S. Appl. No. 09/832,025, filed Apr. 11, 2001.

U.S. Appl. No. 09/852,087, filed May 10, 2001.

U.S. Appl. No. 09/944,346, filed Sep. 4, 2001.

* cited by examiner

THIN FILM MAGNETIC MEMORY DEVICE CAPABLE OF CONDUCTING STABLE DATA READ AND WRITE OPERATIONS

"This application is a divisional of U.S. application Ser. No. 10/050,810, filed in Jan. 18, 2002, whose content is incorporated herein in its entirety by reference."

BACKGROUND OF THE INVENTION

1. Field of the Invention

The present invention generally relates to a thin film magnetic memory device. More particularly, the present invention relates to a random access memory (RAM) including memory cells having a magnetic tunnel junction (MTJ).

2. Description of the Background Art

An MRAM (Magnetic Random Access Memory) device has attracted attention as a memory device capable of non-volatile data storage with low power consumption. The MRAM device is a memory device capable of non-volatile data storage using a plurality of thin film magnetic elements formed in a semiconductor integrated circuit and also capable of random access to each thin film magnetic element.

In particular, recent announcement shows that the performance of the MRAM device is significantly improved by using thin film magnetic elements having a magnetic tunnel junction (MTJ) as memory cells. The MRAM device including memory cells having a magnetic tunnel junction is disclosed in technical documents such as "A 10 ns Read and Write Non-Volatile Memory Array Using a Magnetic Tunnel Junction and FET Switch in each Cell", ISSCC Digest of Technical Papers, TA7.2, February 2000, and "Nonvolatile RAM based on Magnetic Tunnel Junction Elements", ISSCC Digest of Technical Papers, TA7.3, February 2000.

FIG. 66 is a schematic diagram showing the structure of a memory cell having a magnetic tunnel junction (hereinafter, also simply referred to as "MTJ memory cell").

Referring to FIG. 66, the MTJ memory cell includes a tunnel magnetic resistive element TMR having its electric resistance value varying according to the storage data level, and an access transistor ATR. The access transistor ATR is formed from a field effect transistor, and is coupled between the tunnel magnetic resistive element TMR and ground voltage Vss.

For the MTJ memory cell are provided a write word line WWL for instructing data write operation, a read word line RWL for instructing data read operation, and a bit line BL serving as a data line for transmitting an electric signal corresponding to the storage data level in the data read and write operations.

FIG. 67 is a conceptual diagram illustrating the data read operation from the MTJ memory cell.

Referring to FIG. 67, the tunnel magnetic resistive element TMR has a magnetic layer FL having a fixed magnetic field of a fixed direction (hereinafter, also simply referred to as "fixed magnetic layer FL"), and a magnetic layer VL having a free magnetic field (hereinafter, also simply referred to as "free magnetic layer VL"). A tunnel barrier TB formed from an insulator film is provided between the fixed magnetic layer FL and free magnetic layer VL. According to the storage data level, either a magnetic field of the same direction as that of the fixed magnetic layer FL or a magnetic field of the direction different from that of the fixed magnetic layer FL has been written to the free magnetic layer VL in a non-volatile manner.

In the data read operation, the access transistor ATR is turned ON in response to activation of the read word line RWL. As a result, a sense current Is flows through a current path formed from the bit line BL, tunnel magnetic resistive element TMR, access transistor ATR and ground voltage Vss. The sense current Is is supplied as a constant current from a not-shown control circuit.

The electric resistance value of the tunnel magnetic resistive element TMR varies according to the relative relation of the magnetic field direction between the fixed magnetic layer FL and free magnetic layer VL. More specifically, when the fixed magnetic layer FL and free magnetic layer VL have the same magnetic field direction, the tunnel magnetic resistive element TMR has a smaller electric resistance value as compared to the case where both magnetic layers have different magnetic field directions. The electric resistance values of the tunnel magnetic resistive element corresponding to the storage data "1" and "0" are herein represented by Rh and Rl, respectively (where Rh>Rl).

Thus, the electric resistance value of the tunnel magnetic resistive element TMR varies according to an externally applied magnetic field. Accordingly, data storage can be conducted based on the variation characteristics of the electric resistance value of the tunnel magnetic resistive element TMR.

A voltage change produced at the tunnel magnetic resistive element TMR by the sense current Is varies depending on the magnetic field direction stored in the free magnetic layer VL. Therefore, by starting supply of the sense current Is with the bit line BL precharged to a high voltage, the storage data level in the MTJ memory cell can be read by monitoring a change in voltage level on the bit line BL.

FIG. 68 is a conceptual diagram illustrating the data write operation to the MTJ memory cell.

Referring to FIG. 68, in the data write operation, the read word line RWL is inactivated, so that the access transistor ATR is turned OFF. In this state, a data write current for writing a magnetic field to the free magnetic layer VL is applied to the write word line WWL and bit line BL. The magnetic field direction of the free magnetic layer VL is determined by combination of the respective directions of the data write currents flowing through the write word line WWL and bit line BL.

FIG. 69 is a conceptual diagram illustrating the relation between the direction of the data write current and the direction of the magnetic field in the data write operation.

Referring to FIG. 69, a magnetic field Hx of the abscissa indicates the direction of a magnetic field H(BL) produced by the data write current flowing through the bit line BL. A magnetic field Hy of the ordinate indicates the direction of a magnetic field H(WWL) produced by the data write current flowing through the write word line WWL.

The magnetic field direction stored in the free magnetic layer VL is updated only when the sum of the magnetic fields H(BL) and H(WWL) reaches the region outside the asteroid characteristic line shown in the figure. In other words, the magnetic field direction stored in the free magnetic layer VL is not updated when a magnetic field corresponding to the region inside the asteroid characteristic line is applied.

Accordingly, in order to update the storage data of the tunnel magnetic resistive element TMR by the data write operation, a current must be applied to both the write word line WWL and bit line BL. Once the magnetic field direction, i.e., the storage data, is stored in the tunnel magnetic resistive element TMR, it is retained therein in a non-volatile manner until another data write operation is conducted.

The sense current Is flows through the bit line BL in the data read operation. However, the sense current Is is generally set to a value that is about one to two orders smaller than the data write current. Therefore, it is less likely that the storage data in the MTJ memory cell is erroneously rewritten by the sense current Is during the data read operation.

The magnetization characteristics of the magnetic layers of each MTJ memory cell significantly affect the memory cell characteristics. In particular, when a change in magnetization direction for data storage becomes less likely to occur in the tunnel magnetic resistive element TMR due to end effects of the magnetic element or the like, the magnetic field required for the data write operation is increased, causing increase in power consumption and magnetic noise due to the increased data write current. Moreover, a variation in electric resistance value depending on the storage data level is reduced, causing reduction in signal margin in the data read operation.

In the MRAM device using the tunnel magnetic resistive element, reduction in memory cell size is difficult for the structural reason. In particular, it is difficult to realize the folded-bit-line structure that is effective in improving a signal margin in the data read operation and is generally applied to a dynamic random access memory (DRAM) or the like.

Moreover, in the folded-bit-line structure, complementary bit lines forming a bit line pair are respectively coupled to a memory cell to be read and a read reference voltage. By amplifying the voltage difference between the complementary bit lines, the data read operation is conducted with a large signal margin. Accordingly, the read reference voltage must be set in view of the electric resistance values Rh and Rl of the tunnel magnetic resistive element. However, it is difficult to accurately set the read reference voltage while allowing manufacturing variation.

SUMMARY OF THE INVENTION

It is an object of the present invention to provide a thin film magnetic memory device including memory cells using a tunnel magnetic resistive element having uniform magnetization characteristics.

It is another object of the present invention to provide a thin film magnetic memory device capable of ensuring a large signal margin in the data read operation while allowing manufacturing variation.

It is still another object of the present invention to provide a thin film magnetic memory device having a memory cell arrangement suitable for improved integration, in particular, a memory cell arrangement suitable for a folded-bit-line structure.

In summary, according to the present invention, a thin film magnetic memory device formed on a semiconductor substrate includes a plurality of memory cells for storing data. Each memory cell includes an access element rendered conductive for forming a path of a data read current, and a magnetic storage portion coupled in series with the access element and having an electric resistance varying according to storage data. The thin film magnetic memory device further comprises a first magnetic layer formed on the semiconductor substrate and having a fixed magnetization direction, a second magnetic layer formed on the semiconductor substrate and magnetized in a direction according to an externally applied magnetic field, and an insulating film formed between the first and second magnetic layers. The magnetic storage portion is formed using a prescribed partial region in a planar direction of the second magnetic layer.

Accordingly, a primary advantage of the present invention is that the magnetic storage portion in each memory cell can be formed so as to have uniform magnetization characteristics. This assures a signal margin of the data read operation as well as reduces a data write current required for the data write operation, allowing for suppression in current consumption and magnetic noise.

According to another aspect of the invention, a thin film magnetic memory device includes a plurality of memory cells, a dummy memory cell, a first data line, a second data line, and a data read circuit. An electric resistance value of each memory cell varies according to a storage data level. The dummy memory cell produces a read reference voltage. The dummy cell includes a plurality of cell units each having a same structure as that of the memory cell. The plurality of cell units retain storage data of different levels at least on a one-by-one basis. The first data line is connected to a selected one of the plurality of memory cells in data read operation. The second data line is connected to the dummy memory cell. The data read circuit senses a voltage difference between the first and second data lines.

Accordingly, the read reference voltage can be produced based on the data stored in the cell units having the same structure as that of the memory cell. As a result, the data read operation can be conducted with a large signal margin by setting the read reference voltage to an appropriate level while allowing manufacturing variation.

According to still another aspect of the invention, a thin film magnetic memory device includes a plurality of memory cells, a plurality of read word lines, a plurality of write word lines, and a plurality of bit lines. The plurality of memory cells are arranged in rows and columns. The plurality of read word lines are provided respectively corresponding to the memory cell rows, for conducting row selection in data read operation. The plurality of write word lines are provided respectively corresponding to the memory cell rows, for conducting row selection in data write operation. The plurality of bit lines are provided respectively corresponding to the memory cell columns, for passing therethrough a data write current and a data read current in the data write and read operations, respectively. Each of the plurality of memory cells includes a magnetic storage portion having an electric resistance varying according to storage data, and an access transistor coupled in series with the magnetic storage portion between a corresponding bit line and a first voltage. The access transistor includes a gate coupled to a corresponding read word line, a first contact for coupling a source region to the first voltage, and a second contact provided adjacent to the first contact in the column direction, for coupling a drain region to the magnetic storage portion. The first and second contacts are repeatedly arranged in a same manner in every memory cell row. The memory cells are shifted by ½ pitch between adjacent memory cell columns. The write word lines are each formed in a layer located above the bit lines.

Thus, the memory cells corresponding to each read word line are connected to every other bit line. Therefore, the memory cell arrangement suitable for the data read operation based on the folded-bit-line structure can be realized without increasing the cell size. Moreover, the distance between the magnetic storage portions can be increased as compared to the case where the memory cells are not shifted. This suppresses magnetic-field interference between the memory cells, whereby an operation margin can be ensured. The memory cell pitch in the row direction can be easily ensured, allowing for improved integration of the memory array.

According to yet another aspect of the invention, a thin film magnetic memory device includes a plurality of memory cells, a plurality of read world lines, a plurality of write word lines, and a plurality of bit lines. The plurality of memory cells are arranged in rows and columns. The plurality of read word lines are provided respectively corresponding to the memory cell rows, for conducting row selection in data read operation. The plurality of write word lines are provided respectively corresponding to the memory cell rows, for conducting row selection in data write operation. The plurality of bit lines are provided respectively corresponding to the memory cell columns, for passing therethrough a data write current and a data read current in the data write and read operations, respectively. Each of the plurality of memory cells includes a magnetic storage portion having an electric resistance varying according to storage data, and an access transistor coupled in series with the magnetic storage portion between a corresponding bit line and a first voltage. The access transistor includes a gate coupled to a corresponding read word line, a first contact for coupling a source region to the first voltage, and a second contact provided adjacent to the first contact in the column direction, for coupling a drain region to the magnetic storage portion. The first and second contacts are inverted in position between adjacent memory cell rows. The memory cells are shifted by prescribed pitch between adjacent memory cell columns. The write word lines are each formed in a layer located above the bit lines.

Thus, the distance between the magnetic storage portions can be increased as compared to the case where the memory cells are not shifted. This suppresses magnetic-field interference between the memory cells, whereby an operation margin can be ensured. The memory cell pitch in the row direction can be easily ensured, allowing for improved integration of the memory array.

According to a further aspect of the invention, a thin film magnetic memory device includes a plurality of memory cells, a plurality of read world lines, a plurality of write word lines, and a plurality of bit lines. The plurality of memory cells are arranged in rows and columns. The plurality of read word lines are provided respectively corresponding to the memory cell rows, for conducting row selection in data read operation. The plurality of write word lines are provided respectively corresponding to the memory cell rows, for conducting row selection in data write operation. The plurality of bit lines are provided respectively corresponding to the memory cell columns, for passing therethrough a data write current and a data read current in the data write and read operations, respectively. Each of the plurality of memory cells includes a magnetic storage portion having an electric resistance varying according to storage data, and an access transistor coupled in series with the magnetic storage portion between a corresponding bit line and a first voltage. The access transistor includes a gate coupled to a corresponding read word line, a first contact for coupling a source region to the first voltage, and a second contact provided adjacent to the first contact in the column direction, for coupling a drain region to the magnetic storage portion. The first and second contacts are repeatedly arranged in a same manner in every memory cell row. The first and second contacts are inverted in position between adjacent memory cell columns. The write word lines are each formed in a layer located above the bit lines.

Thus, the distance between the magnetic storage portions can be increased. This suppresses magnetic-field interference between the memory cells, whereby an operation margin can be ensured. The memory cell pitch in the row direction can be easily ensured, allowing for improved integration.

According to a still further aspect of the invention, a thin film magnetic memory device includes a plurality of memory cells, a plurality of read world lines, a plurality of write word lines, and a plurality of bit lines. The plurality of memory cells are arranged in rows and columns. The plurality of read word lines are provided respectively corresponding to the memory cell rows, for conducting row selection in data read operation. The plurality of write word lines are provided respectively corresponding to the memory cell rows, for conducting row selection in data write operation. The plurality of bit lines are provided respectively corresponding to the memory cell columns, for passing therethrough a data write current and a data read current in the data write and read operations, respectively. Each of the plurality of memory cells includes a magnetic storage portion having an electric resistance varying according to storage data, and an access transistor coupled in series with the magnetic storage portion between a corresponding bit line and a first voltage. The access transistor includes a gate coupled to a corresponding read word line, a first contact for coupling a source region to the first voltage, and a second contact provided adjacent to the first contact in the column direction, for coupling a drain region to the magnetic storage portion. The first and second contacts are repeatedly arranged in a same manner in every memory cell row. The first and second contacts are inverted in position between adjacent memory cell columns. The memory cells are shifted by ½ pitch between adjacent memory cell columns.

Thus, the memory cells corresponding to each read word line are connected to every other bit line. Therefore, the memory cell arrangement suitable for the data read operation based on the folded-bit-line structure can be realized without increasing the cell size.

According to a yet further aspect of the invention, a thin film magnetic memory device includes a plurality of memory cells, a plurality of read world lines, a plurality of write word lines, and a plurality of bit lines. The plurality of memory cells are arranged in rows and columns. The plurality of read word lines are provided respectively corresponding to the memory cell rows, for conducting row selection in data read operation. The plurality of write word lines are provided respectively corresponding to the memory cell rows, for conducting row selection in data write operation. The plurality of bit lines are provided respectively corresponding to the memory cell columns, for passing therethrough a data write current and a data read current in the data write and read operations, respectively. Each of the plurality of memory cells includes a magnetic storage portion having an electric resistance varying according to storage data, and an access transistor coupled in series with the magnetic storage portion between a corresponding bit line and a first voltage. The access transistor includes a gate coupled to a corresponding read word line, a first contact for coupling a source region to the first voltage, and a second contact provided adjacent to the first contact in the column direction, for coupling a drain region to the magnetic storage portion. The first and second contacts are inverted in position between adjacent memory cell rows. The first and second contacts are inverted in position between adjacent memory cell columns. The write word lines are each formed in a layer located above the bit lines.

Thus, the memory cell arrangement suitable for the data write operation based on the folded-bit-line structure can be realized without increasing the cell size. Moreover, the memory cell pitch in the row direction can be easily ensured, allowing for improved integration of the memory array.

According to a yet further aspect of the invention, a thin film magnetic memory device includes a plurality of memory cells, a plurality of read world lines, a plurality of write word lines, and a plurality of bit lines. The plurality of memory cells are arranged in rows and columns. The plurality of read word lines are provided respectively corresponding to the memory cell rows, for conducting row selection in data read operation. The plurality of write word lines are provided respectively corresponding to the memory cell rows, for conducting row selection in data write operation. The plurality of bit lines are provided respectively corresponding to the memory cell columns, for passing therethrough a data write current and a data read current in the data write and read operations, respectively. Each of the plurality of memory cells includes a magnetic storage portion having an electric resistance varying according to storage data, and an access transistor coupled in series with the magnetic storage portion between a corresponding bit line and a first voltage. The access transistor includes a gate coupled to a corresponding read word line, a first contact for coupling a source region to the first voltage, and a second contact provided adjacent to the first contact in the column direction, for coupling a drain region to the magnetic storage portion. The first and second contacts are inverted in position between adjacent memory cell rows. The first and second contacts are inverted in position between adjacent memory cell columns. The memory cells are shifted by ¼ pitch between adjacent memory cell columns. The write word lines are each formed in a layer located above the bit lines.

Thus, the memory cells corresponding to each read word line are connected to every other bit line. Therefore, the memory cell arrangement suitable for the data read operation based on the folded-bit-line structure can be realized without increasing the cell size.

According to a yet further aspect of the invention, a thin film magnetic memory device includes a plurality of memory cells, a plurality of read world lines, a plurality of write word lines, and a plurality of bit lines. The plurality of memory cells are arranged in rows and columns. The plurality of read word lines are provided respectively corresponding to the memory cell rows, for conducting row selection in data read operation. The plurality of write word lines are provided respectively corresponding to the memory cell rows, for conducting row selection in data write operation. The plurality of bit lines are provided respectively corresponding to the memory cell columns, for passing therethrough a data write current and a data read current in the data write and read operations, respectively. Each of the plurality of memory cells includes a magnetic storage portion having an electric resistance varying according to storage data, and an access transistor coupled in series with the magnetic storage portion between a corresponding bit line and a first voltage. The access transistor includes a gate coupled to a corresponding read word line, a first contact for coupling a source region to the first voltage, and a second contact provided adjacent to the first contact in the column direction, for coupling a drain region to the magnetic storage portion. The first contact is shared by corresponding two memory cells located adjacent to each other in the column direction and forming a single arrangement unit. The write word lines are each formed in a layer located above the bit lines.

Thus, the memory cells can be arranged with a reduced number of contacts of the access transistors.

According to a yet further aspect of the present invention, a thin film magnetic memory device includes a plurality of memory cells for retaining storage data. Each of the memory cells includes an access gate selectively turned ON in data read operation, and a magnetic storage portion connected in series with the access gate, and having either a first or second electric resistance depending on the storage data. The magnetic storage portion includes a first magnetic layer having a fixed magnetization direction, a second magnetic layer that is magnetized either in a same direction as, or in a direction opposite to, that of the first magnetic layer depending on the storage data to be written, and a first insulating film formed between the first and second magnetic layers. The thin film magnetic memory device further includes: a data line that is electrically coupled to the magnetic storage portion of a selected memory cell through a turned-ON access gate of the selected memory cell in data read operation, the selected memory cell being a memory cell selected from the plurality of memory cells for the data read operation; a reference data line for transmitting in the data read operation a read reference voltage for comparison with a voltage on the data line; and a plurality of dummy memory cells for producing the read reference voltage, each of the dummy memory cells being provided for every fixed set of the memory cells. Each of the dummy memory cells includes a dummy magnetic storage portion, and a dummy access gate selectively turned ON in the data read operation, for electrically coupling the dummy magnetic storage portion to the reference data line. The dummy magnetic storage portion includes a third magnetic layer that is magnetized in a fixed direction, a fourth magnetic layer that is magnetized in a direction that crosses the magnetization direction of the third magnetic layer, and a second insulating film formed between the third and fourth magnetic layers.

Such a thin film magnetic memory device is capable of setting an electric resistance of the dummy magnetic storage portion having the same structure as that of the magnetic storage portion in the memory cell to an intermediate value of two electric resistances of the memory cell each corresponding to the storage data. This allows a dummy memory cell for producing a read reference voltage to be fabricated without complicating the manufacturing process.

According to a yet further aspect of the present invention, a thin film magnetic memory device includes a plurality of memory cells for retaining storage data. Each of the memory cells includes an access gate selectively turned ON in data read operation, and a magnetic storage portion connected in series with the access gate, and having either a first electric resistance or a second electric resistance higher than the first electric resistance depending on the storage data. The magnetic storage portion includes a first magnetic layer having a fixed magnetization direction, a second magnetic layer that is magnetized in a same direction as, or in a direction opposite to, that of the first magnetic layer depending on the storage data to be written, and a first insulating film formed between the first and second magnetic layers. The thin film magnetic memory device further includes: a data line that is electrically coupled to the magnetic storage portion of a selected memory cell through a turned-ON access gate of the selected memory cell in data read operation, the selected memory cell being a memory cell selected from the plurality of memory cells for the data read operation; a reference data line for transmitting in the data read operation a read reference voltage for comparison with a voltage on the data line; and a plurality of dummy memory cells for producing the read reference voltage, each of the dummy memory cells being provided for every fixed set of the memory cells. Each of the dummy memory cells includes a dummy access gate selectively turned ON in the data read operation, and a plurality of dummy magnetic storage portions that are electrically coupled to the reference data line in response to turning-ON of the dummy access gate. Each of the dummy magnetic storage portions includes a third magnetic layer that is magnetized in a fixed direction, a fourth magnetic layer that is magnetized either in a same direction as, or in a direction opposite to, that of the third magnetic layer, and a second insulating film formed between the third and fourth magnetic layers. Each of the dummy magnetic storage portions is connected in series with at least one of the remainder.

Such a thin film magnetic memory device is capable of producing a read reference voltage by a dummy memory cell that includes a dummy magnetic storage portion having the same structure and magnetized in the same manner as that of the magnetic storage portion of the memory cell. This enables fabrication of the dummy memory cell without complicating the manufacturing process. Moreover, a reduced voltage can be applied to a tunnel barrier (second insulating film) in each dummy memory cell, allowing for improved reliability of the dummy memory cell that is selected frequently.

According to a yet further aspect of the present invention, a thin film magnetic memory device includes: a plurality of magnetic memory cells for retaining storage data written by an applied magnetic field; and a dummy memory cell for generating a read reference voltage in data read operation. Each of the magnetic memory cells and the dummy memory cell include a magnetic storage portion having either a first electric resistance value or a second electric resistance value that is higher than the first electric resistance value depending on a level of the storage data, and an access gate connected in series with the magnetic storage portion, and selectively turned ON. The thin film magnetic memory device further includes: a first data line that is electrically coupled to a magnetic memory cell selected from the plurality of magnetic memory cells in data read operation so that a data read current is supplied to the first data line; a second data line that is electrically coupled to the dummy memory cell in data read operation so that a data read current equal to that of the first data line is supplied to the second data line; a data read circuit for producing read data based on respective voltages on the first and second data lines; and a resistance adding circuit for adding a third electric resistance in series with the first data line, the third electric resistance being smaller than a difference between the first and second electric resistance values. The magnetic storage portion in the dummy memory cell stores a data level corresponding to the second electric resistance value.

Such a thin film magnetic memory device enables the memory cell and the dummy memory cell to have the same structure, allowing a data read margin to be assured according to manufacturing variation.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
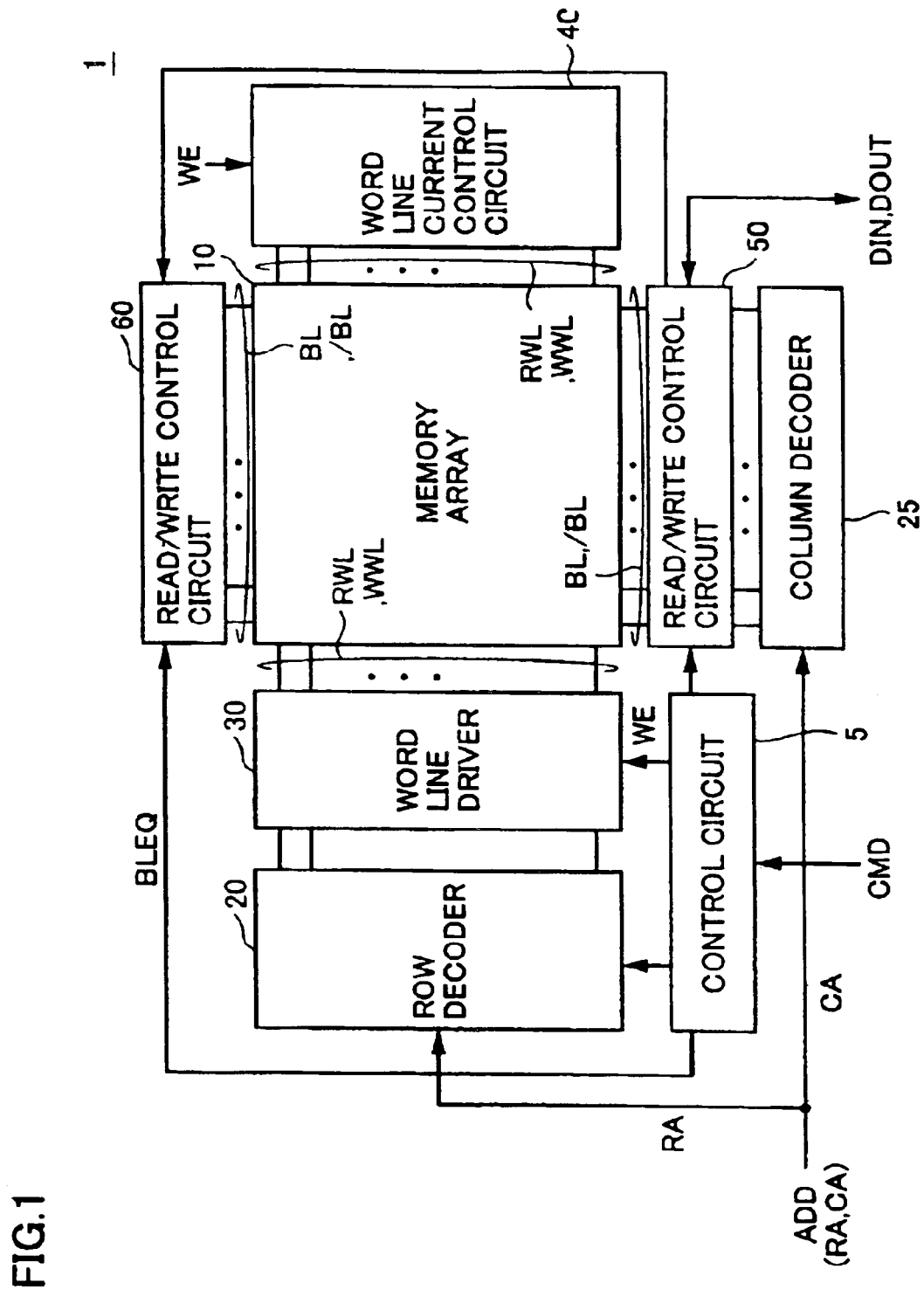
FIG. 1 is a schematic block diagram showing the overall structure of an MRAM device 1 according to an embodiment of the present invention.

Hereinafter, embodiments of the present invention will be described in detail with reference to the accompanying drawings. Note that the same reference numerals and characters denote the same or corresponding portions throughout the figures.

First Embodiment

Referring to FIG. 1, an MRAM device 1 according to an embodiment of the present invention conducts random access in response to an external control signal CMD and address signal ADD, thereby inputting write data DIN and outputting read data DOUT.

The MRAM device 1 includes a control circuit 5 for controlling the overall operation of the MRAM device 1 in response to the control signal CMD, and a memory array 10 having a plurality of MTJ memory cells arranged in rows and columns.

Figure 2:
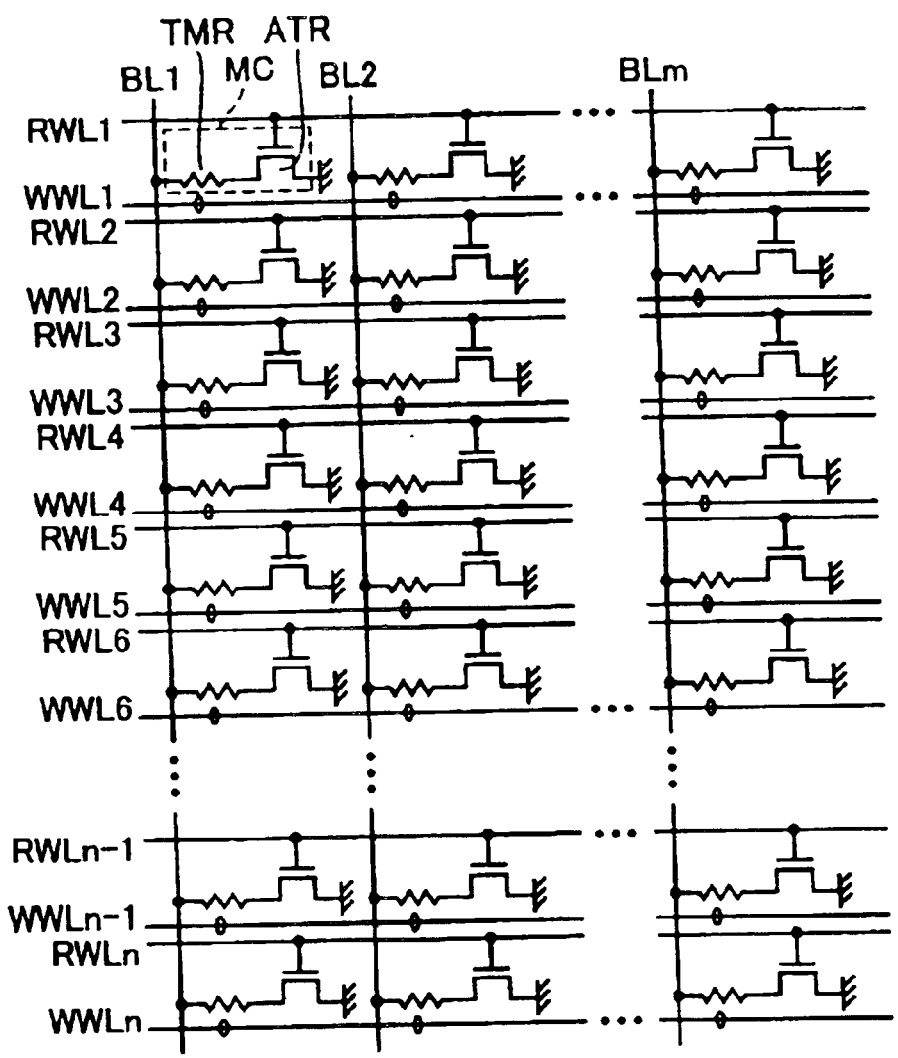
FIG. 2 is a conceptual diagram showing the structure of a memory array of FIG. 1.
Figure 66:
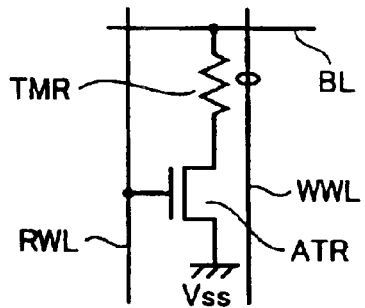
FIG. 66 is a schematic diagram showing the structure of a memory cell having a magnetic tunnel junction.
Figure 67:
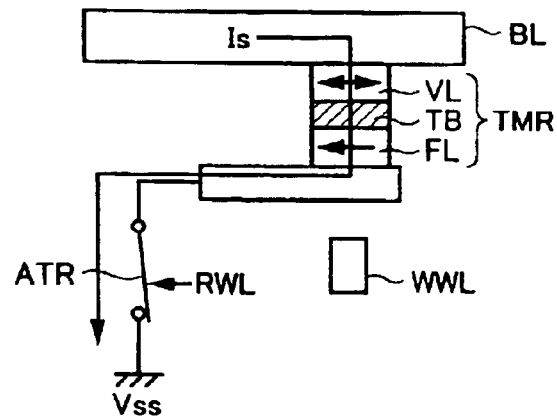
FIG. 67 is a conceptual diagram illustrating the data read operation from the MTJ memory cell.
Figure 68:
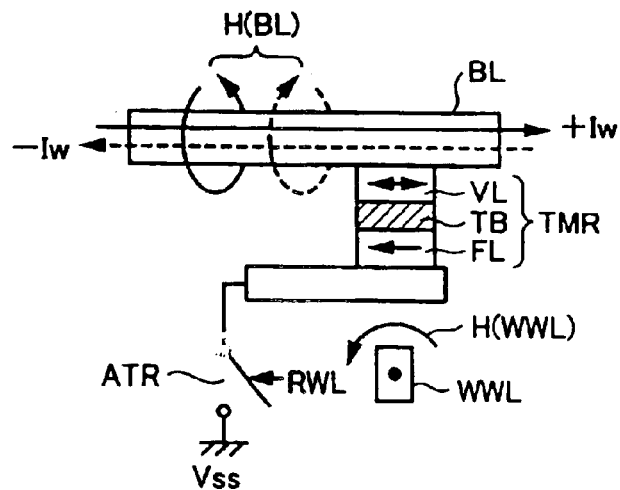
FIG. 68 is a conceptual diagram illustrating the data write operation to the MTJ memory cell.
Figure 69:
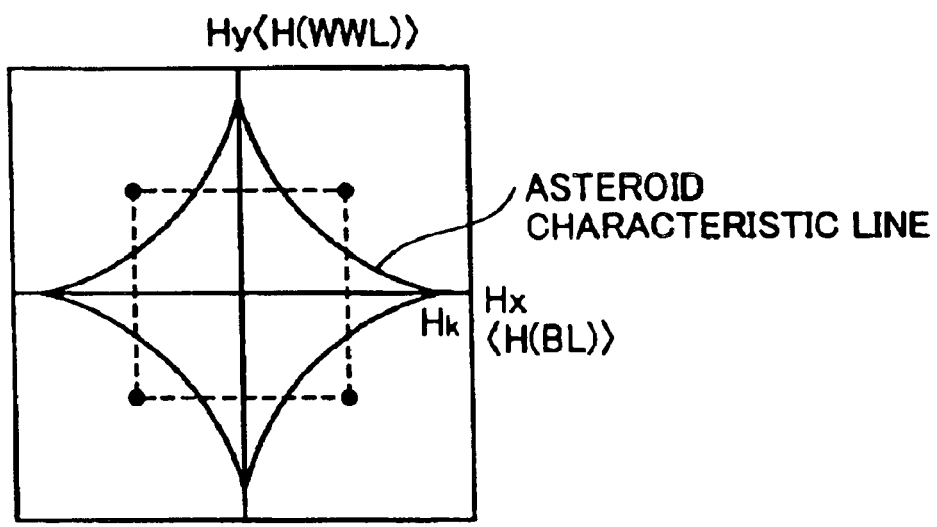
FIG. 69 is a conceptual diagram illustrating the relation between the direction of a data write current and the direction of a magnetic field in the data write operation.

Referring to FIG. 2, the memory array 10 includes a plurality of MTJ memory cells MC arranged in n rows by m columns (where n, m is a natural number). Hereinafter, the MTJ memory cells are also simply referred to as "memory cells". Each memory cell MC has the same structure as that of FIG. 66, and includes a tunnel magnetic resistive element TMR and an access transistor ATR. By arranging the memory cells in rows and columns on a semiconductor substrate, a highly integrated MRAM device can be implemented.

A bit line BL, write word line WWL and read word line RWL are provided for each memory cell MC. A plurality of write word lines WWL and a plurality of read word lines RWL are provided respectively corresponding to the memory cell rows, and a plurality of bit lines BL are provided respectively corresponding to the memory cell columns. Accordingly, n write word lines WWL1 to WWLn, n read word lines RWL1 to RWLn, and m bit lines BL1 to BLm are provided for the n×m memory cells.

Referring back to FIG. 1, the MRAM device 1 further includes a row decoder 20 for conducting row selection in the memory array 10 according to a row address RA indicated by the address signal ADD, a column decoder 25 for conducting column selection in the memory array 10 according to a column addres, CA indicated by the address signal ADD, a word line driver 30 for selectively activating the read word line RWL and write word line WWL based on the row selection result of the row decoder 20, a word line current control circuit 40 for applying a data write current to the write word line WWL in the data write operation, and read/write control circuits 50, 60 for applying a data write current ±Iw and a sense current Is in the data read and write operations.

Figure 3:
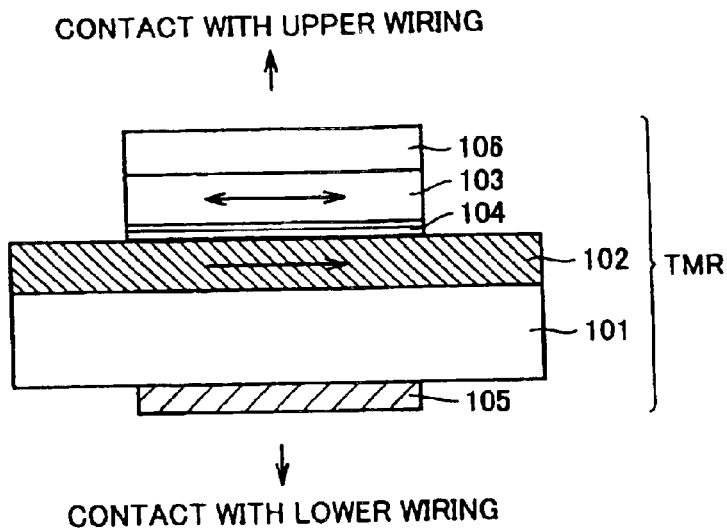
FIG. 3 is a cross-sectional view showing a tunnel magnetic resistive element of FIG. 2.

Referring to FIG. 3, the tunnel magnetic resistive element TMR includes an antiferromagnetic layer 101, a partial region of a fixed magnetic layer 102 formed on the antiferromagnetic layer 101 and having a fixed magnetic field of a fixed direction, a free magnetic layer 103 that is magnetized by an applied magnetic field, a tunnel barrier 104, i.e., an insulator film formed between the fixed magnetic layer 102 and free magnetic layer 103, and a contact electrode 105.

The antiferromagnetic layer 101, fixed magnetic layer 102 and free magnetic layer 103 are formed from an appropriate magnetic material such as FeMn or NiFe. The tunnel barrier 104 is formed from $Al_2O_3$ or the like.

The tunnel magnetic resistive element TMR is electrically coupled to an upper wiring through a barrier metal 106 provided as necessary. The barrier metal 106 serves as a buffer material for electrically coupling with a metal wiring. The contact electrode 105 is electrically coupled to a lower wiring (not shown). For example, the upper wiring corresponds to a bit line BL, and the lower wiring corresponds to a metal wiring coupled to the access transistor ATR.

Thus, the tunnel magnetic resistive element TMR having a magnetic tunnel junction can be electrically coupled between the upper and lower wirings.

Figure 4:
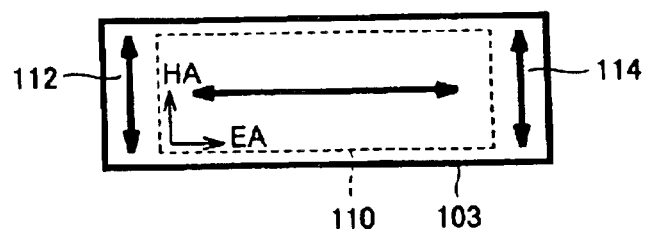
FIG. 4 is a conceptual diagram showing the magnetization direction in a free magnetic layer of FIG. 3.

FIG. 4 is a conceptual diagram showing the magnetization direction in the free magnetic layer of the tunnel magnetic resistive element. FIG. 4 exemplarily shows a plan view of the free magnetic layer 103 in the case where the tunnel magnetic resistive element TMR has a rectangular shape.

Referring to FIG. 4, the rectangular free magnetic layer 103 has an easy axis (EA) in the lengthwise direction (the horizontal direction in FIG. 4), and a hard axis (HA) in the widthwise direction (the vertical direction in FIG. 4). Accordingly, in an easy axis region 110 located about the center, the magnetization direction is easily inverted in response to an external magnetic field applied in the easy axis direction. However, in hard axis regions 112 and 114 located at both ends, the magnetization direction is not easily inverted even if an external magnetic field is applied in the easy axis direction.

Figure 5:
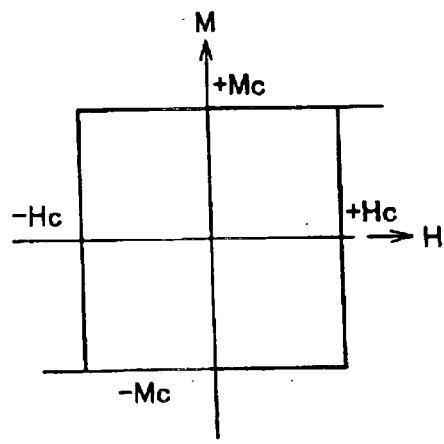
FIG. 5 is a conceptual diagram showing magnetization characteristics in an easy axis region.
Figure 6:
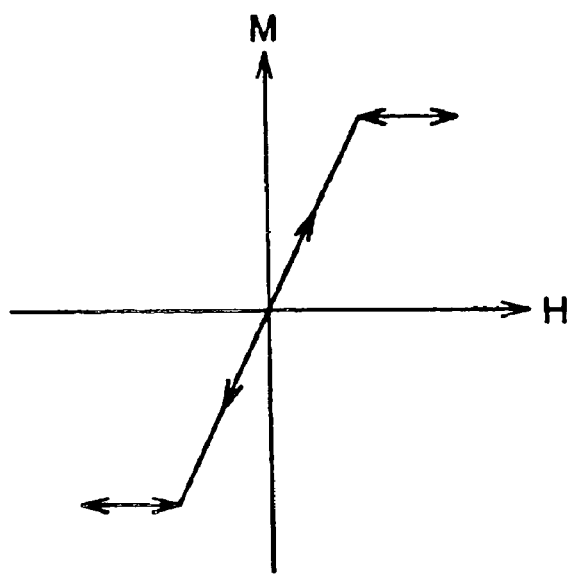
FIG. 6 is a conceptual diagram showing magnetization characteristics in a hard axis region.

FIGS. 5 and 6 show a hysteresis curve illustrating the respective magnetization characteristics of the easy axis and hard axis regions.

Referring to FIG. 5, the easy axis region 110 is magnetized to +Mc in response to application of a magnetic field of the positive direction larger than a prescribed magnetic field +Hc of the easy axis direction, and is magnetized to −Mc in response to application of a magnetic field of the negative direction larger than a prescribed magnetic field −Hc. Thus, the magnetization direction is not changed when a magnetic field of a prescribed level or less, i.e., in the range from −Hc to +Hc, is applied. Therefore, the easy axis region 110 has characteristics that are desirable as a memory cell.

Referring to FIG. 6, the hard axis regions 112 and 114 are not easily magnetized in response to a magnetic field of the easy axis direction, but have such characteristics that the direction and amount of magnetization vary gradually. Accordingly, unlike the easy axis region in which the direction and amount of magnetization are set on a binary basis in response to a magnetic field of the easy axis direction, the hard axis regions have characteristics that are undesirable as a memory cell.

As a result, in a memory cell that includes, as the free magnetic region 103, a region having such characteristics as those of the hard axis region, a sufficient variation in electric resistance value corresponding to the storage data level cannot be ensured in the data read operation, making it difficult to ensure a signal margin. Moreover, in the data write operation, an increased magnetic field must be applied in order to sufficiently invert the magnetization direction, resulting in an increased data write current. As a result, current consumption as well as magnetic noise are increased.

Figure 7:
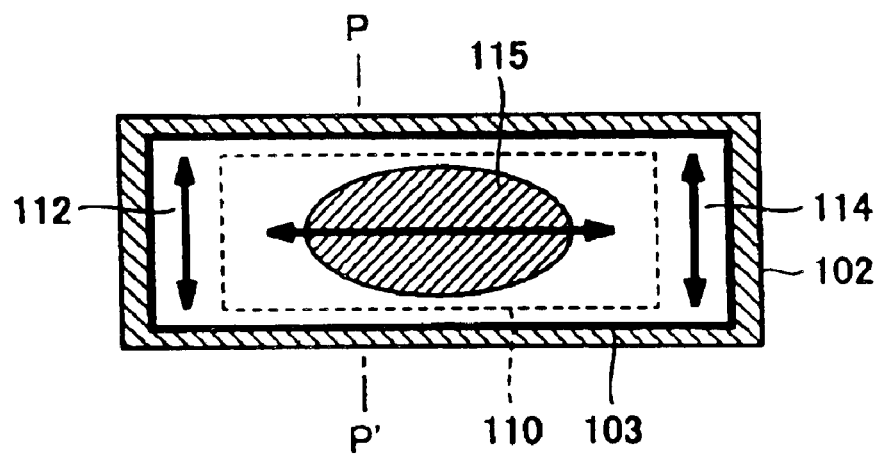
FIG. 7 is a conceptual diagram showing a first structural example of a tunnel magnetic resistive element according to a first embodiment of the present invention.

Referring to FIG. 7, in the first structural example of the tunnel magnetic resistive element according to the first embodiment, a region of the free magnetic layer 103 formed on the fixed magnetic layer 102, i.e., a region corresponding to the easy axis region, is used as a tunnel junction region 115. In other words, the hard axis regions having characteristics that are undesirable as a memory cell is not used as a portion of the tunnel magnetic resistive element TMR.

As a result, only a current flowing through the easy axis region corresponding to the tunnel junction region 115 is used for the data read operation. Therefore, a sufficient variation in the electric resistance value corresponding to the storage data level can be assured, so that a signal margin of the data read operation can be assured. Moreover, a data write current required for the data write operation is reduced, allowing for suppression in current consumption and magnetic noise.

Figure 8:
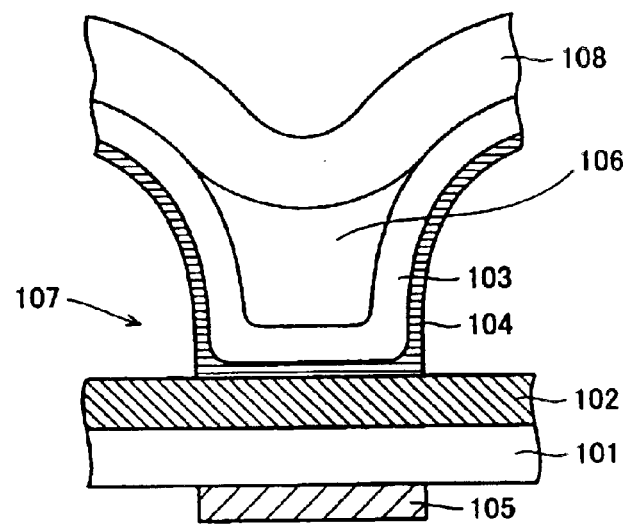
FIG. 8 is a cross sectional view of the tunnel magnetic resistive element of FIG. 7.

FIG. 8 shows a cross-sectional view taken along line P–P' of FIG. 7. Hereinafter, fabrication of the tunnel magnetic resistive element TMR shown in FIG. 7 will be described in connection with FIG. 8.

Referring to FIG. 8, after the antiferromagnetic layer 101 and fixed magnetic layer 102 are formed with a desirable pattern on the semiconductor substrate, an interlayer film 107 of, e.g., $SiO_2$, is formed thereon. Although not shown in the figure, the antiferromagnetic layer 101 is electrically coupled to the access transistor through a prescribed lower wiring (not shown). The contact electrode 105 electrically coupled to the lower wiring is formed so as to cover the region corresponding to the tunnel junction region 115.

An opening reaching the fixed magnetic layer 102 is formed in the tunnel junction portion of the interlayer film 107. The tunnel barrier 104 and free magnetic layer 103 are formed with a desired thickness in the opening. The barrier metal 106 is formed as necessary. Thereafter, desired patterning is conducted.

Thus, the tunnel magnetic resistive element TMR can be fabricated that is electrically coupled between an upper wiring 108 (i.e., a metal wiring formed in a layer located above the interlayer film 107) and a lower wiring (not shown).

Note that, instead of patterning the tunnel barrier 104 and free magnetic layer 103 in the opening formed in the interlayer film 107, the tunnel barrier 104 and free magnetic layer 103 formed with a prescribed thickness on the fixed magnetic layer 102 may be partially removed with, e.g., chemical-mechanical polishing (CMP) such that only the portion corresponding to the tunnel junction remains.

Figure 9:
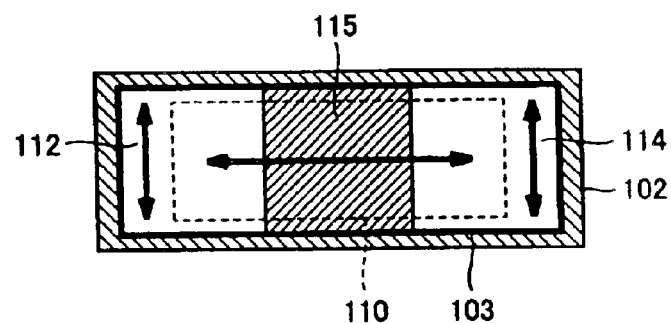
FIG. 9 is a conceptual diagram showing a second structural example of the tunnel magnetic resistive element according to the first embodiment.
Figure 10:
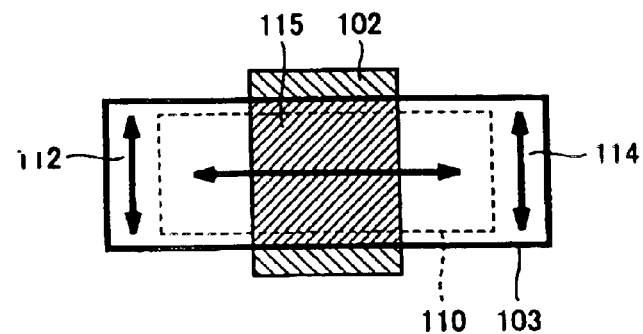
FIG. 10 is a conceptual diagram showing a third structural example of the tunnel magnetic resistive element according to the first embodiment.

As shown in FIGS. 9 and 10, the tunnel junction region 115 may alternatively be provided using a partial region in the longitudinal direction (the horizontal direction of FIGS. 9 and 10) that corresponds to the easy axis region.

In the structure of FIG. 9, the fixed magnetic layer 102 and free magnetic layer 103 extend in the same direction. In the structure of FIG. 10, the fixed magnetic layer 102 and free magnetic layer 103 extend crosswise.

First Modification of First Embodiment

Figure 11:
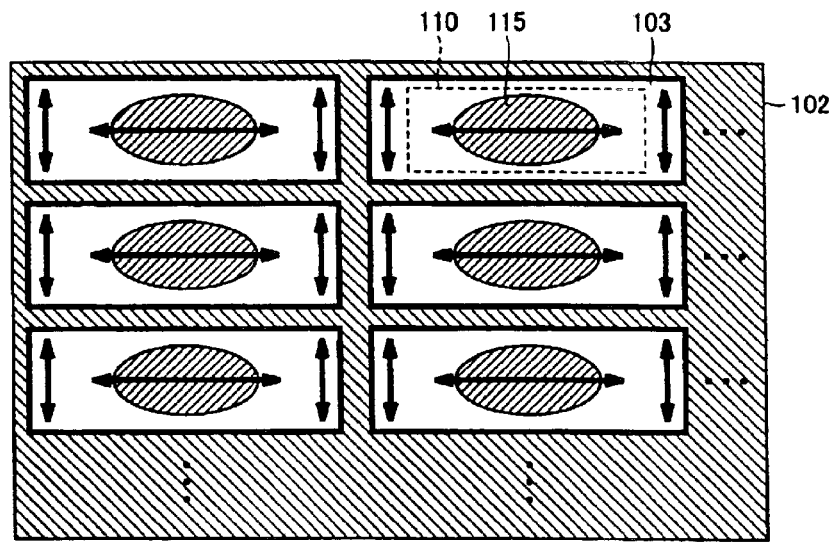
FIG. 11 is a conceptual diagram showing the arrangement of tunnel magnetic resistive elements according to a first modification of the first embodiment.

Referring to FIG. 11, in a tunnel magnetic resistive element according to the first modification of the first embodiment, a plurality of separate free magnetic layers 103 are formed on the fixed magnetic layer 102 having a large area. The free magnetic layers 103 are separately provided corresponding to the respective memory cells. The fixed magnetic layer 102 is shared by a plurality of memory cells.

As in the case of FIG. 7, each free magnetic layer 103 has a tunnel junction region 115 corresponding to the easy axis region. Note that, by forming a not-shown contact electrode in a region equivalent to or smaller than the tunnel junction region 115, a spreading resistance in the path of a sense current (data read current) flowing through the fixed magnetic layer 102 in the data read operation can be ignored.

In such an arrangement, a tunnel magnetic resistive element TMR of each memory cell is formed in the magnetic easy axis region. As a result, a signal margin of the data read operation is ensured. Moreover, a data write current required for the data write operation is reduced, allowing for suppression in current consumption and magnetic noise.

Second Modification of First Embodiment

Figure 12:
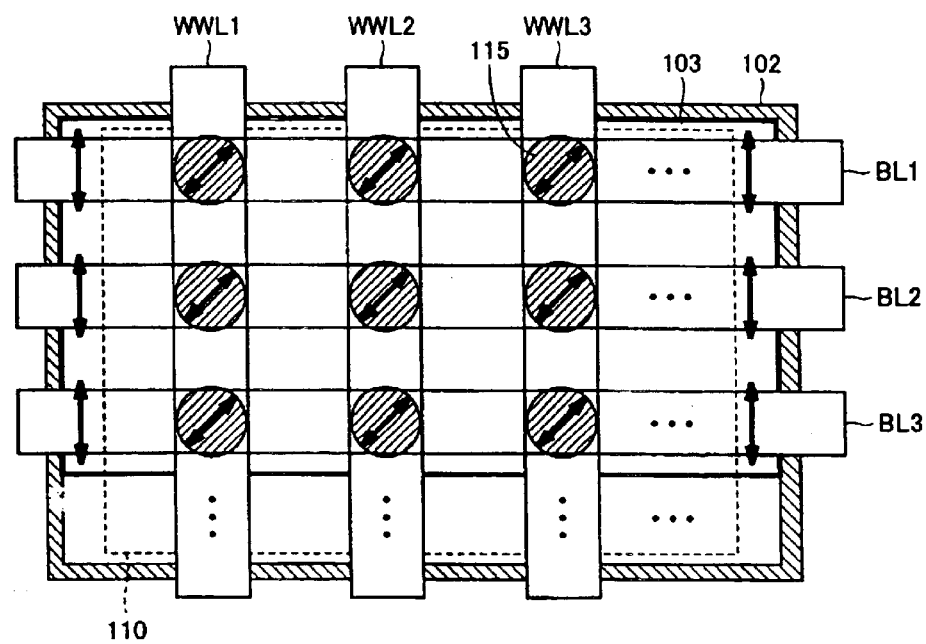
FIG. 12 is a conceptual diagram showing the arrangement of tunnel magnetic resistive elements according to a second modification of the first embodiment.

Referring to FIG. 12, in a tunnel magnetic resistive element according to the second modification of the first embodiment, a common fixed magnetic layer 102 and a common free magnetic layer 103 each having a large area are formed for a plurality of memory cells. The tunnel junction regions 115 are formed respectively corresponding to the memory cells. The tunnel junction regions 115 are formed in a region corresponding to the easy axis region within the free magnetic layer 103. As in the first modification of the first embodiment, not-shown contact electrodes are formed corresponding to the respective tunnel junction regions 115.

A common write word line WWL and a not-shown common read word line RWL are provided for a memory cell group of the same row, i.e., a group of memory cells located adjacent to each other in the row direction. Similarly, a common bit line BL is provided for a memory cell group of the same column, i.e., a group of memory cells located adjacent to each other in the column direction. FIG. 12 exemplarily shows the write word lines WWL1 to WWL3 corresponding to the first to third rows and the bit lines BL1 to BL3 corresponding to the first to third columns.

As in the first modification of the first embodiment, with this arrangement, a signal margin of the data read operation can be ensured.

The free magnetic layer 103 is shaped to have a sufficient area. Therefore, the shape of the free magnetic layer 103 does not geometrically restrict the easy axis direction in the free magnetic layer 103. This enables a composite magnetic field of the respective data write magnetic fields produced from the data write currents flowing through the write word line WWL and bit line BL in each memory cell to have the same direction as the easy axis direction. The fixed magnetic layer 102 is formed so that the magnetization direction thereof matches the direction of the composite magnetic field.

Accordingly, a change in magnetization direction in the free magnetic layer 103, i.e., a data write magnetic field required to write the storage data, can be generated with a smaller data write current. This enables further suppression in current consumption and magnetic noise as compared to the first modification of the first embodiment.

Third Modification of First Embodiment

Figure 13:
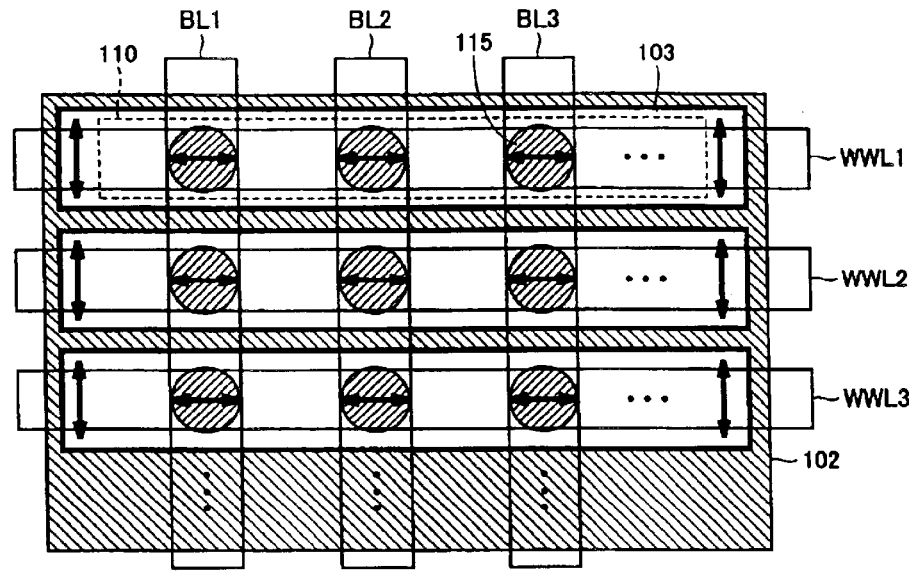
FIG. 13 is a conceptual diagram showing the arrangement of tunnel magnetic resistive elements according to a third modification of the first embodiment.

Referring to FIG. 13, a tunnel magnetic resistive element according to the third modification of the first embodiment is different from that of the second modification of the first embodiment shown in FIG. 12 in that the free magnetic layer 103 is formed in every memory cell row. More specifically, a plurality of strip-shaped free magnetic layers 103 corresponding to the respective memory cell rows are formed on the common, large-area fixed magnetic layer 102 provided for the plurality of memory cell rows.

The tunnel junction regions 115 are formed in a region corresponding to the easy axis region of each free magnetic layer 103. The tunnel junction region 115 is provided for every memory cell. As in the first modification of the first embodiment, not-shown contact electrodes are provided corresponding to the respective tunnel junction regions 115.

This arrangement geometrically restricts the easy axis direction in each free magnetic layer 103, requiring a data write current of the same level as that in the first modification of the first embodiment. On the other hand, the free magnetic layer 103 can be electrically independently provided for each memory cell row. Accordingly, the data write and read operations can be stabilized as compared to the second modification of the first embodiment in which the memory cells of different rows are electrically coupled to each other in the free magnetic region 103.

Fourth Modification of First Embodiment

A memory cell having an access transistor ATR as an access element is shown in the first embodiment and first to third modifications thereof. However, a memory cell using a diode as an access element and being suitable for improved integration can also be applied.

Figure 14:
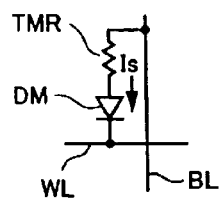
FIG. 14 is a circuit diagram showing a first structural example of an MTJ memory cell using a diode as access element.

Referring to FIG. 14, a memory cell MCDD using a diode includes a tunnel magnetic resistive element TMR and an access diode DM. The access diode DM is coupled between the tunnel magnetic resistive element TMR and word line WL. The forward direction thereof is the direction from the tunnel magnetic resistive element TMR toward the word line WL. The bit line BL extends in such a direction that crosses the word line WL, and is coupled to the tunnel magnetic resistive element TMR.

A data write current is applied to the word line WL and bit line BL in order to write the data to the memory cell MCDD. The direction of the data write current is determined according to the write data level, as in the case of the memory cell using an access transistor.

In the data read operation, the word line WL corresponding to the selected memory cell is set to a low voltage (e.g., ground voltage Vss) state. At this time, the bit line BL has been precharged to a high voltage (e.g., power supply voltage Vcc) state so that the access diode DM is rendered conductive by forward biasing. Accordingly, a sense current Is can be supplied to the tunnel magnetic resistive element TMR.

The word lines WL corresponding to the non-selected memory cells are set to the high voltage state. Therefore, the corresponding access diodes DM are reverse-biased and thus retained non-conductive. As a result, the sense current Is does not flow therethrough.

Thus, the data read and write operations can be conducted also in the MTJ memory cells using an access diode.

Figure 15:
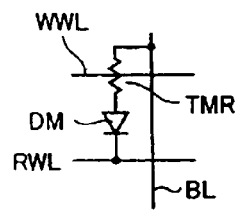
FIG. 15 is a circuit diagram showing a second structural example of the MTJ memory cell using a diode as access element.

Referring to FIG. 15, a memory cell MCD using a diode includes a tunnel magnetic resistive element TMR and an access diode DM, as in the case of FIG. 14. The memory cell MCD of FIG. 15 is different from the memory cell MCDD of FIG. 14 in that a read word line RWL and a write word line WWL are separately provided. The bit line BL extends in such a direction that crosses the write word line WWL and read word line RWL, and is electrically coupled to the tunnel magnetic resistive element TMR.

The access diode DM is coupled between the tunnel magnetic resistive element TMR and read word line RWL. The forward direction thereof is the direction from the tunnel magnetic resistive element TMR toward the read word line RWL. The write word line WWL is provided near the tunnel magnetic resistive element TMR without being connected to any other wiring.

In the memory cell MCDD of FIG. 14, a data write current flows through the word line WL and bit line BL in the data write operation, causing a voltage drop on the word line WL and bit line BL. Depending on the voltage distribution on the word line WL and bit line BL, such a voltage drop may possibly turn ON the PN junction of the access diode DM in a non-selected memory cell(s). This may unexpectedly cause a current to flow through the MTJ memory cell, resulting in erroneous data write operation.

In the memory cell MCD of FIG. 15, however, a current need not be supplied to the read word line RWL in the data write operation. Therefore, the voltage on the read word line RWL can be stably retained in the high voltage state (power supply voltage Vcc), whereby the access diode DM can be reliably reverse-biased and retained in the non-conductive state. As a result, the data write operation can be stabilized as compared to the MTJ memory cell MCDD shown in FIG. 14.

The same effects can be obtained even when the memory cells suitable for improved integration as shown in FIGS. 14 and 15 are used in the first embodiment and first to third modifications thereof.

Second Embodiment

The memory cell arrangement for improving the integration of the memory array will be described in the second embodiment.

Figure 16:
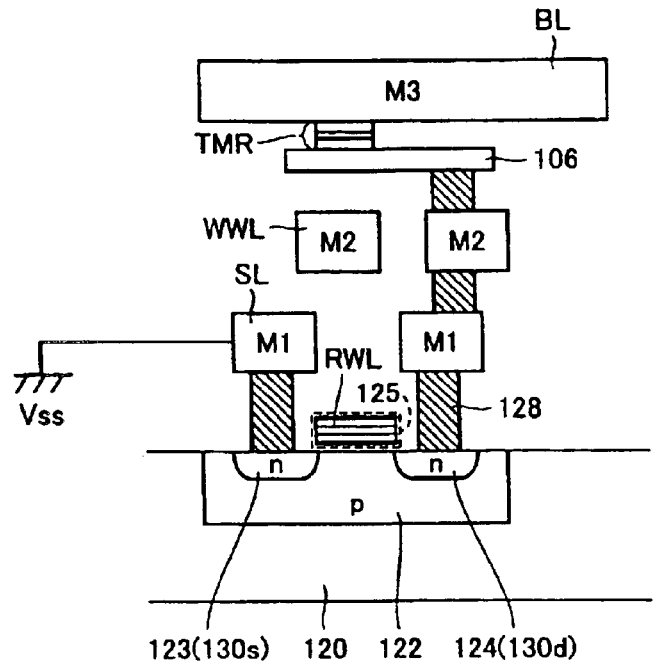
FIG. 16 is a structural diagram showing a first structural example of an MTJ memory cell on a semiconductor substrate.

Referring to FIG. 16, an access transistor ATR is formed in a p-type region 122 of a semiconductor main substrate 120. The access transistor ATR has source/drain regions (n-type regions) 123, 124 and a gate 125. A source contact 130s and a drain contact 130d are formed respectively corresponding to the source/drain regions 123 and 124.

The source contact 130s is coupled to a source line SL formed in a first metal wiring layer M1. The source line SL supplies the ground voltage Vss for forming a sense current (data read current) path in the data read operation. A metal wiring formed in a second metal wiring layer M2 is used for a write word line WWL. A bit line BL is formed in a third metal wiring layer M3.

A tunnel magnetic resistive element TMR is formed between the second metal wiring layer M2 of the write word line WWL and the third metal wiring layer M3 of the bit line BL. The drain contact 130d is electrically coupled to the tunnel magnetic resistive element TMR through a metal film 128 formed in a contact hole, the first and second metal wiring layers M1 and M2, and a barrier metal 106 that is formed as necessary.

In the MTJ memory cell, the read word line RWL and write word line WWL are provided as independent wirings. The read word line RWL is provided in order to control the gate voltage of the access transistor ATR, and a current need not be actively applied to the read word line RWL. Accordingly, from the standpoint of improved integration, the read word line RWL is formed from a polysilicon layer, polycide structure, or the like in the same wiring layer as that of the gate 125 of the access transistor ATR without providing an additional independent metal wiring layer.

In the data write operation, a relatively large data write current for generating a magnetic field having a magnitude equal to or larger than a prescribed value must be applied to the write word line WWL and bit line BL. Therefore, the write word line WWL and bit line BL are each formed from a metal wiring.

Figure 17:
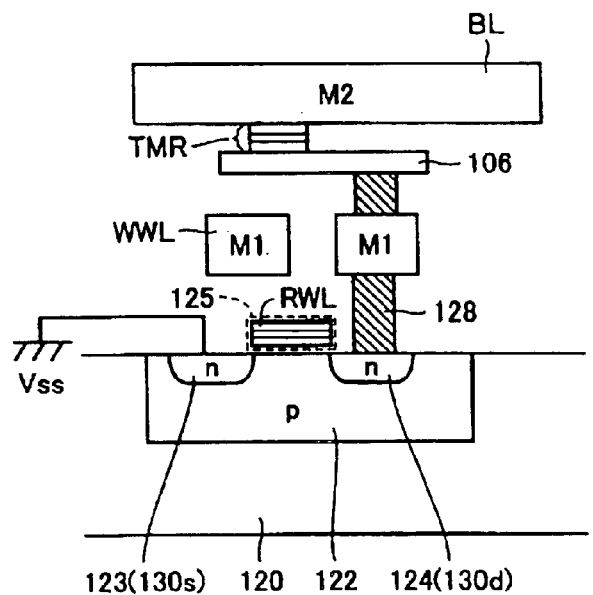
FIG. 17 is a structural diagram showing a second structural example of the MTJ memory cell on the semiconductor substrate.

Referring to FIG. 17, a second structural example is different from the first structural example of FIG. 16 in that the source/drain region 123 corresponding to the source contact 130s is directly coupled to the ground voltage Vss. For example, the respective source/drain regions 123 of the access transistors of the same memory cell row need only be electrically coupled to each other in order to supply the ground voltage Vss thereto.

This eliminates the need for the source line SL of FIG. 16. Therefore, the write word line WWL and bit line BL are respectively formed in the first and second metal wiring layers M1 and M2. As in the case of FIG. 16, the read word line RWL is formed in the same wiring layer as that of the gate 125 of the access transistor ATR.

Figure 18:
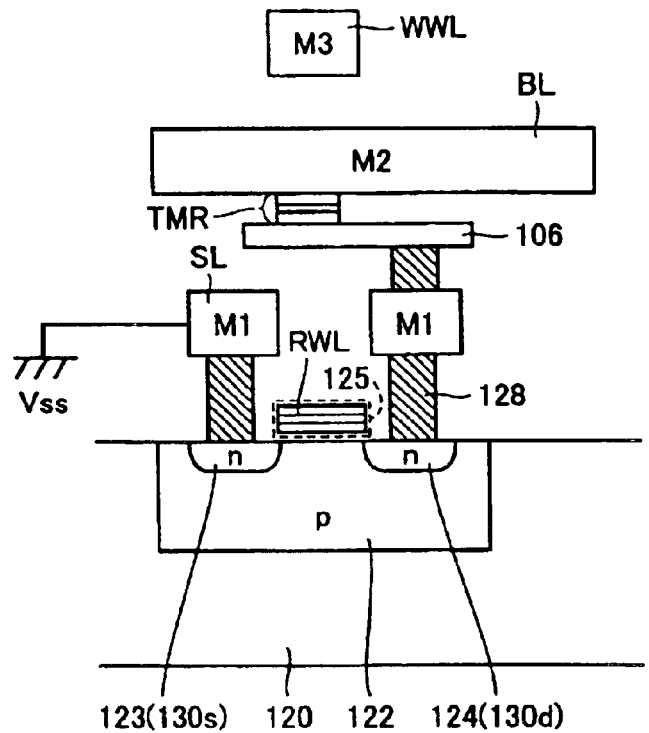
FIG. 18 is a structural diagram showing a third structural example of the MTJ memory cell on the semiconductor substrate.

Referring to FIG. 18, a third structural example is different from the first structural example of FIG. 16 in that the write word line WWL is formed in a layer located above the bit line BL. For example, the write word line WWL and bit line BL are respectively formed in the third and second metal wiring layers M3 and M2. Since the access transistor ATR, source line SL and read word line RWL are arranged in the same manner as that of FIG. 16, detailed description thereof will not be repeated.

Thus, the MTJ memory cell arrangement on the semiconductor substrate is classified into two cases: the bit line BL is formed in a layer located above the write word line WWL (FIGS. 16 and 17); and the write word line WWL is formed in a layer located above the bit line BL (FIG. 18).

Figure 19:
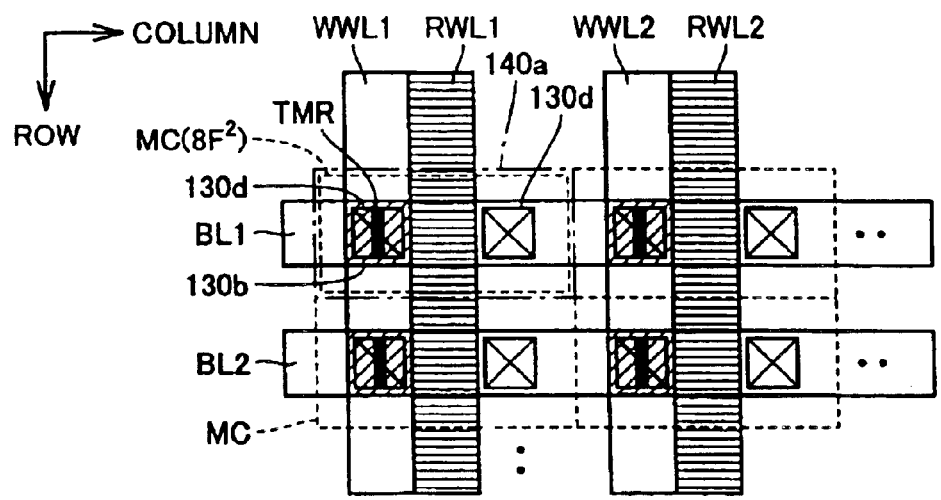
FIG. 19 is a conceptual diagram showing a first arrangement example of MTJ memory cells according to a second embodiment of the present invention.

Referring to FIG. 19, in the first arrangement example of the MTJ memory cells according to the second embodiment, a repetition unit denoted with 140a corresponds to a single memory cell MC. In the memory array 10, the repetition units 140a are successively located, whereby the memory cells MC are arranged in rows and columns. The memory cell size is $8F^2$ according to the design standard.

FIG. 19 exemplarily shows the memory cells MC in the range from the first row, first column to the second row, second column, and corresponding read word lines RWL1, RWL2, write word lines WWL1, WWL2 and bit lines BL1, BL2.

In each memory cell MC, the tunnel magnetic resistive element TMR is formed in a layer located above the source contact 130s, and a contact 130b between the tunnel magnetic resistive element TMR and bit line BL is also formed. As shown in FIGS. 16 to 18, the tunnel magnetic resistive element TMR is coupled to the drain contact 130d.

The write word line WWL does not overlap the drain contact 130d. Therefore, the write word line WWL can be formed near the tunnel magnetic resistive element TMR either in a layer located above or below the bit line BL.

Figure 20:
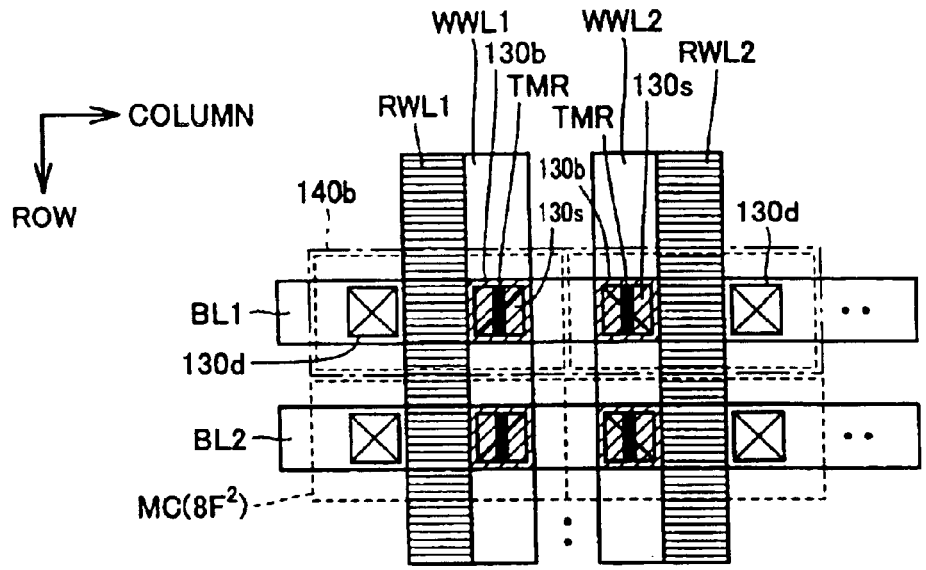
FIG. 20 is a conceptual diagram showing a second arrangement example of MTJ memory cells according to the second embodiment.

Referring to FIG. 20, in the second arrangement example of the MTJ memory cells according to the second embodiment, the source contact 130s and drain contact 130d are located at the same positions within each of the memory cells MC of the same row. However, the source contact 130s and drain contact 130d are inverted in position between every adjacent rows. Such an arrangement is herein also referred to as "row stripe inversion arrangement". In the row stripe inversion arrangement, two adjacent memory cells in the column direction form a single repetition unit 140b. In the entire memory array 10, the repetition units 140b are successively located, whereby the memory cells MC are arranged in rows and columns. The memory cell size is $8F^2$ as in the case of FIG. 19.

FIG. 20 exemplarily shows the memory cells MC in the range from the first row, first column to the second row, second column, and corresponding read word lines RWL1, RWL2, write word lines WWL1, WWL2 and bit lines BL1, BL2.

Since the tunnel magnetic resistive element TMR, bit line BL and contact 130b of each memory cell MC are arranged in the same manner as that of FIG. 19, detailed description thereof will not be repeated.

In the structure of FIG. 20 as well, the write word line WWL can be formed near the tunnel magnetic resistive element TMR either in a layer located above or below the bit line BL.

Figure 21:
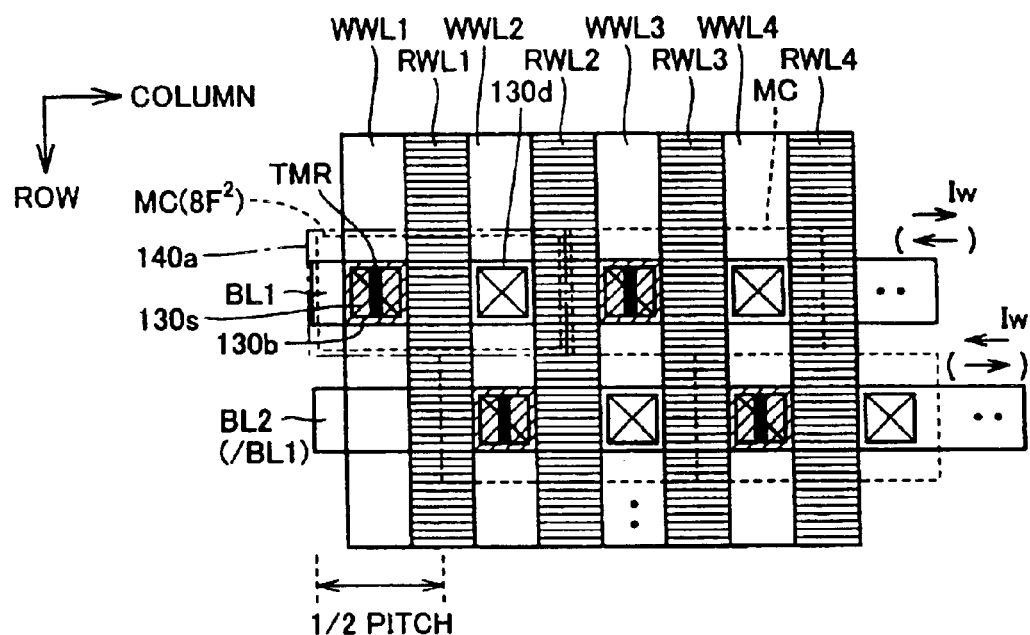
FIG. 21 is a conceptual diagram showing a third arrangement example of MTJ memory cells according to the second embodiment.

Referring to FIG. 21, the third arrangement example of the second embodiment corresponds to the first arrangement example of the second embodiment in FIG. 19 with the repetition units 140a being shifted by ½ pitch (half pitch) between adjacent memory cell columns.

FIG. 21 exemplarily shows the read word lines RWL1 to RWL4 and write word lines WWL1 to WWL4 corresponding to the first to fourth rows, and the bit lines BL1 and BL2 corresponding to the first and second columns.

In such an arrangement, the memory cells corresponding to the selected read word line RWL are connected to every other bit line BL. Therefore, the memory cell arrangement suitable for the data read operation based on the folded-bit-line structure can be realized without increasing the cell size.

In the data read operation based on the folded-bit-line structure, every two bit lines form a bit line pair. One of two complementary bit lines of the same bit line pair is connected to the corresponding memory cell, whereas the other is not connected to any memory cell. For example, the bit lines BL1 and BL2 form the same bit line pair, so that the bit line BL2 serves as a complementary line /BL1 of the bit line BL1 in the data read operation.

Moreover, the distance between the tunnel magnetic resistive elements TMR can be increased as compared to the case of FIG. 19 in which the repetition units are not shifted. This suppresses magnetic-field interference between the memory cells, whereby an operation margin can be ensured. Since the tunnel magnetic resistive elements TMR can be alternately located in the row direction, the memory cell pitch in the row direction can be easily ensured, allowing for further improved integration of the memory array.

However, by shifting the repetition units 140a by half pitch, the region of the write word line WWL overlaps the drain contact 130d coupled to the tunnel magnetic resistive element TMR. Accordingly, in order to realize the third arrangement example, the write word line WWL must be formed in a layer located above the bit line BL, as shown in FIG. 18.

Figure 22:
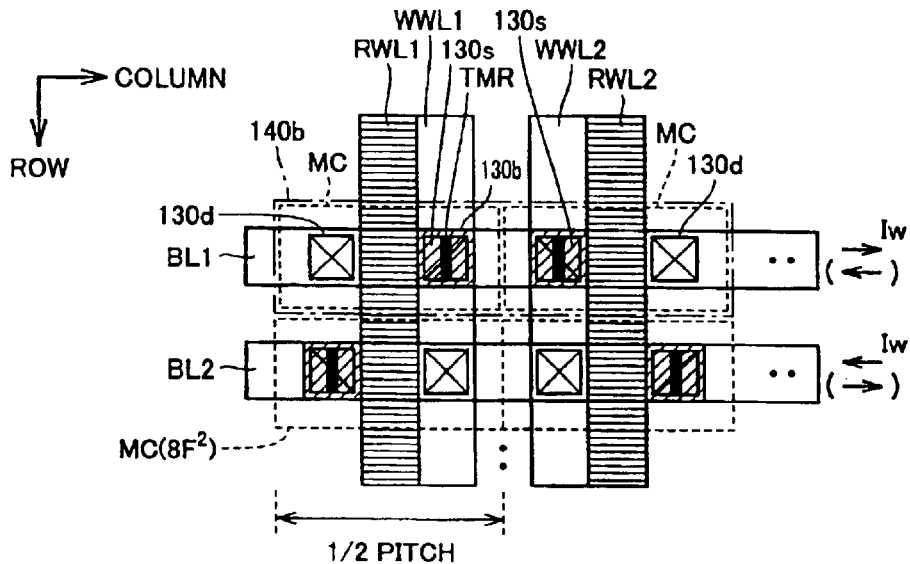
FIG. 22 is a conceptual diagram showing a fourth arrangement example of MTJ memory cells according to the second embodiment.

Referring to FIG. 22, the fourth arrangement example of the second embodiment corresponds to the second arrangement example of the second embodiment in FIG. 20 with the repetition units 140b being shifted by ½ pitch (half pitch) between adjacent memory cell columns.

FIG. 22 exemplarily shows the memory cells MC in the range from the first row, first column to the second row, second column, and corresponding read word lines RWL1, RWL2, write word lines WWL1, WWL2 and bit lines BL1, BL2.

In this arrangement, the distance between the tunnel magnetic resistive elements TMR can be increased as compared to the case of FIG. 20 in which the repetition units are not shifted. This suppresses magnetic-field interference between the memory cells, whereby an operation margin can be ensured. Since the tunnel magnetic resistive elements TMR can be alternately located in the row direction, the memory cell pitch in the row direction can be easily ensured, allowing for further improved integration of the memory array.

However, by shifting the repetition units 140b by half pitch, the region of the write word line WWL overlaps the drain contact 130d coupled to the tunnel magnetic resistive element TMR. Accordingly, in order to realize the fourth arrangement example, the write word line WWL must be formed in a layer located above the bit line BL, as shown in FIG. 18.

Figure 23:
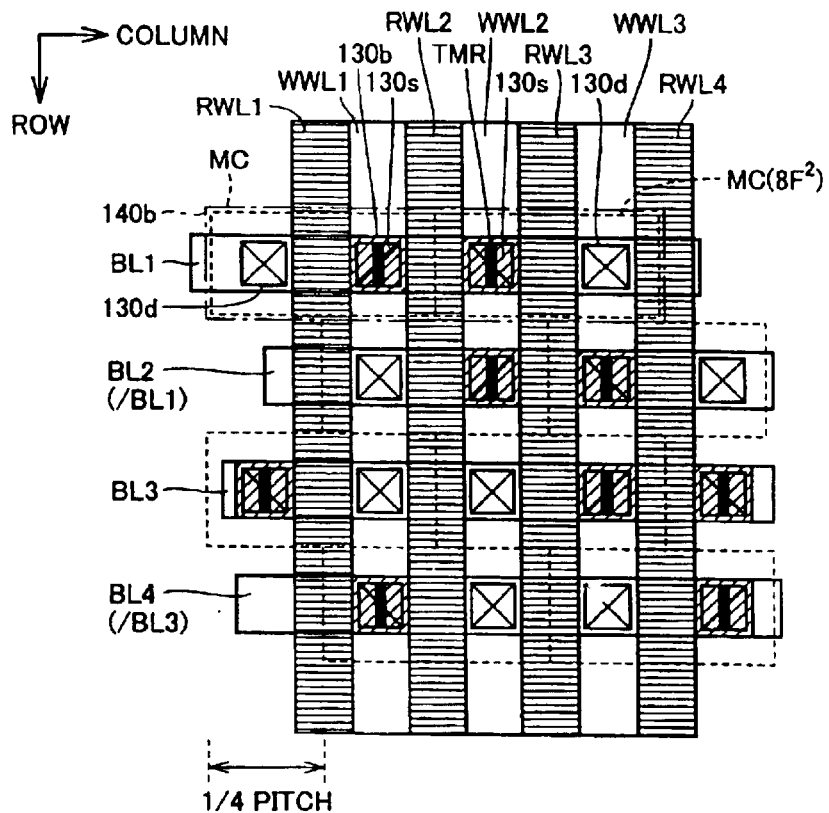
FIG. 23 is a conceptual diagram showing a fifth arrangement example of MTJ memory cells according to the second embodiment.

Referring to FIG. 23, the fifth arrangement example of the second embodiment corresponds to the second arrangement example of the second embodiment in FIG. 20 with the repetition units 140b being shifted by ¼ pitch (quarter pitch) between adjacent memory cell columns.

FIG. 23 exemplarily shows some of the memory cells MC, and corresponding read word lines RWL1 to RWL4, write word line WWL1 to WWL3 and bit lines BL1 to BL4.

In such an arrangement, the memory cells corresponding to the selected read word line RWL are connected to every other bit line BL. Therefore, the memory cell arrangement suitable for the data read operation based on the folded-bit-line structure can be realized without increasing the cell size. For example, the bit lines BL1 and BL2 form the same bit line pair, so that the bit line BL2 serves as a complementary line /BL1 of the bit line BL1 in the data read operation. Similarly, the bit lines BL3 and BL4 form the same bit line pair, so that the bit line BL4 serves as a complementary line /BL3 of the bit line BL3 in the data read operation.

First Modification of Second Embodiment

Figure 24:
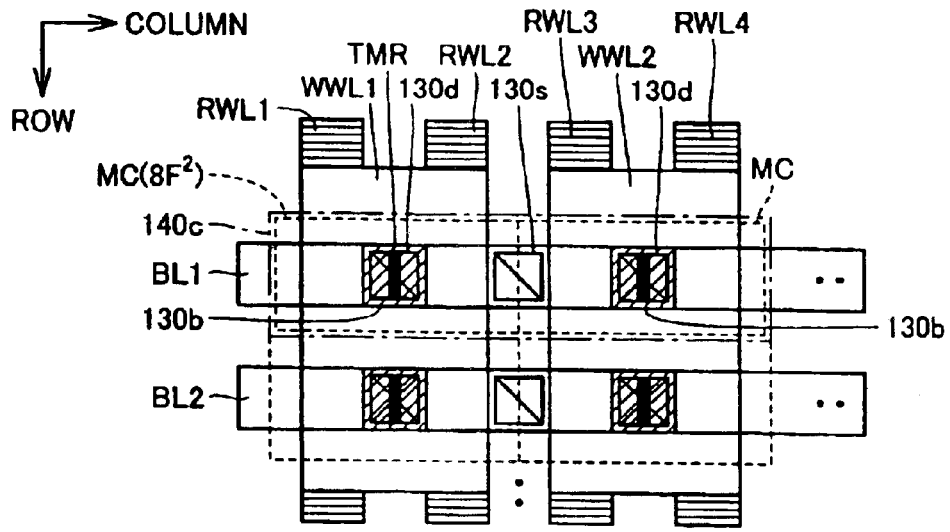
FIG. 24 is a conceptual diagram showing a first arrangement example of MTJ memory cells according to a first modification of the second embodiment.

Referring to FIG. 24, in the first arrangement example according to the first modification of the second embodiment, the source contacts 130s are shared between adjacent memory cells in the column direction. A repetition unit 140c corresponds to two memory cells MC. Since a space corresponding to a single contact is provided in each repetition unit 140c, the memory cell size is designed to $8F^2$ as in the case of the second embodiment. In the memory array 10, the repetition units 140c are successively located, whereby the memory cells MC are arranged in rows and columns.

The drain contact 130d coupled to the tunnel magnetic resistive element TMR is formed in each memory cell. Above the drain contact 130d, the tunnel magnetic resistive element TMR is connected to the corresponding bit line BL through the contact 130b. Accordingly, in order to realize the arrangement of FIG. 24, the write word line WWL must be formed in a layer located above the bit line BL, as shown in FIG. 18.

Note that, as shown in FIGS. 16 to 18, the distance between the bit line BL and tunnel magnetic resistive element TMR is shorter than that between the write word line WWL and tunnel magnetic resistive element TMR. Therefore, with the current amount being the same, a magnetic field produced by the data write current flowing though the bit line BL is larger than that produced by the data write current flowing through the write word line WWL.

Accordingly, in order to apply the data write magnetic field of approximately the same strength to the tunnel magnetic resistive element TMR, a larger data write current must be supplied to the write word line WWL than to the bit line BL. As described above, the bit line BL and write word line WWL are formed in the metal wiring layers in order to reduce the electric resistance value. However, an excessive current density in the wiring may possibly cause disconnection or short-circuit of the wiring due to an electromigration phenomenon, thereby possibly degrading the operation reliability. It is therefore desirable to suppress the current density of the wiring receiving the data write current.

Therefore, with the arrangement of FIG. 24, the write word line WWL located farther away from the tunnel magnetic resistive element TMR than is the bit line BL and thus requiring a larger data write current has a wiring width that is at least wider than that of the bit line BL, enabling an increased cross-sectional area of the write word line WWL. This suppresses a current density in the write word line WWL, resulting in improved reliability of the MRAM device.

For the improved reliability, it is also effective to form a metal wiring requiring a larger data write current (i.e., the write word line WWL in the second embodiment) from a highly electromigration-resistant material. For example, in the case where the other metal wirings are formed from an aluminum alloy (Al alloy), the metal wirings that may be subjected to electromigration may be formed from copper (Cu).

Figure 25:
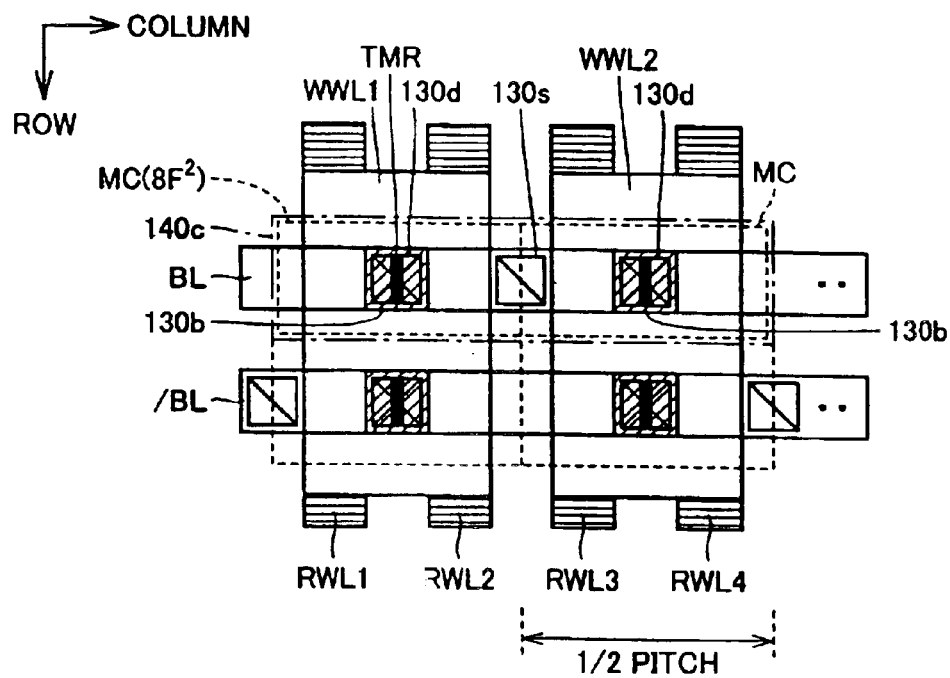
FIG. 25 is a conceptual diagram showing a second arrangement example of MTJ memory cells according to the first modification of the second embodiment.

Referring to FIG. 25, the second arrangement example according to the first modification of the second embodiment corresponds to the arrangement of FIG. 24 with the repetition units 140c being shifted by ½ pitch (half pitch) between adjacent memory cell columns. Since the arrangement of FIG. 25 is otherwise the same as that of FIG. 24, detailed description thereof will not be repeated.

FIG. 25 exemplarily shows some of the memory cells MC, and corresponding read word lines RWL1 to RWL4, write word lines WWL1, WWL2 and bit lines BL, /BL.

In such an arrangement, the memory cells corresponding to the selected read word line RWL are connected to every other bit line BL. Therefore, the memory cell arrangement suitable for the data read operation based on the folded-bit-line structure can be realized without increasing the cell size. For example, the bit lines BL1 and BL2 form the same bit line pair, so that the bit line BL2 serves as a complementary line /BL1 of the bit line BL1 in the data read operation.

Figure 26:
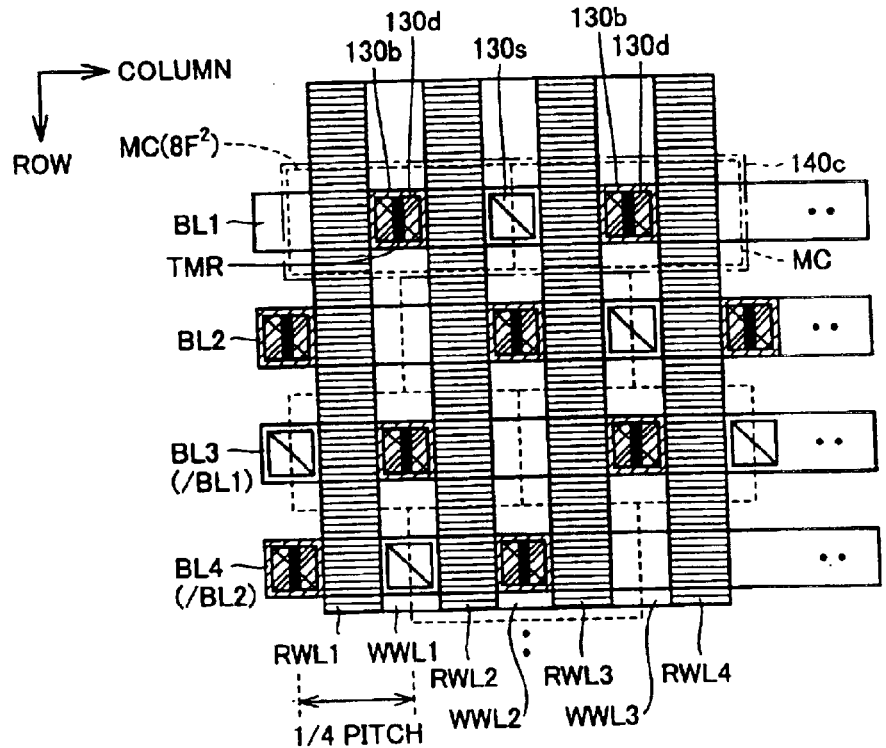
FIG. 26 is a conceptual diagram showing a third arrangement example of MTJ memory cells according to the first modification of the second embodiment.

Referring to FIG. 26, the third arrangement example according to the first modification of the second embodiment corresponds to the arrangement of FIG. 24 with the repetition units 140c being shifted by ¼ pitch (quarter pitch) between adjacent memory cell columns.

The write word lines WWL and read word lines RWL are alternately arranged as in the case of FIG. 23.

FIG. 26 exemplarily shows some of the read word lines (RWL1 to RWL4), the write word lines (WWL1 to WWL3) and the bit lines (BL1 to BL4), and memory cells MC corresponding to these signal lines.

With such an arrangement, the memory cell arrangement suitable for the data read operation based on the folded-bit-line structure can be realized without increasing the cell size, as in the case of FIG. 25. For example, the bit lines BL1 and BL3 form a bit line pair, so that the bit line BL3 serves as a complementary line /BL1 of the bit line BL1 in the data read operation. Similarly, the bit lines BL2 and BL4 form another bit line pair, so that the bit line BL4 serves as a complementary line /BL2 of the bit line BL2 in the data read operation.

Moreover, the distance between the tunnel magnetic resistive elements TMR can be increased as compared to the case of FIG. 24 in which the repetition units are not shifted. This suppresses magnetic-field interference between the memory cells, whereby an operation margin can be ensured. Since the tunnel magnetic resistive elements TMR can be alternately located in the row direction, the memory cell pitch in the row direction can be easily ensured, allowing for further improved integration of the memory array.

Second Modification of Second Embodiment

Figure 27:
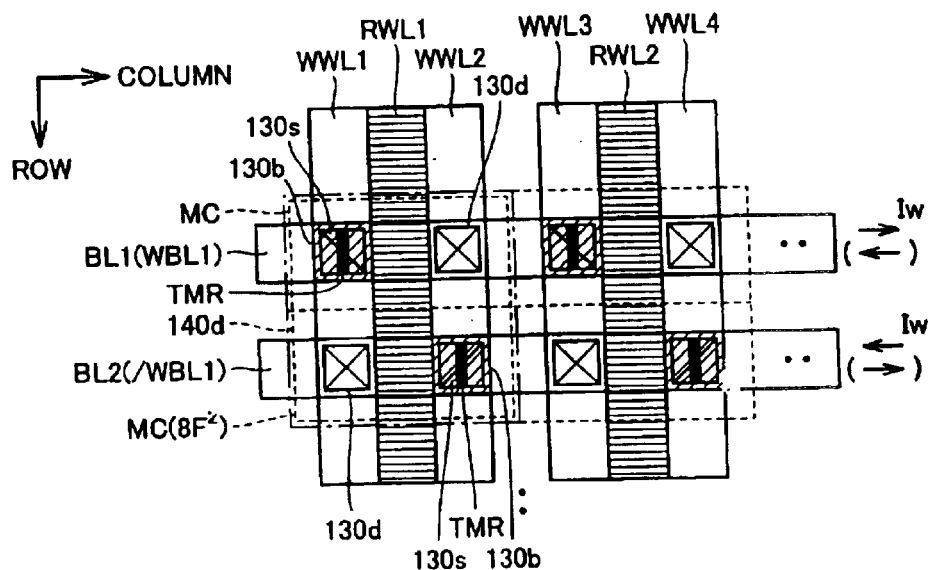
FIG. 27 is a conceptual diagram showing a first arrangement example of MTJ memory cells according to a second modification of the second embodiment.

Referring to FIG. 27, in the first arrangement example of the MTJ memory cells according to the second modification of the second embodiment, the source contact 130s and drain contact 130d are located at the same positions within each of the memory cells MC of the same column. However, the source contact 130s and drain contact 130d are inverted in position between every adjacent columns. Accordingly, two adjacent memory cells in the column direction form a single repetition unit 140d. In the entire memory array 10, the repetition units 140d are successively located, whereby the memory cells MC are arranged in rows and columns. The memory cell size is $8F^2$ as in the case of FIG. 19.

Above the source contact 130s, the tunnel magnetic resistive element TMR of each memory cell is connected to the corresponding bit line BL though the contact 130b. Each write word line WWL is located in a region overlapping the drain contact 130d coupled to the tunnel magnetic resistive element TMR. Therefore, the write word line WWL must be formed in a layer located above the bit line BL, as shown in FIG. 18.

FIG. 27 exemplarily shows the read word lines RWL1, RWL2, write word lines WWL1 to WWL4, and bit lines BL1, BL2.

In such an arrangement, the distance between the tunnel magnetic resistive elements TMR can be increased as compared to the case of FIGS. 19, 20 and the like. This suppresses magnetic-field interference between the memory cells, whereby an operation margin can be ensured. Since the tunnel magnetic resistive elements TMR can be alternately located in the row direction, the memory cell pitch in the row direction can be easily ensured, allowing for further improved integration of the memory array.

Moreover, the memory cells corresponding to the selected write word line WWL are connected to every other bit line BL. Therefore, the memory cell arrangement suitable for the data write operation based on the folded-bit-line structure can be realized without increasing the cell size.

In the data write operation based on the folded-bit-line structure, every two bit lines form a bit line pair, and a data write current of the opposite directions is applied to two complementary bit lines of the same bit line pair. These two complementary bit lines are electrically coupled to each other at their one ends, and respectively coupled to different voltages at the other ends. This enables efficient supply of the data write current without providing a portion for sinking the data write current. For example, the bit lines BL1 and BL2 form a bit line pair, so that the bit line BL2 serves as a complementary line (/WBL1) of the bit line BL1 (WBL1) in the data write operation.

Figure 28:
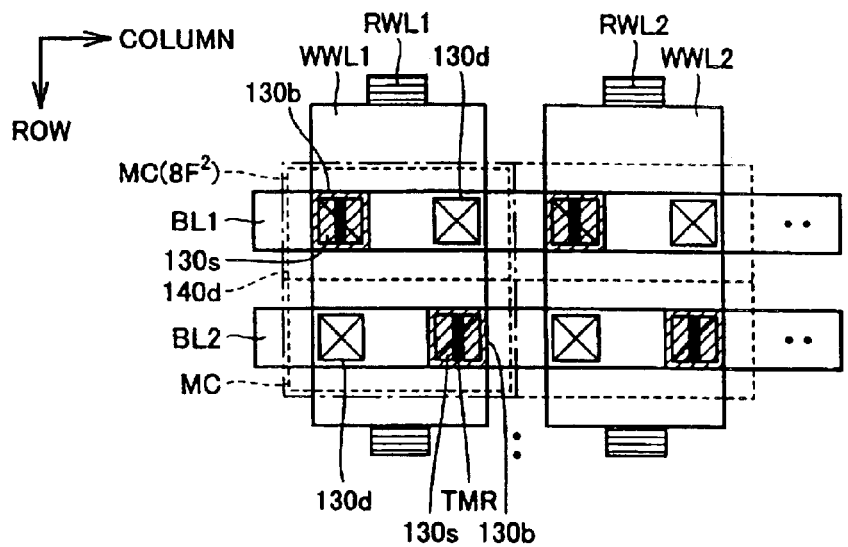
FIG. 28 is a conceptual diagram showing a second arrangement example of MTJ memory cells according to the second modification of the second embodiment.

Referring to FIG. 28, the second arrangement example according to the second modification of the second embodiment is different from the first arrangement example of FIG. 27 in that the data write operation is not conducted based on the folded-bit-line structure, but on a bit-line by bit-line basis. Since the second arrangement example of FIG. 28 is otherwise the same as the first arrangement example of FIG. 27, detailed description thereof will not be repeated.

Thus, the wiring width of the write word line WWL can be ensured as in the case of FIGS. 24 and 25. This suppresses a current density in the write word line WWL, resulting in improved reliability of the MRAM device.

Figure 29:
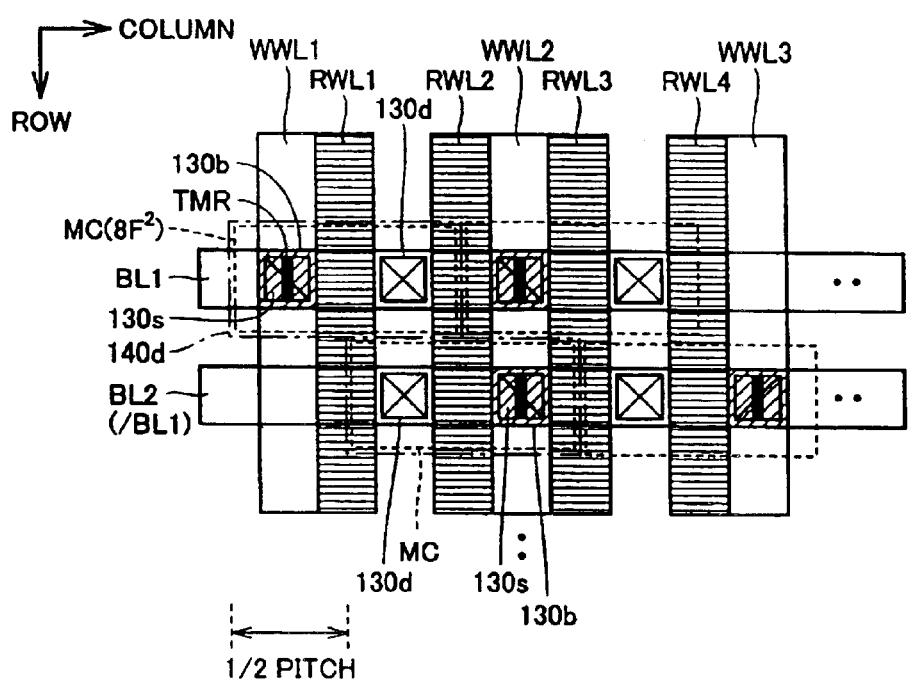
FIG. 29 is a conceptual diagram showing a third arrangement example of MTJ memory cells according to the second modification of the second embodiment.

Referring to FIG. 29, the third arrangement example according to the second modification of the second embodiment corresponds to the arrangement of FIG. 27 with the repetition units 140d being shifted by ½ pitch (half pitch) between adjacent memory cell columns.

The write word line WWL does not overlap the drain contact 130d coupled to the tunnel magnetic resistive element TMR. Therefore, the write word line WWL can be formed either in a layer located above or below the bit line BL. Since the arrangement of FIG. 29 is otherwise the same as that of FIG. 27, detailed description thereof will not be repeated.

FIG. 29 exemplarily shows the read word lines RWL1 to RWL4, write word lines WWL1 to WWL3, and bit lines BL1, BL2.

With such an arrangement, the memory cells corresponding to the selected read word line RWL are connected to every other bit line BL. Therefore, the memory cell arrangement suitable for the data read operation based on the folded-bit-line structure can be realized without increasing the cell size. For example, the bit lines BL1 and BL2 form a bit line pair, so that the bit line BL2 serves as a complementary line /BL1 of the bit line BL1 in the data read operation.

Figure 30:
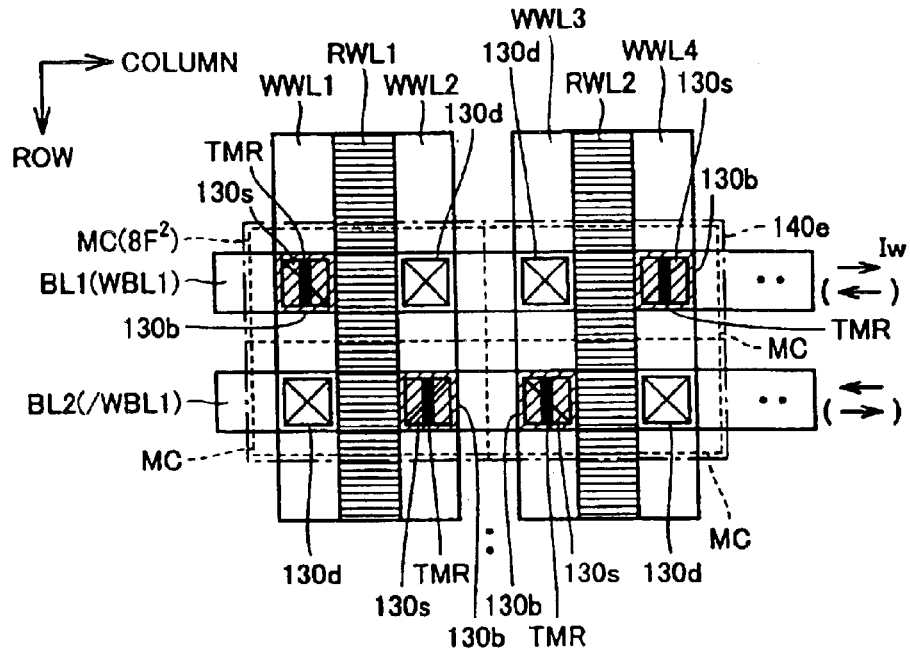
FIG. 30 is a conceptual diagram showing a fourth arrangement example of MTJ memory cells according to the second modification of the second embodiment.

Referring to FIG. 30, the fourth arrangement example according to the second modification of the second embodiment corresponds to a combination of the arrangement of FIG. 27 with the row stripe inversion arrangement. Accordingly, four adjacent memory cells corresponding to two rows by two columns form a single repetition unit 140e. In the entire memory array 10, the repetition units 140e are successively located, whereby the memory cells MC are arranged in rows and columns. The memory cell size is designed to $8F^2$ as in the case of FIG. 27.

Each write word line WWL is located in a region overlapping the drain contact 130d coupled to the tunnel magnetic resistive element TMR. Therefore, the write word line WWL must be formed in a layer located above the bit line BL, as shown in FIG. 18.

FIG. 30 exemplarily shows the read word lines RWL1, RWL2; write word lines WWL1 to WWL4, and bit lines BL1, BL2.

In such an arrangement as well, the memory cell arrangement suitable for the data write operation based on the folded-bit-line structure can be realized without increasing the cell size, as in the case of FIG. 27. Moreover, since the tunnel magnetic resistive elements TMR can be alternately located in the row direction, the memory cell pitch in the row direction can be easily ensured, allowing for further improved integration of the memory array.

Note that, in the arrangement of FIG. 30, it is also possible to ensure the wiring width of the write word line WWL instead of conducting the data write operation based on the folded-bit-line structure, as in the case of FIG. 28.

Figure 31:
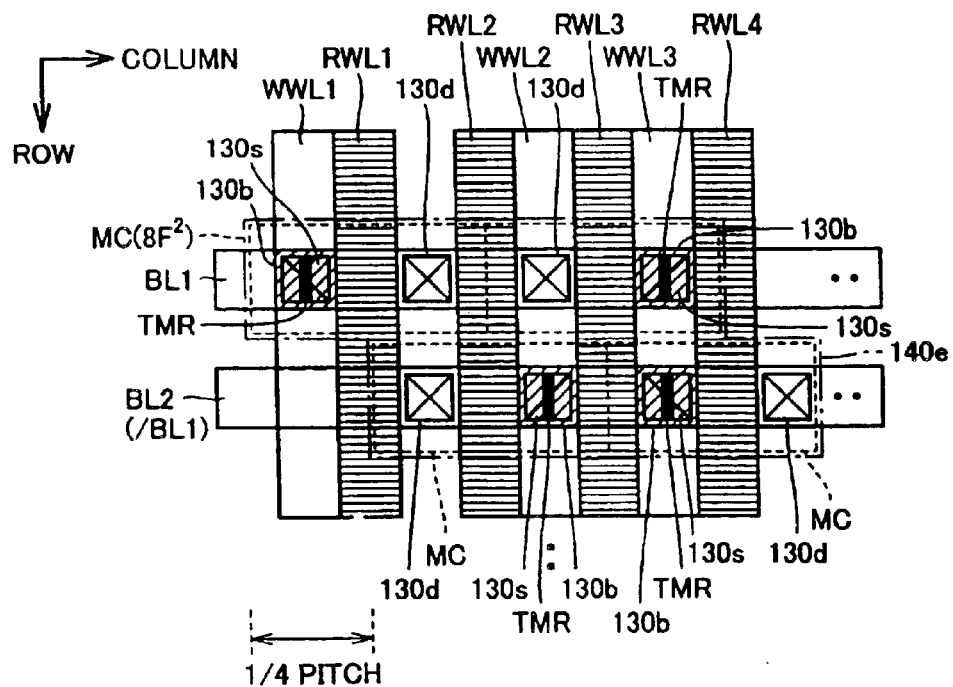
FIG. 31 is a conceptual diagram showing a fifth arrangement example of MTJ memory cells according to the second modification of the second embodiment.

Referring to FIG. 31, the fifth arrangement example according to the second modification of the second embodiment corresponds to the arrangement of FIG. 30 with the repetition units 140e being shifted by ¼ pitch (quarter pitch) between adjacent memory cell columns. As in the case of FIG. 30, each write word line WWL must be formed in a layer located above the bit line BL.

FIG. 31 exemplarily shows the memory cells MC in the range from the first row, first column to the fourth row, second column, and corresponding read word lines RWL1 to RWL4, write word lines WWL1 to WWL4 and bit lines BL1, BL2.

In such an arrangement, the memory cells corresponding to the selected read word line RWL are connected to every other bit line BL. Therefore, the memory cell arrangement suitable for the data read operation based on the folded-bit-line structure can be realized without increasing the cell size. For example, the bit lines BL1 and BL2 form a bit line pair, so that the bit line BL2 serves as a complementary line /BL1 of the bit line BL1 in the data read operation.

Third Modification of Second Embodiment

Figure 32:
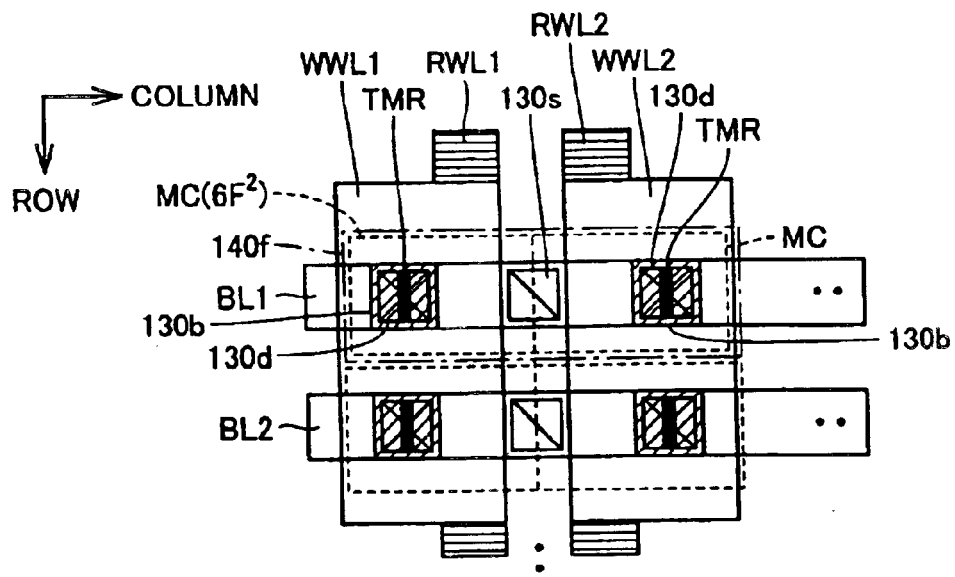
FIG. 32 is a conceptual diagram showing a first arrangement example of MTJ memory cells according to a third modification of the second embodiment.

Referring to FIG. 32, in the first arrangement example according to the third modification of the second embodiment, the source contacts 130s are shared between adjacent memory cells in the column direction. Since the source contact 130s and drain contact 130d are located at regular intervals regardless of a repetition unit 140*f*, the memory cell size is designed to 6F². The repetition unit 140*f* corresponds to two memory cells MC sharing the same source contact 130*s*. In the memory array 10, the repetition units 140*f* are successively located, whereby the memory cells MC are arranged in rows and columns.

As a result, although the data write or read operation cannot be conducted based on the folded-bit-line structure, further improved integration of the memory array and thus reduction in size of the MRAM device can be achieved.

The drain contact 130*d* coupled to the tunnel magnetic resistive element TMR is formed in each memory cell. Above the drain contact 130*d*, the tunnel magnetic resistive element TMR is connected to the corresponding bit line BL through the contact 130*b*. Accordingly, in order to realize the arrangement of FIG. 32, the write word line WWL must be formed in a layer located above the bit line BL, as shown in FIG. 18.

Moreover, the writing width of the write word line WWL located farther away from the tunnel magnetic resistive element TMR than is the bit line BL and thus requiring a larger data write current can be ensured, enabling an increased cross-sectional area of the write word line WWL. This suppresses a current density in the write word line WWL, resulting in improved reliability of the MRAM device.

Figure 33:
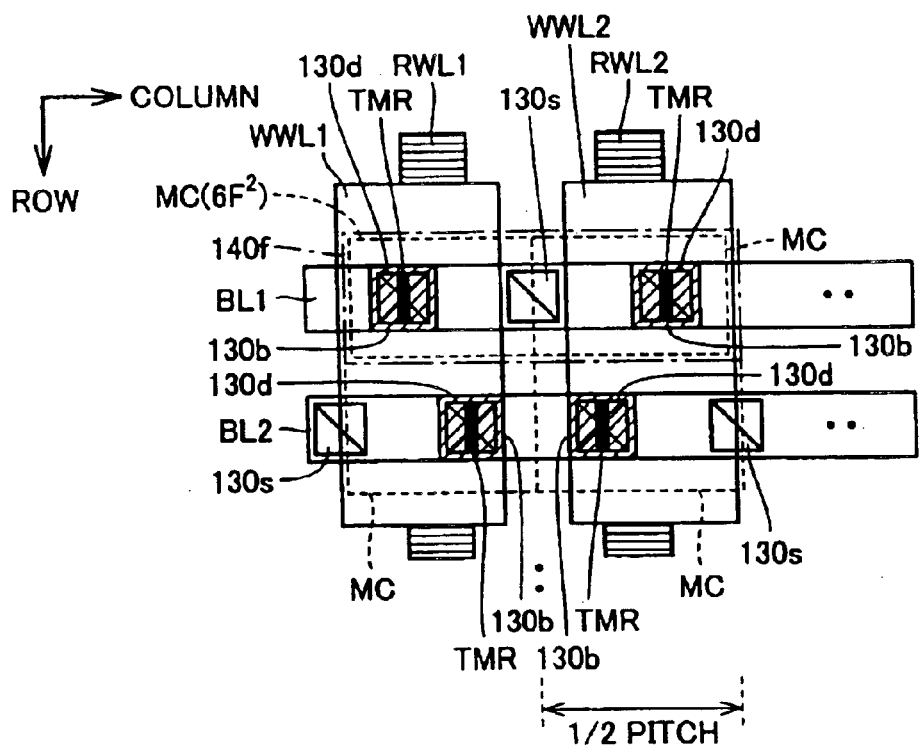
FIG. 33 is a conceptual diagram showing a second arrangement example of MTJ memory cells according to the third modification of the second embodiment.

Referring to FIG. 33, the second arrangement example according to the third modification of the second embodiment corresponds to the arrangement of FIG. 32 with the repetition units 140*f* being shifted by ½ pitch (half pitch) between adjacent memory cell columns. Since the arrangement of FIG. 33 is otherwise the same as that of FIG. 32, detailed description thereof will not be repeated.

In such an arrangement, the tunnel magnetic resistive elements TMR can be alternately located in the row direction. Therefore, in addition to the effects of the arrangement of FIG. 32, the memory cell pitch in the row direction can be easily ensured, allowing for further improved integration of the memory array.

Figure 34:
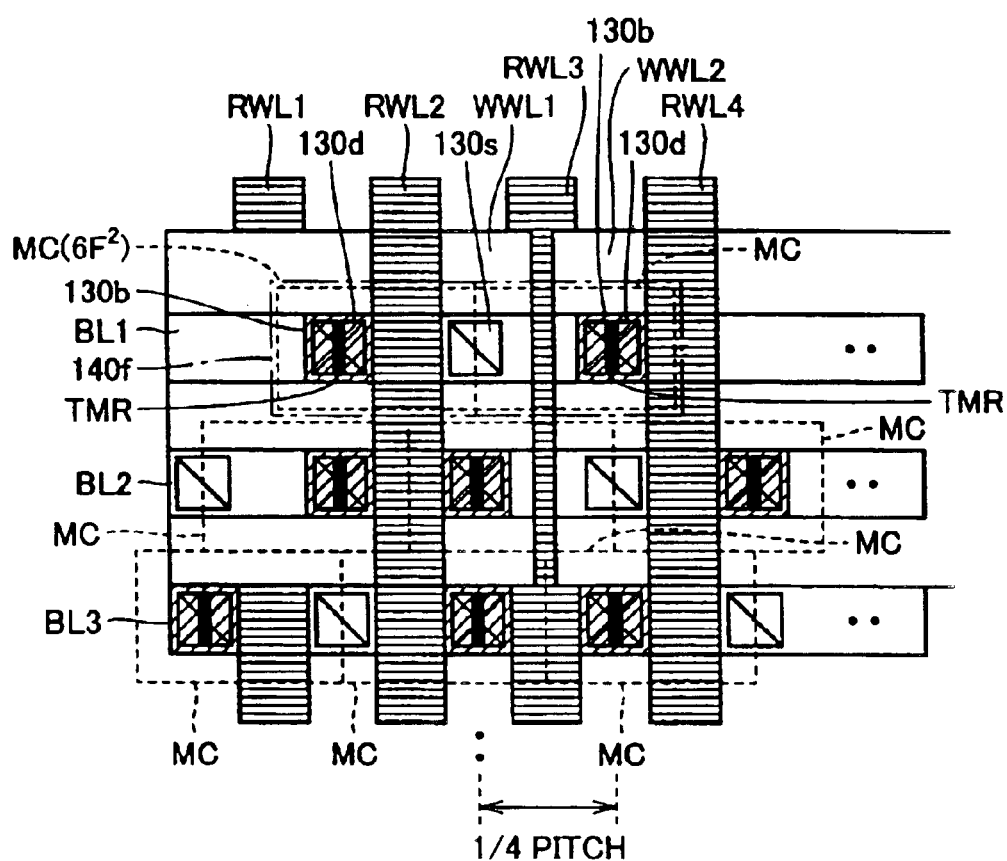
FIG. 34 is a conceptual diagram showing a third arrangement example of MTJ memory cells according to the third modification of the second embodiment.

Referring to FIG. 34, the third arrangement example according to the third modification of the second embodiment corresponds to the arrangement of FIG. 32 with the repetition units 140*f* being shifted by ¼ pitch (quarter pitch) between adjacent memory cell columns.

Since the arrangement of FIG. 34 is otherwise the same as that of FIG. 32, detailed description thereof will not be repeated. As a result, in addition to the effects of the arrangement of FIG. 32, a current density in the write word line WWL can further be suppressed, resulting in further improved reliability of the MRAM device.

Third Embodiment

The structure for accurately setting a read reference voltage in the data write operation will be described in the third embodiment.

Figure 35:
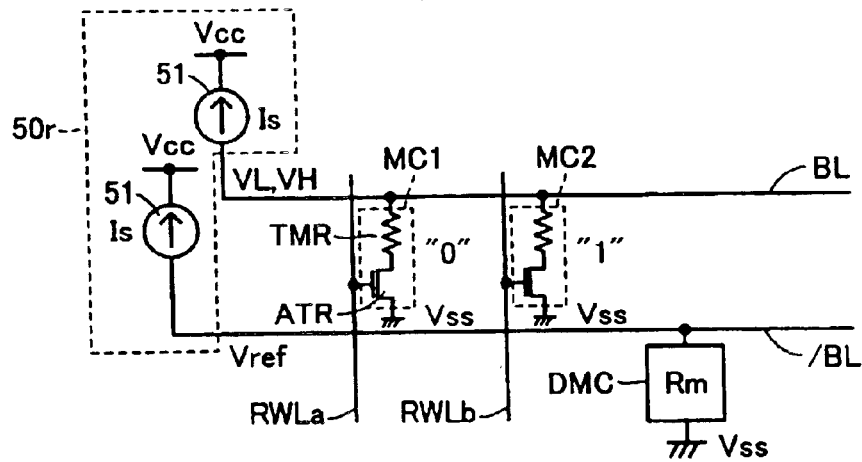
FIG. 35 is a conceptual diagram illustrating the data read operation based on the folded-bit-line structure in a thin film magnetic memory device of the present invention.

Referring to FIG. 35, it is herein assumed that memory cells MC0 and MC2 retain the storage data "0" and "1", respectively. The memory cells MC1 and MC2 are connected to the bit line BL. The bit line /BL forming a bit line pair together with the bit line BL is coupled to a dummy memory cell DMC.

In the data read operation, a constant sense current (data read current) Is is supplied from a current supply circuit 51 of a data read circuit 50*r* to these memory cells. Similarly, a common sense current Is, for example, is supplied to the dummy memory cell DMC.

As descried before, the tunnel magnetic resistive elements TMR of the memory cells retaining the storage data "1" and "0" have electric resistance values Rh and Rl, respectively. The difference between Rh and Rl, i.e., the difference between the electric resistance values produced in the tunnel magnetic resistive elements TMR according to the difference in storage data level, is herein denoted with ΔR. In general, ΔR is designed in the range of about 10% to about 40% of Rl.

When the memory cell MC1 retaining the storage data "0" is selected for the read operation, a read word line RWLa is activated so that the access transistor ATR of the memory cell MC1 is turned ON. Accordingly, a path of the sense current Is including the tunnel magnetic resistive element TMR is formed between the current supply circuit 51 and ground voltage Vss. As a result, the read voltage transmitted to the data read circuit 50*r* through the bit line BL is settled to VL=Is·R. The electric resistance value R includes an electric resistance value Rl of the tunnel magnetic resistive element TMR of the memory cell MC1, a channel resistance of the access transistor ATR thereof, a wiring resistance of the bit line BL, and the like.

When the memory cell MC2 retaining the storage data "1" is selected for the read operation, a read word line RWLb is activated, whereby a path of the sense current Is is similarly formed for the memory cell MC2. As a result, the read voltage is settled to VH=Is·(R+ΔR), which is higher than VL.

The data read operation is conducted by sensing and amplifying the voltage difference between the bit line connected to the memory cell (BL in FIG. 35) and bit line connected to the dummy memory cell (B/L in FIG. 35). Accordingly, the read reference voltage Vref produced by the dummy memory cell must be accurately set to a value close to an intermediate value of the read voltages VH and VL, i.e., (VH+VL)/2.

For example, provided that the dummy memory cell DMC is formed from a resistive element having an electric resistance value Rm in view of the electric resistance values Rh and Rl of the tunnel magnetic resistive element TMR (e.g., Rm=(Rh+Rl)/2), an appropriate read reference voltage Vref can be produced by supplying a common sense current Is to the dummy memory cell DMC.

In such a structure, however, the read reference voltage Vref varies according to the manufacturing variation of the electric resistance value Rm of the dummy memory cell. Moreover, a proper level of the read reference voltage Vref also varies according the manufacturing variation of the memory cell MC to be read. This may possibly make it difficult to ensure a signal margin of the data read operation while allowing the manufacturing variation.

Figure 36:
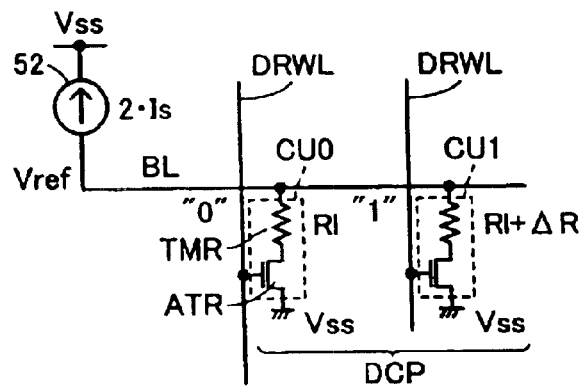
FIG. 36 is a circuit diagram showing a first structural example of a dummy memory cell according to a third embodiment of the present invention.

Referring to FIG. 36, a dummy memory cell DCP according to the first structural example of the third embodiment includes two cell units CU0 and CU1 arranged in parallel. Each of the cell units CU0 and CU1 has the same structure as that of the memory cell MC, and includes a tunnel magnetic resistive element TMR and an access transistor ATR that are coupled in series between the bit line BL and ground voltage Vss.

The respective access transistors ATR of the cell units CU0 and CU1 have their gates respectively connected to dummy read word lines DRWL and DRWL' that are activated or inactivated simultaneously.

Different storage data "0" and "1" are written to the cell units CU0 and CU1, respectively.

In the data read operation, a constant current corresponding to twice the sense current Is supplied to the memory cell MC, i.e., 2·Is, is supplied from a current supply circuit 52 to the dummy memory cell DCP. The dummy read word lines DRWL and DRWL' are both activated in the data read operation.

Accordingly, in the data read operation, the two cell units CU0 and CU1 respectively retaining the storage data "0" and "1" are connected in parallel between the bit line BL for transmitting the read reference voltage Vref and the ground voltage Vss. As a result, the following read reference voltage Vref is produced by the dummy memory cell DMP:

$$Vref = 2 \cdot Is \cdot 1/(1/R + 1/(R + \Delta R)) \quad (1).$$
$$= 2 \cdot Is \cdot (R + \Delta R)/(2 + \Delta R/R)$$
$$\approx (VL + VH)/2$$

Provided that the memory cell MC and the cell units CU0, CU1 of the dummy memory cell DCP are fabricated on the same memory array under the same manufacturing conditions, the respective tunnel magnetic resistive elements TMR are likely to have the same characteristics. Therefore, the read reference voltage Vref of the dummy memory cell DCP can be reliably set to an intermediate value of the read voltages VH and VL as given by the above equation (1), while allowing the manufacturing variation.

Figure 37:
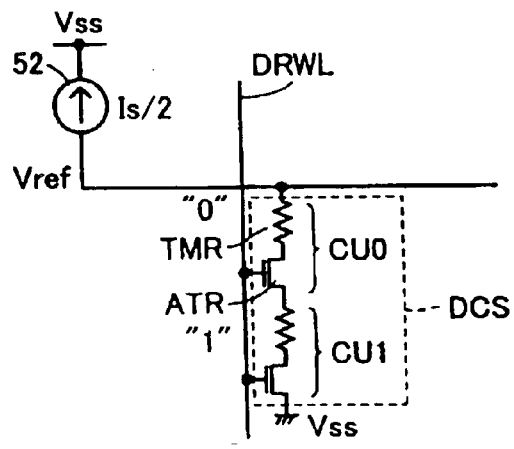
FIG. 37 is a circuit diagram showing a second structural example of the dummy memory cell according to the third embodiment.

Referring to FIG. 37, a dummy memory cell DCS according to the second structural example of the third embodiment includes two cell units CU0 and CU1 arranged in series. Each of the cell units CU0 and CU1 has the same structure as that of the memory cell MC.

The respective access transistors ATR of the cell units CU0 and CU1 have their gates connected to a common dummy read word line DRWL.

Different storage data "0" and "1" are written to the cell units CU0 and CU1, respectively. The data write operation to the dummy memory cell DCS can be conducted in the same manner as that of the dummy memory cell DCP.

In the data read operation, a constant current corresponding to half the sense current Is supplied to the memory cell MC, i.e., Is/2, is supplied from the current supply circuit 52 to the dummy memory cell DCS. The dummy read word line DRWL is activated in the data read operation.

Accordingly, in the data read operation, the two cell units CU0 and CU1 respectively retaining the storage data "0" and "1" are connected in series between the bit line BL for transmitting the read reference voltage Vref and the ground voltage Vss. As a result, the following read reference voltage Vref is produced by the dummy memory cell DCS:

$$Vref \approx (Is/2) \cdot (R + (R + \Delta R)) \quad (2).$$
$$= Is \cdot (R + \Delta R/2)$$
$$= (VL + VH)/2$$

As described before, the respective tunnel magnetic resistive elements TIMR of the memory cell CM and the cell units CU0, CU1 of the dummy memory cell DCS are expected to have the same characteristics. Therefore, the read reference voltage Vref of the dummy memory cell DCS can be reliably set to an intermediate value of the read voltages VH and VL as given by the above equation (2), while allowing the manufacturing variation.

Moreover, the dummy memory cell DCS has smaller current consumption in the data read operation, as compared to the dummy memory cell DCP of FIG. 36.

Note that, hereinafter, the dummy memory cell DCP of FIG. 36 is also referred to as "parallel dummy cell DCP", and the dummy memory cell DCS of FIG. 37 is also referred to as "series dummy cell DCS".

First Modification of Third Embodiment

Hereinafter, variations of the memory array structure including the dummy memory cells according to the third embodiment will be described.

Figure 38:
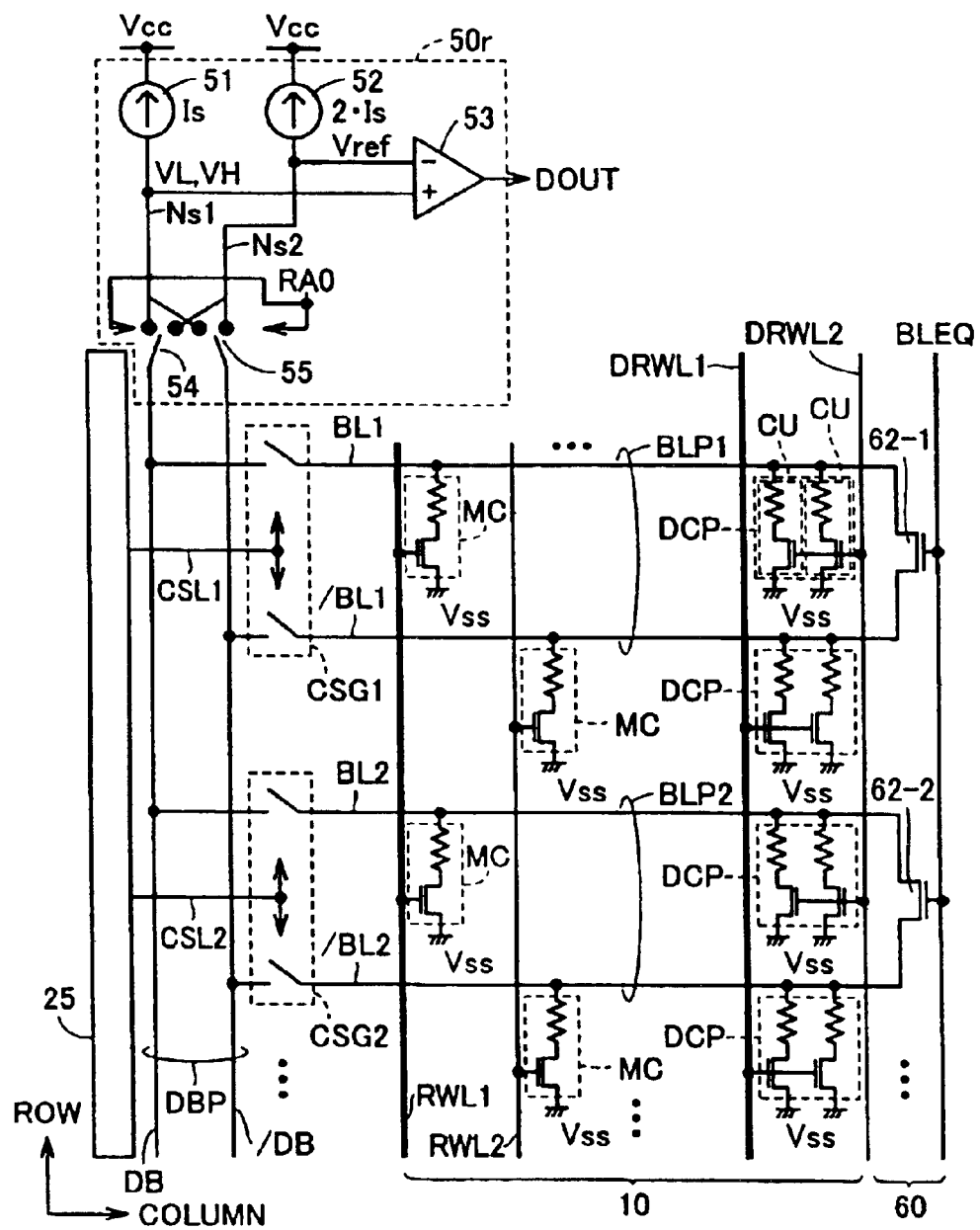
FIG. 38 is a block diagram showing the structure of a portion associated with the data read operation in a memory array and its peripheral circuitry according to a first modification of the third embodiment.

Referring to FIG. 38, the memory array 10 includes a plurality of memory cells MC arranged in rows and columns, and a plurality of dummy memory cells arranged so as to form two dummy rows. The parallel dummy cells DCP of FIG. 36 are used as dummy memory cells. Although not entirely shown in the figure, the memory cells MC are arranged in n rows by m columns in the memory array 10. (where n, m is a natural number).

Each parallel dummy cell DCP includes two cell units CU arranged in parallel. Each cell unit has the same structure as that of the memory cell MC. Thus, the memory cells MC arranged in rows and columns in the memory array 10 can be used as cell units of the parallel dummy cells DCP. Accordingly, the number of rows of the memory cells MC in the memory array 10 need only be increased, thereby facilitating arrangement of the dummy memory cells without complicating the manufacturing process.

In the memory array 10, read word lines RWL and write word lines WWL (not shown) are provided corresponding to the respective memory cell rows. Bit line pairs BLP are also provided corresponding to the respective memory cell columns. Each bit line pair BLP is formed from complementary bit lines BL and /BL. Although not entirely shown in the figure, the read word lines RWL1 to RWLn, write word lines WWL1 to WWLn, bit line pairs BLP1 to BLPm, and bit lines BL1 to BLm, /BL1 to /BLm are provided in the entire memory array 10.

FIG. 38 exemplarily shows the read word lines RWL1 and RWL2 respectively corresponding to the first and second memory cell rows, and the bit line pairs BLP1 and BLP2 respectively corresponding to the first and second columns. The bit line pair BLP1 is formed from bit lines BL1 and /BL1, and the bit line pair BLP2 is formed from bit lines BL2 and /BL2.

Note that, hereinafter, the write word lines, read word lines, bit lines and bit line pairs are also collectively denoted with WWL, RWL, BL (/BL) and BLP, respectively. A specific write word line, read word line, bit line and bit line pair are denoted with WWL1, RWL1, BL1 (/BL1), BLP1 and the like.

The memory cells MC of each row are respectively coupled to either the bit lines BL or bit lines /BL. For example, in the case of the memory cells MC of the first column, the memory cell of the first row is coupled to the bit line BL1, and the memory cell of the second row is coupled to the bit line /BL1. Similarly, the memory cells MC of the odd rows are respectively coupled to one bit lines BL1 to BLm of the bit line pairs, and the memory cells MC of the even rows are respectively coupled to the other bit lines /BL1 to /BLm.

As a result, when the read word line RWL is selectively activated according to the row selection result, either the one bit lines BL1 to BLm or the other bit lines /BL1 to /BLm of the bit line pairs are coupled to the memory cells MC.

A plurality of parallel dummy cells DCP arranged over two rows are respectively coupled to the bit lines BL to BLm and /BL1 to /BLm. Each parallel dummy cell DCP is selected either by a dummy read word line DRWL1 or DRWL2. The parallel dummy cells DCP selected by the dummy read word line DRWL1 are respectively coupled to the bit lines /BL1 to /BLm. The remaining parallel dummy cells DCP selected by the dummy read word line DRWL2 are respectively coupled to the bit lines BL1 to BLm.

The dummy read word lines DRWL1 and DRWL2 are selectively activated so as to couple either one bit lines BL or the other bit lines /BL of the bit line pairs, i.e., the bit lines that are not coupled to the memory cells MC of the selected memory cell row, to the parallel dummy cells DCP, respectively.

As a result, one bit lines BL1 to BLm and the other bit lines /BL1 to /BLm of the respective bit line pairs are coupled to a plurality of memory cells MC of the selected memory cell row, and a plurality of parallel dummy cells, respectively.

The column decoder 25 activates one of column selection lines CSL1 to CSLm to the selected state (H level) according to the decode result of the column address CA. The column selection lines CSL1 to CSLm are provided corresponding to the respective memory cell columns.

The structure of a column selection gate included in the read/write control circuit 50 will now be described.

The column selection gates CSG1, CSG2, . . . are provided corresponding to the respective memory cell columns. One of the plurality of column selection gates is turned ON according to the column selection result of the column decoder 25, thereby coupling data buses DB and /DB of a data bus pair DBP to the corresponding bit lines BL and /BL, respectively.

For example, the column selection gate CSG1 includes a transistor switch electrically coupled between the data bus DB and bit line BL1, and a transistor switch electrically coupled between the data bus /DB and bit line /BL1. These transistor switches are turned ON/OFF according to the voltage level on the column selection line CSL1. More specifically, when the column selection line CSL1 is activated to the selected state (H level), the column selection gate CSG1 electrically couples the data buses DB and /DB to the bit lines BL1 and /BL1, respectively. The column selection gates corresponding to the other memory cell columns have the same structure.

The read/write control circuit 60 is located opposite to the column selection gates CSGL to CSGm with the memory array 10 interposed therebetween.

The read/write control circuit 60 includes bit-line connecting transistors 62-1, 62-2, . . . which are turned ON/OFF according to a bit-line equalizing signal BLEQ. The bit-line connecting transistors are provided respectively corresponding to the memory cell columns. For example, the bit-line connecting transistor 62-1 corresponds to the first memory cell column, and electrically couples the bit lines BL1 and /BL1 to each other in response to activation (H level) of the bit-line equalizing signal BLEQ.

Similarly, each of the bit-line connecting transistors respectively corresponding to the other memory cell columns electrically couples the bit lines BL and /BL of the corresponding bit line pair to each other in response to activation of the bit-line equalizing signal BLEQ. Hereinafter, the bit-line connecting transistors 62-1 to 62-*m* are also collectively referred to as bit-line connecting transistors 62.

The bit-line equalizing signal BLEQ is produced by the control circuit 5. The bit-line equalizing signal BLEQ is activated to H level when the MRAM device 1 is in the standby state, when the memory array 10 is in the non-selected state during active period of the MRAM device 1, and when the data write operation is conducted during active period of the MRAM device 1. The bit-line equalizing signal BLEQ is activated to H level in order to connect the bit lines BL and /BL of each folded bit line pair to each other in each memory cell column.

The bit line-equalizing signal BLEQ is inactivated to L level when the data read operation is conducted during active period of the MRAM device 1. In response to this, the bit lines BL and /BL of each bit line pair in each memory cell column are disconnected from each other.

A not-shown precharging circuit precharges each bit line BL, /BL to a prescribed precharge voltage at prescribed timing before the data read operation.

Figure 39:
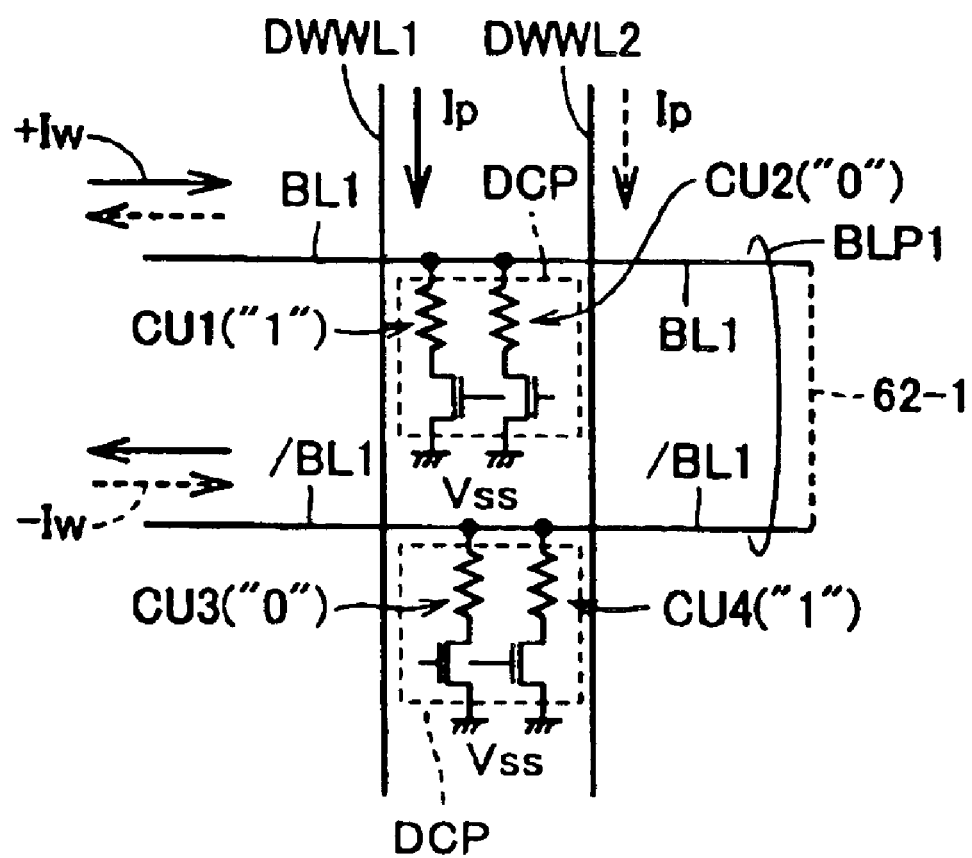
FIG. 39 is a conceptual diagram illustrating the data write operation to a parallel dummy cell shown in FIG. 38.

FIG. 39 is a conceptual diagram illustrating the data write operation to the parallel dummy cell.

FIG. 39 exemplarily illustrates the data write operation to two parallel dummy cells DCP corresponding to the bit line pair BLP1.

Referring to FIG. 39, the parallel dummy cell DCP connected to the bit line BL1 includes cell units CU1 and CU2. Similarly, the parallel dummy cell DCP connected to the bit line /BL1 includes cell units CU3 and CU4.

Dummy write word lines DWWL1 and DWWL2 extend in such a direction that cross the bit lines BL, /BL, i.e., in the row direction. The dummy write word lines DWWL1 and DWWL2 respectively correspond to the two cell units of each of the plurality of parallel dummy cells DCP arranged over two rows.

In the data write operation, the bit-line connecting transistor 62-1 is turned ON. Therefore, the data write current supplied to the bit line pair BLP1 flows through the bit lines BL1 and /BL1 as a reciprocating current.

First, as shown by the solid arrows in the figure, the dummy write word line DWWL1 is activated so that a data write current Ip flows therethrough. Moreover, a data write current +Iw is applied to the bit line pair BLP1. Thus, the storage data of different levels are respectively written to the cell units CU1 and CU3. It is herein assumed that the data "1" is written to the cell unit CU1, and data "0" is written to the cell unit CU3.

Then, as shown by the dashed arrows in the figure, the dummy write word line DWWL2 is activated so that the data write current Ip flows therethrough. Moreover, a data write current −Iw having the opposite direction to that of the data write current +Iw is applied to the bit line pair BLP1. Thus, the storage data of different levels from those of the cell units CU1 and CU3 can be written to the cell units CU2 and CU4, respectively. More specifically, the data "0" is written to the cell unit CU2, and data "1" is written to the cell unit CU4.

Regarding the parallel dummy cells DCP corresponding to the other bit line pairs as well, the same data write operation is conducted in parallel. As a result, the storage data "1" and "0" can be respectively written to two cell units of each parallel dummy cell DCP in two write cycles.

The data write operation to the dummy memory cell may either be conducted as a part of the initialization sequence upon power-ON of the MRAM device, or may be conducted periodically during operation of the MRAM device. For example, the data write operation to the dummy memory cell may be conducted in each cycle upon every memory access.

Referring back to FIG. 38, the data read circuit 50*r* outputs read data DOUT in the data read operation. The data read circuit 50*r* includes current supply circuits 51 and 52 for supplying constant current Is and 2·Is to internal nodes Ns1 and Ns2 in response to the power supply voltage Vcc, respectively, an amplifier 53 for amplifying the voltage difference between the internal nodes Ns1 and Ns2 and outputting the read data DOUT, a switch 54 for connecting one of the internal nodes Ns1 and Ns2 to the data bus DB, and a switch 55 for connecting the other internal node to the data bus /DB.

The switches 54 and 55 make a complementary selection based on a row selection signal RA0. The row selection signal RA0 is a one-bit signal indicating whether the selected memory cell row is an odd row or even row. More specifically, when an odd row is selected, the switch 54 connects the internal node Ns1 to the data bus DB, and the switch 55 connects the internal node Ns2 to the data bus /DB. In contrast, when an even row is selected, the switch 54 connects the internal node Ns2 to the data bus DB, and the switch 55 connects the internal node Ns1 to the data bus /DB.

As a result, in the bit line pair corresponding to the column selection result, the sense current Is is supplied to the bit line connected to the memory cell MC. On the other hand, a current corresponding to twice the sense current, i.e., 2·Is, is supplied to the bit line connected to the parallel dummy cell. Thus, the read voltage VH or VL is produced at the internal node Ns1 according to the storage data of the selected memory cell MC. On the other hand, the read reference voltage Vref is produced at the internal node Ns2 by the parallel dummy cell as described in connection with FIG. 36.

The amplifier 53 senses and amplifies the voltage difference between the internal nodes Ns1 and Ns2, i.e., the difference between the read voltage VH or VL and read reference voltage Vref, thereby producing the read data DOUT corresponding to the storage data of the selected memory cell.

Thus, the data read operation based on the folded-bit-line structure can be conducted with a large signal margin by using the read reference voltage Vref that is reliably set to an intermediate value of the read voltages VH and VL while allowing manufacturing variation.

Second Modification of Third Embodiment

A memory array using the parallel dummy cells DCP in the open-bit-line structure will be described in the second modification of the third embodiment.

Figure 40:
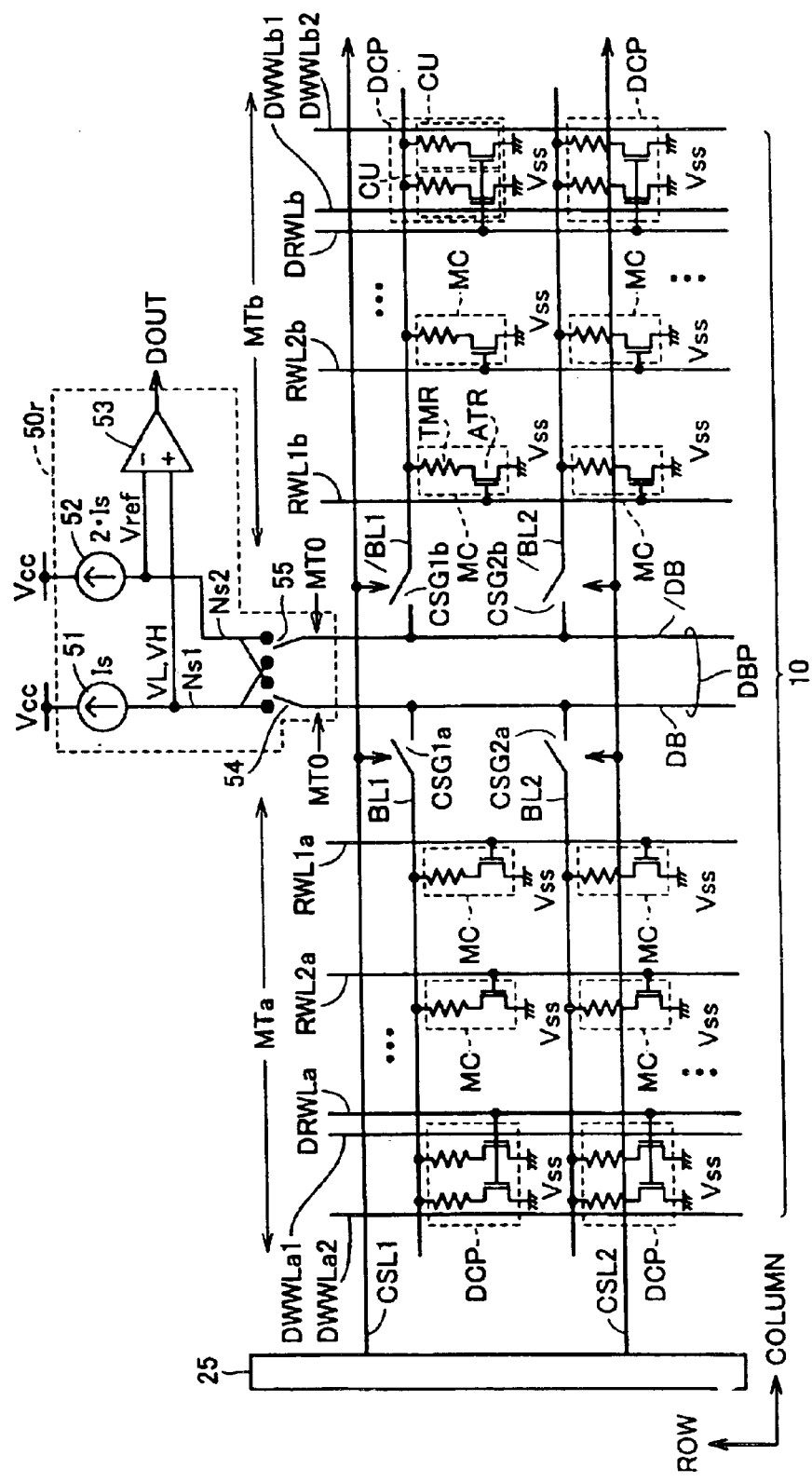
FIG. 40 is a block diagram showing the structure of a portion associated with the data read operation in a memory array and its peripheral circuitry according to a second modification of the third embodiment.

Referring to FIG. 40, the memory array is divided into two memory mats MTa and MTb in the row direction. In each memory mat MTa, MTb, read word lines RWL and write word lines WWL (not shown) are provided corresponding to the respective memory cell rows, and bit lines BL are provided corresponding to the respective memory cell columns.

Each memory mat MTa, MTb has the same number of bit lines based on the open-bit-line structure. In FIG. 40, the bit lines provided in one memory mat MTa are denoted with BL1, BL2, . . . , and the bit lines provided in the other memory mat MTb are denoted with /BL1, /BL2, . . . The memory cells MC are coupled to each bit line in each memory cell row.

FIG. 40 exemplarily shows read word lines RWL1a, RWL2a and RWL1b, RWL2b respectively corresponding to the first and second memory cell rows, and bit lines BL1, /BL1 and BL2, /BL2 respectively corresponding to the first and second memory cell columns. A not-shown precharging circuit sets the bit lines BL and /BL to a prescribed precharge voltage at prescribed timing before the data read operation.

In each memory mat MTa, MTb, a plurality of dummy memory cells are arranged so as to form a single dummy row. The parallel dummy cells DCP of FIG. 36 are used as dummy memory cells.

The plurality of parallel dummy cells DCP in the memory mat MTa are coupled to the bit lines BL1, BL2, . . . , respectively. The plurality of parallel dummy cells DCP in the memory mat MTb are coupled to the bit lines /BL1, /BL2, . . . , respectively.

Each of the parallel dummy cells DCP in the memory mat MTa is selected by a dummy read word line DRWLa. Each of the parallel dummy cells DCP in the memory mat MTb is selected by a dummy read word line DRWLb.

The dummy read word line DRWLa, DRWLb is activated in the non-selected memory mat that does not include the memory cell to be read. The read word line RWL corresponding to the row selection result is activated in the selected memory mat including the memory cell to be read.

As a result, the bit line is connected to the memory cell MC in the selected memory mat, and the bit line is connected to the parallel dummy cell DCP in the non-selected memory mat.

Hereinafter, the data write operation to the parallel dummy cell DCP will be described.

In each of the memory mats MTa and MTb, two dummy write word lines are provided respectively corresponding to two cell units of each parallel dummy cell DCP. The dummy write word lines extend in such a direction that crosses the bit lines BL, /BL, i.e., in the row direction. More specifically, dummy write word lines DWWLa1 and DWWLa2 are provided in the memory mat MTa, and dummy write word lines DWWLb1 and DWWLb2 are provided in the memory mat MTb.

First, the dummy write word lines DWWLa1 and DWWLb1 are activated so that a data write current Ip flows therethrough. Moreover, a data write current is applied to each bit line BL, /BL. Thus, the storage data of the same level (e.g., "1") is written to one of the cell units of each parallel dummy cell DCP.

Then, the dummy write word lines DWWLa2 and DWWLb2 are activated so that the data write current Ip flows therethrough. Moreover, a data write current having the opposite direction to that of the aforementioned data write current is applied to the bit lines BL, /BL. Thus, the storage data of a different level from that described above (e.g., "0") can be written to the other cell unit of each parallel dummy cell DCP.

As a result, the storage data "1" and "0" can be respectively written to two cell units of each parallel dummy cell DCP in two write cycles. The timing of conducting the data write operation to the dummy memory cells is the same as that described in the first modification of the third embodiment.

In each memory mat MTa, MTb, column selection gates are provided corresponding to the respective memory cell columns. The column selection gates CSG1a, CSG2a, . . . in the memory mat MTa couple the bit lines BL1, BL2, . . . to the data bus DB, respectively. The column selection gates CSG1b, CSG2b, . . . in the memory mat MTb couple the bit lines /BL1, /BL2, . . . to the data bus /DB, respectively.

Two column selection gates corresponding to the same memory cell column in the memory mats MTa and MTb are turned ON/OFF in common according to the column selection result of the column decoder 25. Therefore, the bit lines BL and /BL corresponding to the column selection result are connected to the data buses DB and /DB, respectively.

As a result, when the memory mat MTa is selected, the data bus DB is connected to the selected memory cell, and the data bus /DB is connected to a parallel dummy cell DCP. In contrast, when the memory mat MTb is selected, the data bus /DB is connected to the selected memory cell, and the data bus DB is connected to a parallel dummy cell DCP.

The data read circuit 50*r* has the same structure as that shown in FIG. 38, and includes current supply circuits 51 and 52, an amplifier 53, and switches 54 and 55.

In FIG. 40, the switches 54 and 55 make a complementary selection based on a memory mat selection signal MT0. The memory mat selection signal MT0 is a one-bit signal indicating which of the memory mats MTa and MTb is selected. More specifically, when the memory mat MTa is selected, the switch 54 connects the internal node Ns1 to the data bus DB, and the switch 55 connects the internal node Ns2 to the data bus /DB. In contrast, when the memory mat MTb is selected, the switch 54 connects the internal node Ns2 to the data bus DB, and the switch 55 connects the internal node Ns1 to the data bus /DB.

As a result, in the selected memory mat, the sense current Is is supplied to the bit line connected to the memory cell MC. In the non-selected memory mat, a current corresponding to twice the sense current, i.e., 2·Is, is supplied to the bit line connected to the parallel dummy cell. Thus, the read voltage VH or VL is produced at the internal node Ns1 according to the storage data of the selected memory cell MC. On the other hand, the read reference voltage Vref is produced at the internal node Ns2 by the parallel dummy cell as described in connection with FIG. 36.

Thus, as in the case of the first modification of the third embodiment, the data read operation can be conducted with a large signal margin by using the read reference voltage Vref that is reliably set to an intermediate value of the read voltages VH and VL while allowing manufacturing variation, that is, by sensing and amplifying the voltage difference between the read voltage VH or VL and read reference voltage Vref.

Third Modification of Third Embodiment

Figure 41:
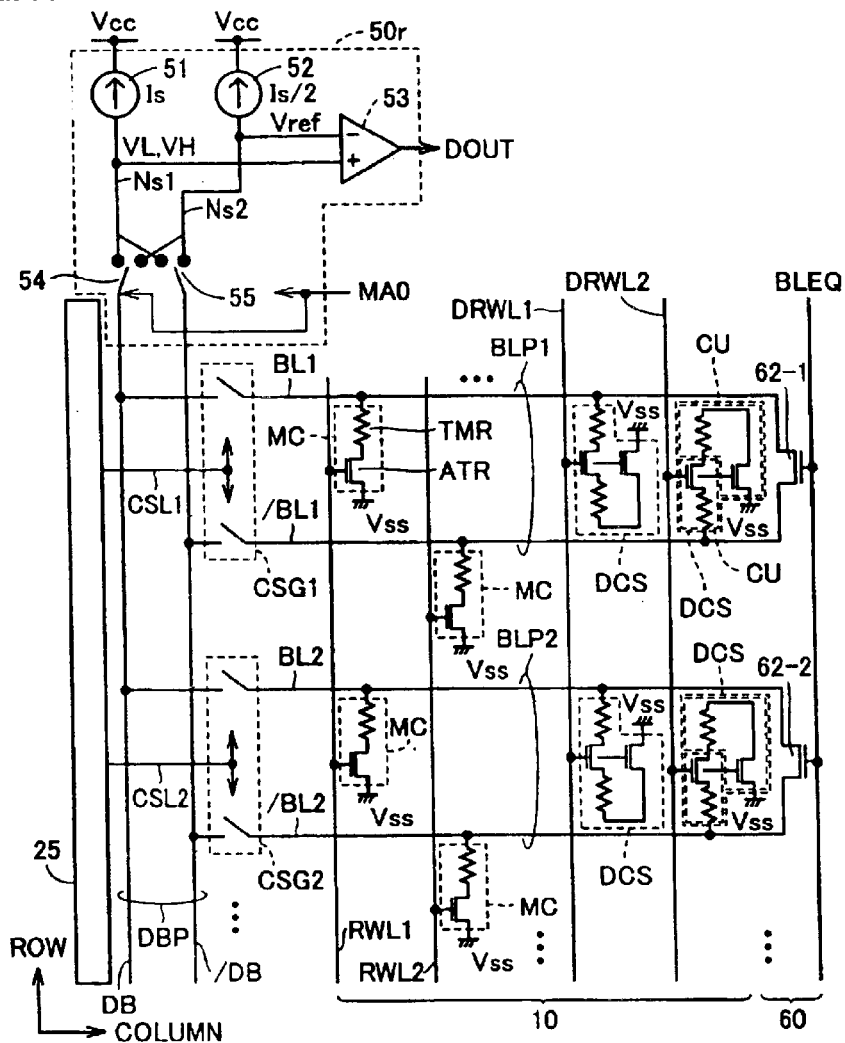
FIG. 41 is a block diagram showing the structure of a portion associated with the data read operation in a memory array and its peripheral circuitry according to a third modification of the third embodiment.

Referring to FIG. 41, the structure of the third modification of the third embodiment is different from that of the first modification of the third embodiment shown in FIG. 38 in that the series dummy cells DCS of FIG. 37 are provided instead of the parallel dummy cells DCP. Moreover, the current amount supplied from the current supply circuit 52 to the dummy memory cell in the data read operation is set to half the sense current Is supplied to the memory cell MC, i.e., Is/2.

Since the structure associated with the data read operation is otherwise the same as that of FIG. 38, detailed description thereof will not be repeated.

Figure 42:
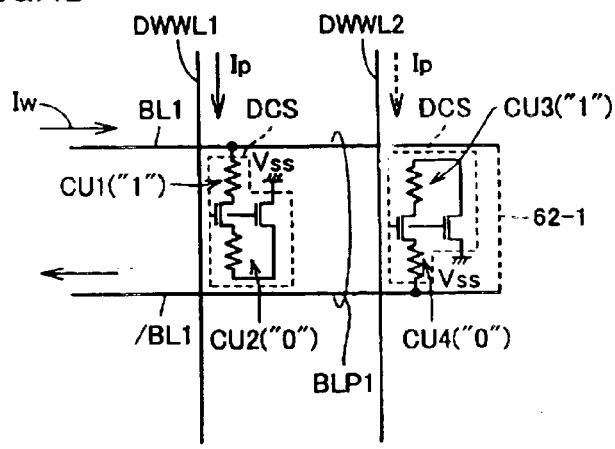
FIG. 42 is a conceptual diagram illustrating the data write operation to a series dummy cell shown in FIG. 41.

FIG. 42 is a conceptual diagram illustrating the data write operation to the series dummy cell DCS.

FIG. 42 exemplarily illustrates the data write operation to two series dummy cells DCS corresponding to the bit line pair BLP1.

Referring to FIG. 42, the series dummy cell DCS connected to the bit line BL1 includes cell units CU1 and CU2. Similarly, the series dummy cell DCS connected to the bit line /BL1 includes cell units CU3 and CU4.

Dummy write word lines DWWL1 and DWWL2 extend in such a direction that crosses the bit lines BL, /BL, i.e., in the row direction. The dummy write word lines DWWL1 and DWWL2 respectively correspond to the rows of the series dummy cells DCS.

In the data write operation, the bit-line connecting transistor 62-1 is turned ON. Therefore, the data write current supplied to the bit line pair BLP1 flows through the bit lines BL1 and /BL1 as a reciprocating current.

The dummy write word line DWWL1 is activated so that a data write current Ip flows therethrough. Moreover, a data write current Iw is applied to the bit line pair BLP1. Thus, the storage data of different levels are respectively written to the cell units CU1 and CU2. It is herein assumed that the data "1" is written to the cell unit CU1, and data "0" is written to the cell unit CU2.

Similarly, the dummy write word line DWWL2 is activated so that the data write current Ip flows therethrough. Moreover, the data write current Iw is applied to the bit line pair BLP1. Thus, the storage data of different levels can be written to the cell units CU3 and CU4, respectively. Regarding the series dummy cells DCS of the other bit line pairs as well, the same data write operation is conducted in parallel. As a result, the storage data "1" and "0" can be respectively written to two cell units of each series dummy cell DCS.

Note that, by simultaneously activating the dummy write word lines DWWL1 and DWWL2, the data can be written to each series dummy cell in a single write cycle. Since the timing of conducting the data write operation to the dummy memory cells is the same as that described above, description thereof will not be repeated.

Since the data read operation is the same as that of the first modification of the third embodiment, detailed description thereof will not be repeated. Thus, even when the series dummy cells are used, the data read operation can be conducted with a large signal margin by using the read reference voltage Vref that is reliably set to an intermediate value of the read voltages VH and VL while allowing manufacturing variation. Moreover, the use of the series dummy cells enables suppression in power consumption of the data read operation as well as reduction in data write time to the dummy memory cell. Reliability of the memory cell largely depends on a current flowing through a tunnel film (tunnel barrier 104 in FIG. 3). Since this current is reduced to about half in the series dummy cell, reliability of the dummy cell is improved.

Fourth Modification of Third Embodiment

Figure 43:
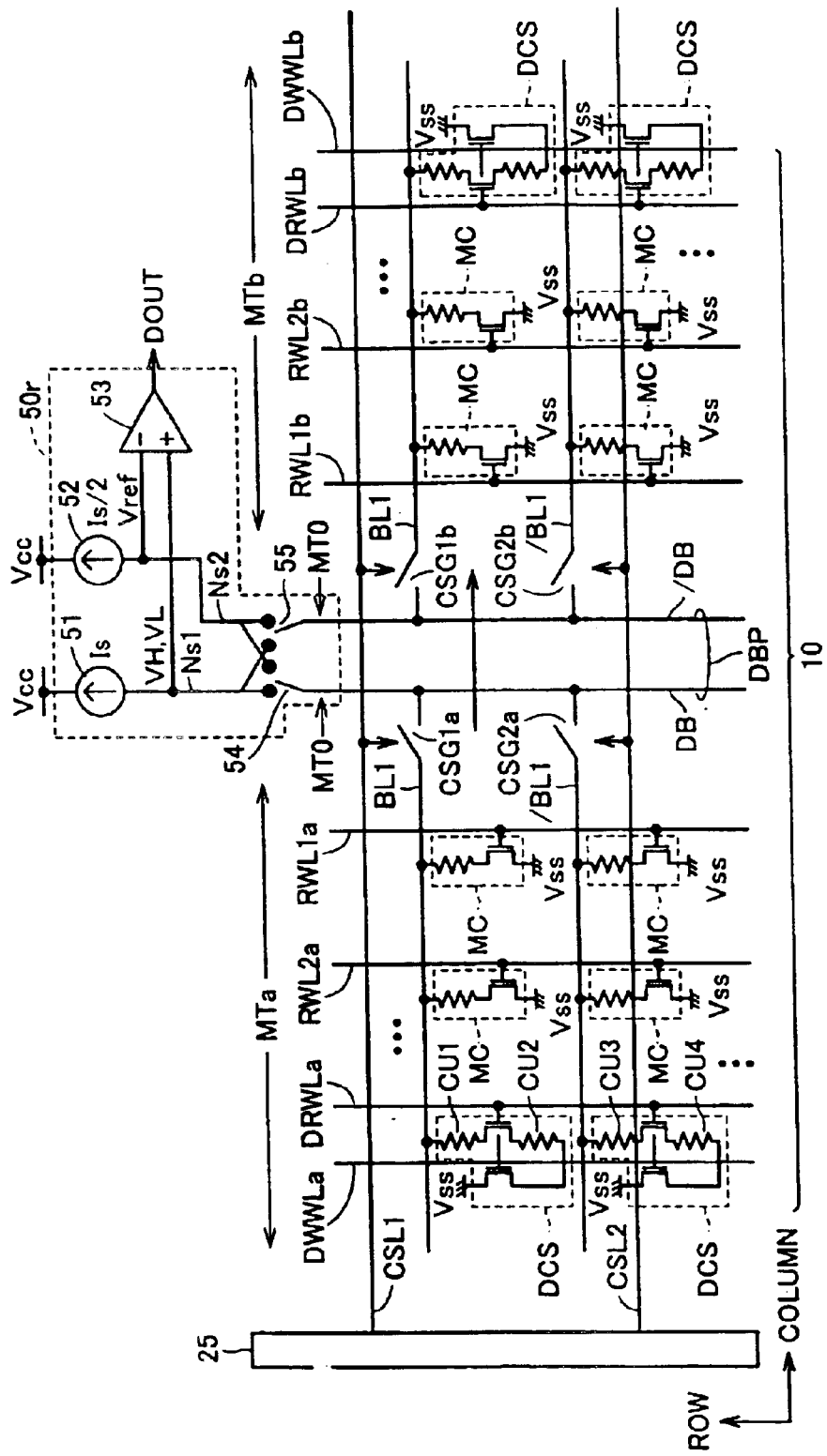
FIG. 43 is a block diagram showing the structure of a portion associated with the data read operation in a memory array and its peripheral circuitry according to a fourth modification of the third embodiment.

Referring to FIG. 43, the structure of the fourth modification of the third embodiment is different from that of the second modification of the third embodiment shown in FIG. 40 in that the series dummy cells DCS of FIG. 37 are provided instead of the parallel dummy cells DCP. Moreover, the current amount supplied from the current supply circuit 52 to the dummy memory cell in the data read operation is set to half the sense current Is supplied to the memory cell MC, i.e., Is/2.

Since the structure associated with the data read operation is otherwise the same as that of FIG. 40, detailed description thereof will not be repeated.

Hereinafter, the data write operation to the series dummy cell DCS will be described.

Dummy write word lines DWWLa and DWWLb respectively corresponding to the memory mats MTa and MTb are provided in the row direction.

First, the dummy write word lines DWWLa and DWWLb are activated so that a data write current Ip flows therethrough. Moreover, a data write current +Iw is applied to each bit line BL, /BL of odd columns. Thus, the storage data of the same level (e.g., "1") is written to one of the cell units of each series dummy cell DCS (the cell units CU1 and CU4 in FIG. 43).

Then, the dummy write word lines DWWLa and DWWLb are activated so that the data write current Ip flows therethrough. Moreover, a data write current −Iw having the opposite direction to that of the data write current +Iw is applied to each bit line BL, /BL of even columns. Thus, the storage data of a different level from that described above (e.g., "0") can be written to the other cell unit of each series dummy cell DCS (the cell units CU2 and CU3 in FIG. 43).

As a result, the storage data "1" and "0" can be respectively written to two cell units of each series dummy cell DCS in two write cycles. The timing of conducting the data write operation to the dummy memory cells is the same as that described in the first modification of the third embodiment.

Since the data read operation is the same as that of the second modification of the third embodiment, detailed description thereof will not be repeated. Thus, even when the series dummy cells are used, the data read operation can be conducted with a large signal margin by using the read reference voltage Vref that is reliably set to an intermediate value of the read voltages VH and VL while allowing manufacturing variation. Moreover, the use of the series dummy cells enables suppression in power consumption of the data read operation.

Fifth Modification of Third Embodiment

Figure 44:
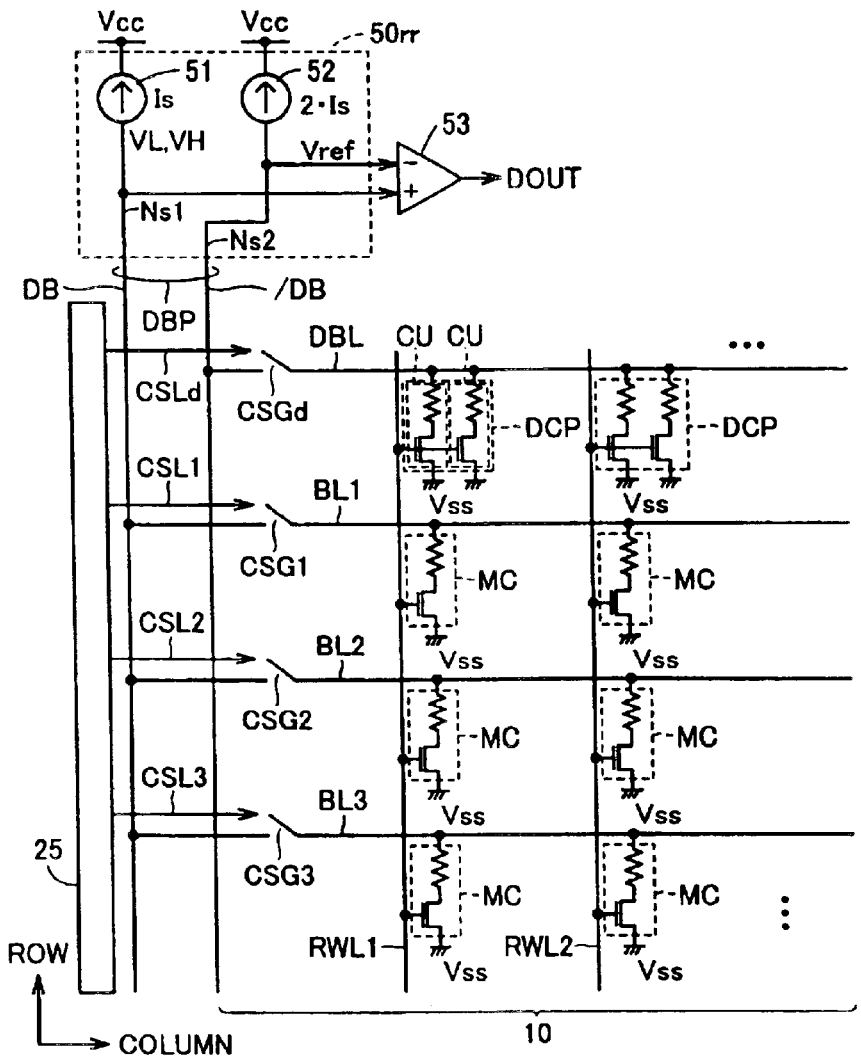
FIG. 44 is a block diagram showing the structure of a portion associated with the data read operation in a memory array and its peripheral circuitry according to a fifth modification of the third embodiment.

Referring to FIG. 44, in the structure of the fifth modification of the third embodiment, the dummy memory cells are arranged so as to form a dummy column. In FIG. 44, the parallel dummy cells DCP of FIG. 36 are used as dummy memory cells.

As in the case of the open-bit-line structure shown in FIGS. 40 and 43, the memory cell MC is provided for every bit line BL in each memory cell row. A column selection gate CSG1, CSG2, . . . is turned ON in response to activation of a corresponding column selection line CSL1, CSL2, . . . , i.e., according to the column selection result of the column decoder 25. As a result, the bit line BL corresponding to the column selection result is coupled to one data bus DB of the data bus pair DBP.

The parallel dummy cells DCP of the dummy column are connected to a dummy bit line DBL. Each parallel dummy cell DCP includes two cell units that are connected to the dummy bit line DBL in response to activation of a corresponding read word line RWL. A dummy column selection gate CSGd is provided between the other data bus /DB of the data bus pair DBP and dummy bit line DBL. The dummy column selection gate CSGd is turned ON in response to activation of a dummy column selection line CSLd. In the data read operation, the dummy column selection line CSLd is activated regardless of the selected memory cell column.

Figure 45:
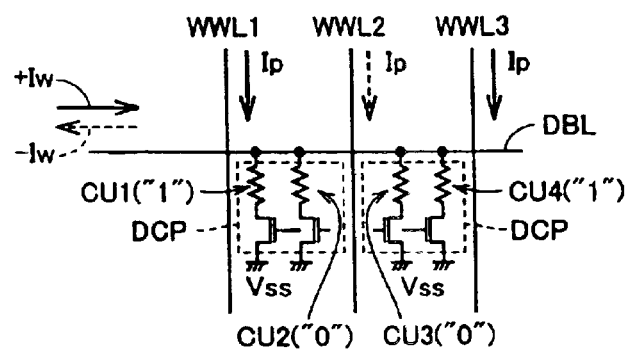
FIG. 45 is a conceptual diagram illustrating the data write operation to a parallel dummy cell shown in FIG. 44.

FIG. 45 is a conceptual diagram illustrating the data write operation to the parallel dummy cell of FIG. 44.

FIG. 45 exemplarily illustrates the data write operation to two parallel dummy cells DCP corresponding to the first and second rows.

Referring to FIG. 45, the parallel dummy cell DCP of the first row includes cell units CU1 and CU2. Similarly, the parallel dummy cell DCP of the second row includes cell units CU3 and CU4.

Each of the write word lines WWL corresponding to the respective memory cell rows is shared by the memory cells MC and cell units of the same memory cell row. For example, in FIG. 45, the cell unit CU1 corresponds to the write word line WWL1, the cell units CU2 and CU3 correspond to the write word line WWL2, and the cell unit CU4 corresponds to the write word line WWL3.

First, as shown by the solid arrows in the figure, the write word lines WWL1, WWL3, . . . of odd rows are activated so that a data write current Ip flows therethrough. Moreover, a data write current +Iw is applied to the dummy bit line DBL. Thus, the storage data of the same data is written to the cell units CU1 and CU4. It is herein assumed that the storage data "1" is written to the cell units CU1 and CU4.

Then, as shown by the dashed arrows in the figure, the write word lines WWL2, WWL4, . . . of even rows are activated so that the data write current Ip flows therethrough. Moreover, a data write current −Iw having the opposite direction to that of the data write current +Iw is applied to the dummy bit line DBL. Thus, the storage data of a different level from that of the cell units CU1 and CU4 can be written to the cell units CU2 and CU3. More specifically, the data "0" is written to the cell units CU2 and CU3.

As a result, the storage data "1" and "0" can be respectively written to two cell units of each parallel dummy cell DCP in two write cycles. The timing of conducting the data write operation to the dummy memory cells is the same as that described in the first modification of the third embodiment.

Referring back to FIG. 44, a data read circuit 50rr provided instead of the data read circuit 50r includes current supply circuits 51, 52 and an amplifier 53. The data read circuit 50rr is different from the data read circuit 50r in that the internal nodes Ns1 and Ns2 are directly connected to the data buses DB and /DB, respectively, without using the switches 54 and 55.

As a result, the sense current Is is supplied to the bit line corresponding to the column selection line, i.e., the bit line connected to the memory cell MC, and a current corresponding to twice the sense current, i.e., 2·Is, is supplied to the dummy bit line connected to the parallel dummy cell.

Thus, the read voltage VH or VL is produced at the internal node Ns1 according to the storage data of the selected memory cell MC. On the other hand, the read reference voltage Vref is produced at the internal node Ns2 by the parallel dummy cell as described in connection with FIG. 36.

Accordingly, even when the parallel dummy cells are arranged in a dummy column, the data read operation can be conducted with a large signal margin by using the read reference voltage Vref that is reliably set to an intermediate value of the read voltages VH and VL while allowing manufacturing variation.

Sixth Modification of Third Embodiment

Figure 46:
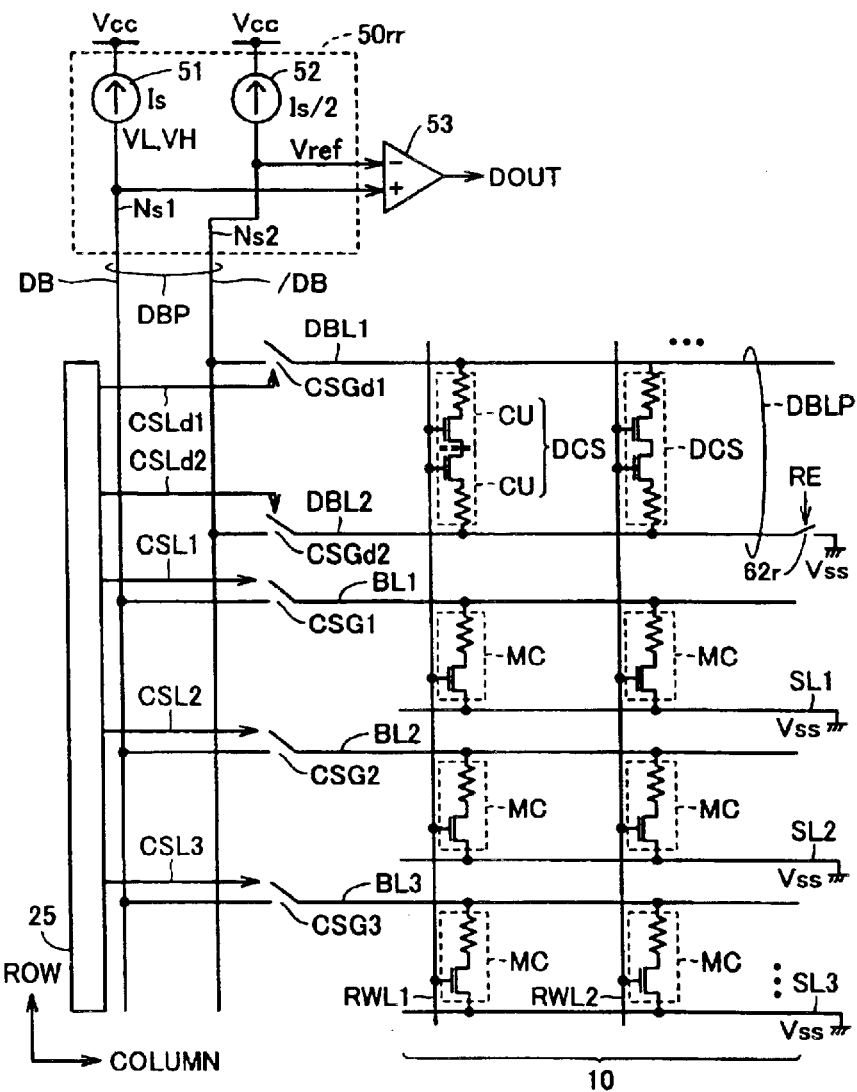
FIG. 46 is a block diagram showing the structure of a portion associated with the data read operation in a memory array and its peripheral circuitry according to a sixth modification of the third embodiment.

Referring to FIG. 46, the structure of the sixth modification of the third embodiment is different from that of the fifth modification of the third embodiment shown in FIG. 44 in that the series dummy cells DCS of FIG. 37 are provided instead of the parallel dummy cells DCP.

The series dummy cells DCS are provided respectively corresponding to the memory cell rows. Each series dummy cell DCS includes two cell units that are selected by the same read word line RWL and connected in series between dummy bit lines DBL1 and DBL2.

The dummy bit line DBL2 is coupled to the ground voltage Vss through a switch 62r. The switch 62r is turned ON in the data read operation in response to a control signal RE.

Dummy column selection gates CSGd1 and CSGd2 are respectively connected between the dummy bit lines DBL1, DBL2 and data bus /DB. The dummy column selection gates CSGd1 and CSGd2 are respectively turned ON in response to activation of dummy column selection lines CSLd1 and CSLd2. In the data read operation, the dummy column selection line CSLd1 is activated as well as the dummy column selection line CSLd2 is inactivated regardless of the selected memory cell column.

Source lines SL1, SL2, . . . for supplying the ground voltage Vss are provided corresponding to the respective memory cell columns. In the data read operation, the ground voltage Vss is supplied to each memory cell MC through the source line SL.

The current amount supplied from the current supply circuit 52 to the dummy memory cell in the data read operation is set to half the sense current Is supplied to the memory cell MC, i.e., Is/2. Since the structure associated with the data read operation is otherwise the same as that of FIG. 40, detailed description thereof will not be repeated.

Figure 47:
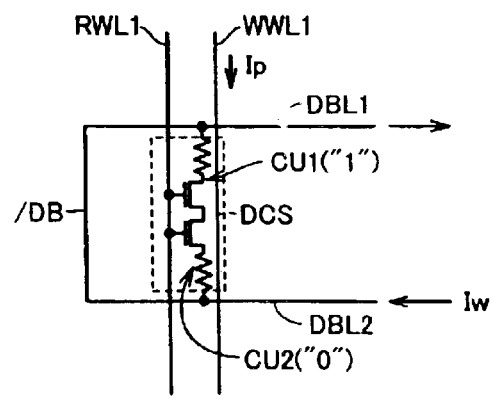
FIG. 47 is a conceptual diagram illustrating the data write operation to a series dummy cell shown in FIG. 46.

FIG. 47 is a conceptual diagram illustrating the data write operation to the series dummy cell DCS of FIG. 46. FIG. 47 exemplarily illustrates the data write operation to the series dummy cell DCS of the first row.

Referring to FIG. 47, the series dummy cell DCS of the first row includes cell units CU1 and CU2 that are selected by the read word line RWL1.

Each of the write word lines WWL corresponding to the respective memory cell rows is shared by the memory cells MC and cell units of the same memory cell row. Therefore, the data write operation to the series dummy cell DCS of the first row is conducted using the write word line WWL1.

In the data write operation, a data write current flows as a reciprocating current through a dummy bit line pair DBLP that is formed from the dummy bit lines DBL1 and DBL2 coupled by the data bus /DB.

Accordingly, the write word line WWL1 is activated so that a data write current Ip flows therethrough. Moreover, a data write current Iw is applied to the dummy bit lines DBL1 and DBL2. Thus, the storage data of different levels are respectively written to the cell units CU1 and CU2. It is herein assumed that the data "1" is written to the cell unit CU1, and data "0" is written to the cell unit CU2.

Regarding the series dummy cells DCS of the other memory cell rows as well, the same data write operation is conducted in parallel. As a result, the storage data "1" and "0" can be respectively written to two cell units of each series dummy cell DCS in a single write cycle.

Since the data read operation is the same as that of the fifth modification of the third embodiment, detailed description thereof will not be repeated. Thus, even when the series dummy cells are used, the data read operation can be conducted with a large signal margin by using the read reference voltage Vref that is reliably set to an intermediate value of the read voltages VH and VL while allowing manufacturing variation. Moreover, the use of the series dummy cells enables suppression in power consumption of the data read operation as well as reduction in data write time to the dummy memory cell. As described before, since a current flowing through a tunnel film is reduced to about half in the series dummy cell, reliability of the dummy cell is improved.

Moreover, designing the dummy bit lines DBL1, DBL2, bit lines BL and source lines SL extending in the same direction to have the same electric resistance value per unit length enables the path of the sense current Is supplied to the memory cell MC and dummy memory cell to have the same electric resistance value regardless of the position of the selected memory cell row. As a result, the sense current amount can be prevented from varying depending on the position of the selected memory cell row, allowing for further improvement in signal margin of the data read operation.

Seventh Modification of Third Embodiment

Figure 48:
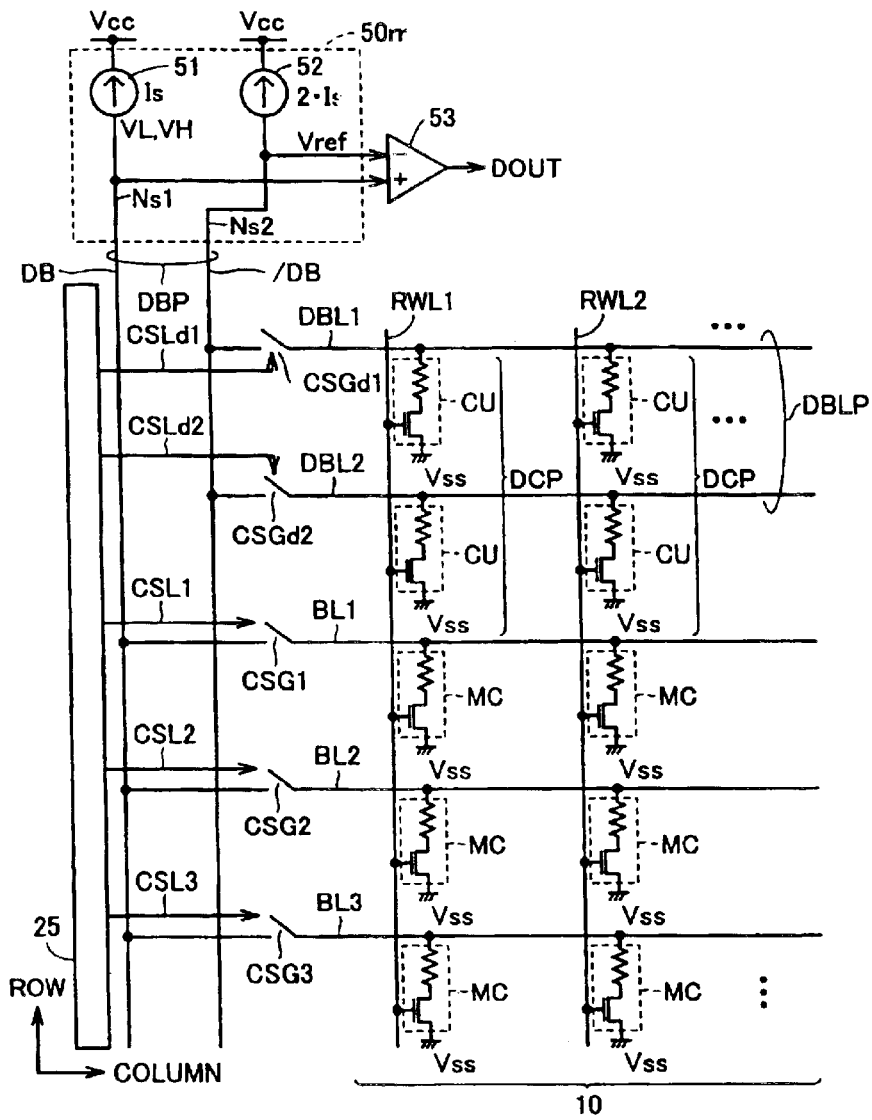
FIG. 48 is a block diagram showing the structure of a portion associated with the data read operation in a memory array and its peripheral circuitry according to a seventh modification of the third embodiment.

Referring to FIG. 48, the structure of the seventh modification of the third embodiment is different from that of the fifth modification of the third embodiment shown in FIG. 44 in that each parallel dummy cell DCP is formed from cell units arranged in two columns. As described before, the structure of the cell unit CU is the same as that of the memory cell MC.

Such a structure enables the cell units in the dummy column portion and regular memory cells to be arranged with the same pitch. In other words, the memory cells MC arranged in extra two columns can be used as the cell units CU, thereby facilitating fabrication of the parallel dummy cells DCP.

The parallel dummy cells DCP are provided corresponding to the respective memory cell rows. Each parallel dummy cell DCP includes two cell units CU selected by the same read word line RWL.

Dummy bit lines DBL1 and DBL2 are provided corresponding to the respective columns of the cell units.

Dummy column selection gates CSGd1 and CSGd2 are respectively connected between the dummy bit lines DBL1, DBL2 and data bus /DB. The dummy column selection gates CSGd1 and CSGd2 are respectively turned ON in response to activation of dummy column selection lines CSLd1 and CSLd2. In the data read operation, the dummy column selection lines CSLd1 and CSLd2 are activated regardless of the selected memory cell column.

Since the structure associated with the data read operation is otherwise the same as that of FIG. 40, detailed description thereof will not be repeated.

Figure 49:
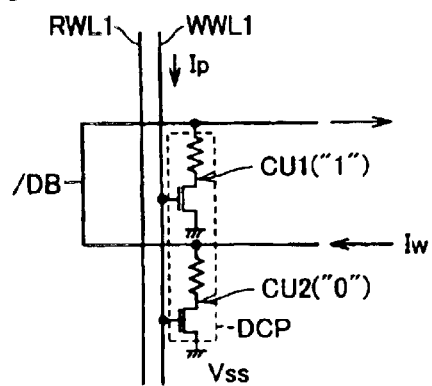
FIG. 49 is a conceptual diagram illustrating the data write operation to a parallel dummy cell shown in FIG. 48.

FIG. 49 is a conceptual diagram illustrating the data write operation to the parallel dummy cell of FIG. 48. FIG. 49 exemplarily illustrates the data write operation to the parallel dummy cells DCP of the first row.

Referring to FIG. 49, the parallel dummy cell DCP of the first row includes cell units CU1 and CU2 selected by the read word line RWL1.

Each of the write word lines WWL corresponding to the respective memory cell rows is shared by the memory cells MC and cell units CU of the same memory cell row. Therefore, the data write operation to the parallel dummy cell DCP of the first row is conducted using the write word line WWL1.

In the data write operation, a data write current flows as a reciprocating current through a dummy bit line pair DBLP that is formed from the dummy bit lines DBL1 and DBL2 coupled by the data bus /DB.

Accordingly, the write word line WWL1 is activated so that a data write current Ip flows therethrough. Moreover, a data write current Iw is applied to the dummy bit lines DBL1 and DBL2 as a reciprocating current. Thus, the storage data of different levels are respectively written to the cell units CU1 and CU2. It is herein assumed that the data "1" is written to the cell unit CU1, and data "0" is written to the cell unit CU2.

Regarding the parallel dummy cells DCP of the other memory cell rows as well, the same data write operation is conducted in parallel. As a result, the storage data "1" and "0" can be respectively written to two cell units of each parallel dummy cell DCP in a single write cycle.

Since the data read operation is the same as that of the fifth modification of the third embodiment, detailed description thereof will not be repeated. Thus, even when the structure of the seventh modification of the third embodiment is used, the data read operation can be conducted with a large signal margin by using the read reference voltage Vref that is reliably set to an intermediate value of the read voltages VH and VL while allowing manufacturing variation. Moreover, the data write time to the dummy memory cell can be reduced.

Note that, in the third embodiment and modifications thereof, the structures of the MTJ memory cell using a diode as access element as shown in FIGS. 14 and 15 may be applied to the memory cell MC and the cell unit CU of the dummy memory cell.

Fourth Embodiment

In the fourth embodiment, a structural example of a dummy memory cell including the same tunnel magnetic resistive element as that of the MTJ memory cell will be described.

Figure 50A:
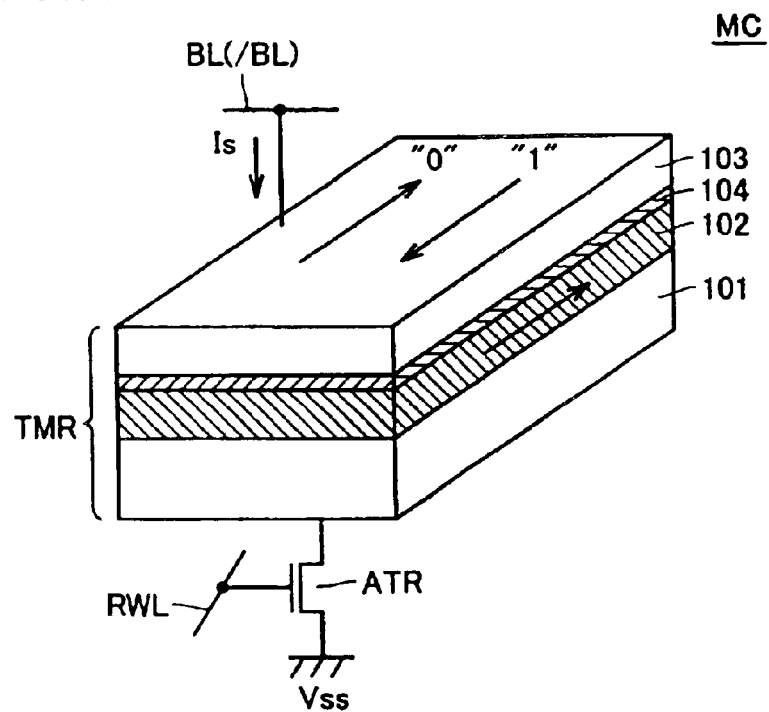
FIGS. 50A and 50B are conceptual diagrams illustrating a first structural example of a dummy memory cell according to a fourth embodiment of the present invention.
Figure 50B:
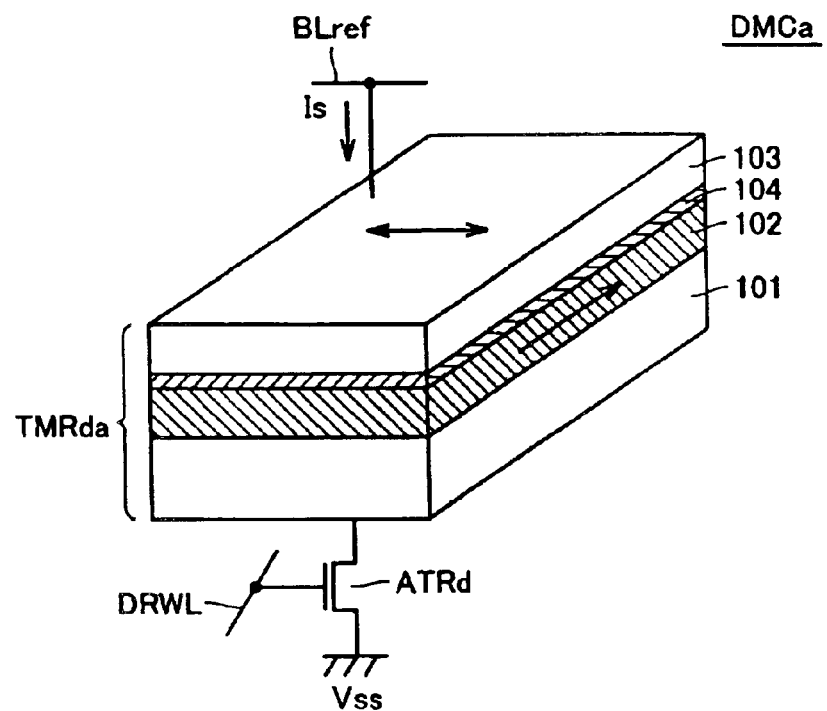

FIGS. 50A and 50B are conceptual diagrams illustrating a first structural example of a dummy memory cell according to the fourth embodiment.

FIG. 50A shows the structure of a normal memory cell MC for comparison.

Referring to FIG. 50A, the memory cell MC includes a tunnel magnetic resistive element TMR and an access transistor ATR. The access transistor ATR is turned ON in response to activation of a read word line RWL. As a result, the tunnel magnetic resistive element TMR is electrically coupled between a bit line BL or /BL and the ground voltage Vss, and receives supply of a sense current Is.

As described in the first embodiment, the tunnel magnetic resistive element TMR includes an antiferromagnetic layer 101, a fixed magnetic layer 102, a free magnetic layer 103, and a tunnel barrier 104 formed from an insulating film. The fixed magnetic layer 102 is magnetized in a fixed direction, whereas the free magnetic layer 103 is magnetized in a direction corresponding to a data write magnetic field generated by a data write current. Note that, in FIGS. 50A, 50B and the following figures, the tunnel barrier 104 is shown by a hatching pattern different from that of the first embodiment for convenience.

For example, by controlling a data write current according to the write data level, the free magnetic layer 103 is magnetized in the direction in parallel with that of the fixed magnetic layer 102 in order to store data "0", but is magnetized in the direction opposite to that of the fixed magnetic layer 102 in order to store data "1". An electric resistance value Rl for the storage data "0" is therefore smaller than an electric resistance value Rh for the storage data "1". As a result, a bit line BL (/BL) corresponding to the selected memory cell is subjected to a voltage change according to the storage data level in the selected memory cell, that is, according to the electric resistance value Rh, Rl.

FIG. 50B shows a dummy memory cell DMCa according to the first structural example of the fourth embodiment.

The dummy memory cell DMCa includes a dummy access transistor ATRd and a tunnel magnetic resistive element TMRda, which are connected in series between a reference bit line BLref and the ground voltage Vss.

The term "reference bit line BLref" herein collectively refers to one of the bit lines BL and /BL that is not coupled to the selected memory cell as in, e.g., FIG. 38, and a dummy bit line DBL in, e.g., FIG. 44. On the reference bit line BLref is produced a read reference voltage Vref for comparison with a voltage on the bit line BL (or /BL) coupled to the selected memory cell in the data read operation.

The dummy access transistor ATRd is turned ON in response to activation of a dummy read word line DRWL. In response to turning-ON of the dummy access transistor ATRd, the tunnel magnetic resistive element TMRda is electrically coupled between the reference bit line BLref and the ground voltage Vss, so that a sense current Is flows therethrough. In the ON state, the dummy access transistor ATRd has a channel resistance equal to that of the access transistor ATR in the memory cell MC.

The tunnel magnetic resistive element TMRda includes an antiferromagnetic layer 101, a fixed magnetic layer 102, a free magnetic layer 103 and a tunnel barrier 104, which are designed in the same manner as those of the tunnel magnetic resistive element TMR. The tunnel magnetic resistive element TMRda is different from the tunnel magnetic resistive element TMR in the memory cell MC in that the free magnetic layer 103 is magnetized in the direction perpendicular to the fixed magnetization direction of the fixed magnetic layer 102. The tunnel magnetic resistive element TMRda has the same shape as that of the tunnel magnetic resistive element TMR.

Accordingly, the electric resistance Rm of the tunnel magnetic resistive element TMRda is set to an intermediate value of the electric resistance of the case where the free magnetic layer 103 is magnetized in the same direction as that of the fixed magnetic layer 102 in the memory cell MC (electric resistance value Rl) and the electric resistance of the case where the free magnetic layer 103 is magnetized in the direction opposite to that of the fixed magnetic layer 102 in the memory cell MC (electric resistance value Rh). As described before, the electric resistance Rm is desirably set to Rm=Rl+(ΔR/2). The electric resistance Rm can be easily made close to the desired value by magnetizing the fixed magnetic layer 102 and the free magnetic layer 103 in the directions perpendicular to each other.

Such a structure enables a proper read reference voltage Vref to be produced on the reference bit line BLref by a dummy memory cell having a tunnel magnetic resistive element with the same structure as that of the memory cell and capable of being fabricated without complicating the manufacturing process.

Figure 51:
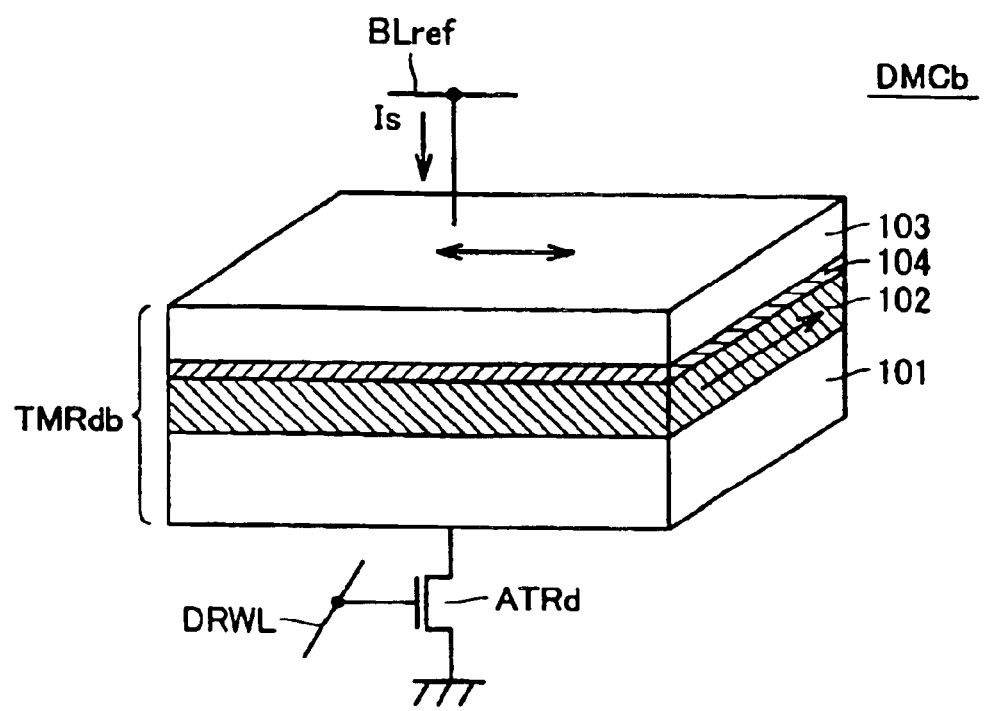
FIG. 51 is a structural diagram showing the structure of a dummy memory cell of a second structural example according to the fourth embodiment.

Referring to FIG. 51, a dummy memory cell DMcb according to a second structural example of the fourth embodiment includes a dummy access transistor ATRd and a tunnel magnetic resistive element TMdb, which are connected in series between the reference bit line BLref and the ground voltage Vss. The dummy access transistor ATRd is turned ON in response to activation of the dummy read word line DRWL. In the ON state, the dummy access transistor ATRd has a channel resistance equal to that of the access transistor ATR in the memory cell MC.

Thus, in response to activation of the dummy read word line DRWL, the tunnel magnetic resistive element TMRdb is electrically coupled between the reference bit line BLref and the ground voltage Vss, so that the sense current Is flows therethrough.

The tunnel magnetic resistive element TMRdb in the dummy memory cell DMCb has the same shape as that of the tunnel magnetic resistive element TMR in the memory cell. However, the tunnel magnetic resistive element TMRdb is arranged on the chip with its longitudinal and lateral directions reversed with respect to those of the tunnel magnetic resistive element TMR in the memory cell. In other words, the tunnel magnetic resistive element TMRdb is rotated by 90° in the horizontal plane of the figure with respect to the tunnel magnetic resistive element TMR in the memory cell. The free magnetic layer 103 is magnetized in the longitudinal direction, whereas the fixed magnetic layer 102 is magnetized in the direction perpendicular to that of the free magnetic layer 103.

Like the tunnel magnetic resistive element TMRda in FIG. 50B, the electric resistance value of the tunnel magnetic resistive element TMRdb is therefore set to an intermediate value of the electric resistances Rh and Rl of the memory cell MC.

As shown in FIGS. 50A, 50B and 51, the respective fixed magnetic layers 102 in the tunnel magnetic resistive elements TMRda and TMRdb have the same magnetization direction as that of the tunnel magnetic resistive element TMR in the memory cell MC. Accordingly, in manufacturing a chip, the fixed magnetic layer in the memory cell and the fixed magnetic layer in the dummy memory cell can be simultaneously magnetized in one direction, simplifying the manufacturing process.

In the tunnel magnetic resistive element TMRdb of FIG. 51, the free magnetic layer 103 can be easily magnetized in the longitudinal direction, that is, in the easy axis direction.

Figure 52:
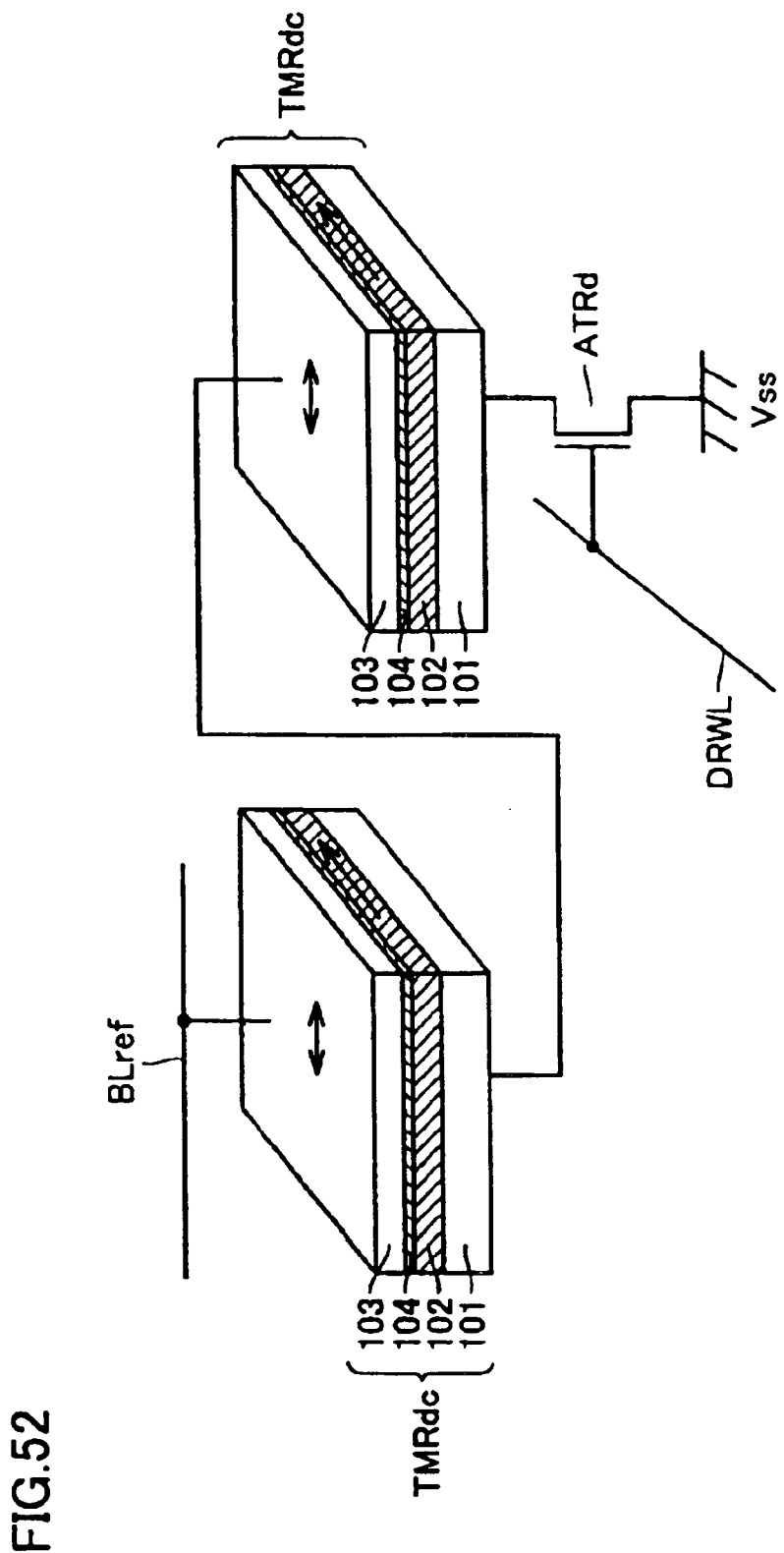
FIG. 52 is a conceptual diagram showing a third structural example of the dummy memory cell according to the fourth embodiment.

Referring to FIG. 52, a dummy memory cell DMCc according to a third structural example of the fourth embodiment includes K tunnel magnetic resistive elements TMRdc (where K is an integer equal to or larger than 2) and a dummy access transistor ATRd, which are coupled in series between the reference bit line BLref and the ground voltage Vss. FIG. 52 exemplarily shows the case of K=2.

The dummy access transistor ATRd is turned ON in response to activation of the dummy read word line DRWL. In the ON state, the dummy access transistor ATRd has a channel resistance equal to that of the access transistor ATR in the memory cell MC.

Figure 53:
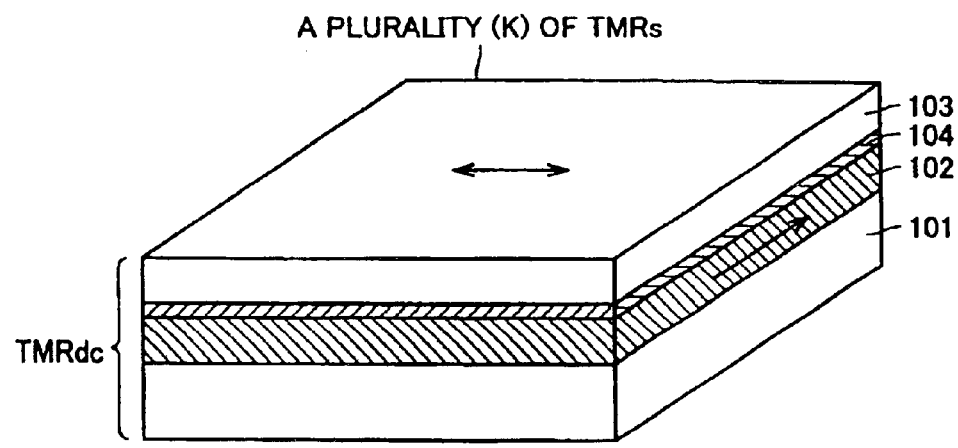
FIG. 53 is a conceptual diagram showing the structure of a tunnel magnetic resistive element in FIG. 52.

Referring to FIG. 53, each tunnel magnetic resistive element TMRdc is formed from combination of K tunnel magnetic resistive elements TMR in the memory cell MC. In other words, the area of the tunnel magnetic resistive element TMRdc is equal to the area of the tunnel magnetic resistive element TMR multiplied by K. In the tunnel magnetic resistive element TMRdc as well, the fixed magnetic layer 102 and the free magnetic layer 103 are magnetized in the directions perpendicular to each other, as in the tunnel magnetic resistive elements TMRda and TMRdb in FIGS. 50B and 51. Accordingly, the electric resistance of the tunnel magnetic resistive element TMRdc is given by Rm/K according to the area thereof.

In particular, when K=2, for example, the tunnel magnetic resistive element TMRdc has a shape close to square, so that the magnetization state can be stabilized in each of the fixed magnetic layer 102 and the free magnetic layer 103.

Referring back to FIG. 52, K tunnel magnetic resistive elements TMRdc each having the above structure are connected in series, and the electric resistance of the dummy memory cell DMCc is set in the same way as that in the case of the dummy memory cells DMCa and DMCb. This enables a proper read reference voltage Vref to be produced on the reference bit line BLref in response to activation of the dummy read word line DRWL.

Connecting a plurality of tunnel magnetic resistive elements TMRdc in series also enables suppression of a voltage that is applied to the tunnel barrier 104 formed from an insulating film in each tunnel magnetic resistive element. As described in the third embodiment, according to the common arrangement of dummy memory cells, a single dummy memory cell DMC is arranged for a multiplicity of memory cells MC. Therefore, a voltage (electric field) is frequently applied to the tunnel barrier (insulating film) in the tunnel magnetic resistive element of the dummy memory cell DMC. Accordingly, reducing a voltage that is applied to the tunnel barrier in each tunnel magnetic resistive element of the dummy memory cell allows for improved reliability of the dummy memory cell.

Figure 54:
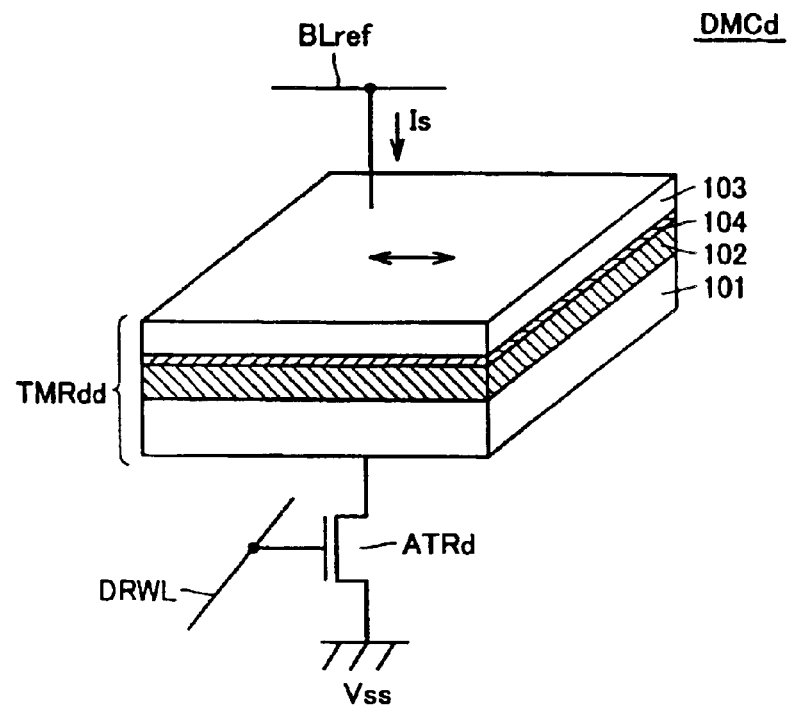
FIG. 54 is a conceptual diagram showing a fourth structural example of the dummy memory cell according to the fourth embodiment.

Referring to FIG. 54, a dummy memory cell DMCd according to a fourth structural example of the fourth embodiment includes a tunnel magnetic resistive element TMRdd and a dummy access transistor ATRd, which are coupled in series between the reference bit line BLref and the ground voltage Vss. The dummy access transistor ATRd is turned ON in response to activation of the dummy read word line DRWL. In the ON state, the dummy access transistor ATRd has a channel resistance equal to that of the access transistor ATR in the memory cell MC.

The area of the tunnel magnetic resistive element TMRdd is equal to that of the tunnel magnetic resistive element TMR in the memory cell, and the shape thereof is close to square. The dummy memory cell DMCd is thus formed from a single tunnel magnetic resistive element TMRdd. The fixed magnetic layer 102 and the free magnetic layer 103 in the tunnel magnetic resistive element TMRdd are magnetized in the directions perpendicular to each other, but the magnetization state in each magnetic layer can be stabilized.

Such a structure also enables a proper read reference voltage Vref to be produced on the reference bit line BLref in response to activation of the dummy read word line DRWL.

Note that data write operation for magnetizing the free magnetic layer 103 in a prescribed direction must be conducted for each of the above tunnel magnetic resistive elements TMRda to TMRdd.

Data write operation to the dummy memory cell can be periodically conducted during operation of the MRAM device. For example, data write operation to the dummy memory cell of the same memory cell column as that of the selected memory cell may be conducted in each data write cycle. This enables storage data of a prescribed content in the dummy memory cell to be retained more reliably.

Alternatively, a test mode independent of the normal operation may be provided in operation test after manufacturing a chip or in initialization cycle after power-on of the MRAM device so that data write operation to each dummy memory cell is conducted in the test mode. This enables data of a prescribed content to be written to a dummy memory cell without increasing the time required for data write operation in the normal operation.

First Modification of Fourth Embodiment

In the modifications of the fourth embodiment below, the tunnel magnetic resistive element in the dummy memory cell has the same electric resistance as that of the tunnel magnetic resistive element TMR in the memory cell MC.

Figure 55:
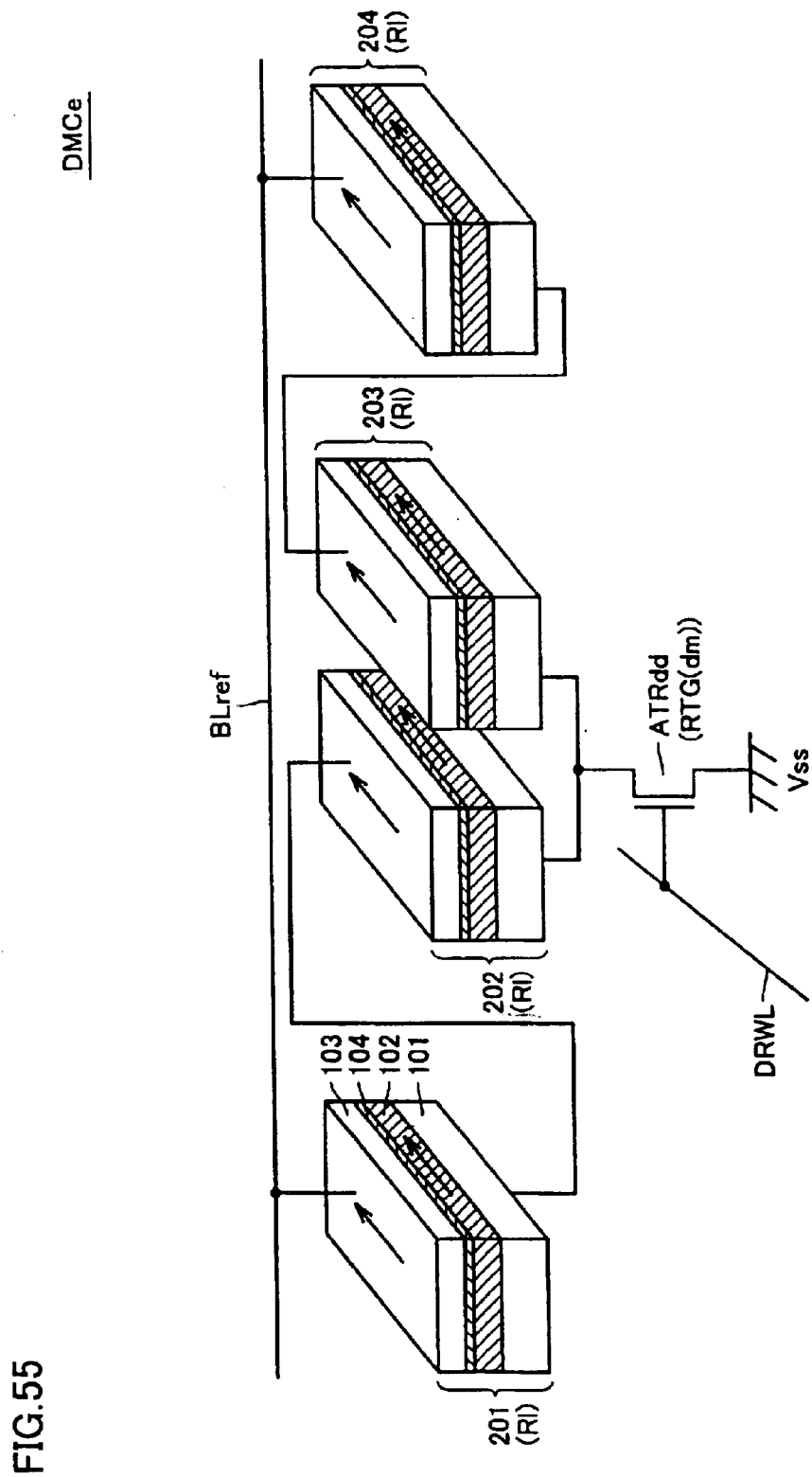
FIG. 55 is a schematic diagram showing the structure of a dummy memory cell according to a first modification of the fourth embodiment.

Referring to FIG. 55, a dummy memory cell DMCe according to the first modification of the fourth embodiment includes tunnel magnetic resistive elements 201, 202, 203 and 204 and a dummy access transistor ATRdd.

The tunnel magnetic resistive elements 201 to 204 are connected in series-parallel between the reference bit line BLref and the dummy access transistor ATRdd. More specifically, the tunnel magnetic resistive elements 201 and 202 are connected in series between the reference bit line BLref and the dummy access transistor ATRdd. Similarly, the tunnel magnetic resistive elements 203 and 204 are connected in series between the reference bit line BLref and the dummy access transistor ATRdd. The tunnel magnetic resistive elements 201, 202 and the tunnel magnetic resistive elements 203, 204 are connected in parallel with each other. Each of the tunnel magnetic resistive elements is thus connected in series with at least one of the remainder.

Each of the tunnel magnetic resistive elements 201 to 204 has the same shape and structure as those of the tunnel magnetic resistive element TMR in the memory cell MC, and their respective electric resistance values are each equal to the electric resistance value Rl in the memory cell MC. In other words, in each of the tunnel magnetic resistive elements 201 to 204, the free magnetic layer 103 and the fixed magnetic layer 102 are magnetized in the directions in parallel with each other, as in the memory cell storing data "0". Accordingly, a magnetic layer having a fixed magnetization direction may be used instead of the free magnetic layer 103. In this case, magnetization of the tunnel magnetic resistive elements in the dummy memory cell can be completed during manufacturing of a chip, eliminating the need to write data to the dummy memory cell during actual operation.

Figure 56:
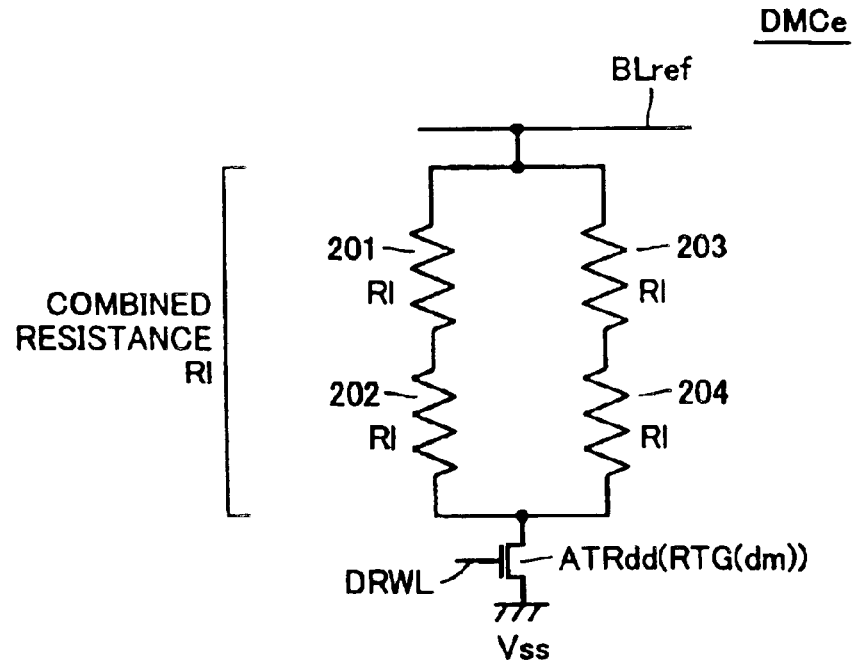
FIG. 56 is a circuit diagram showing an equivalent circuit of the dummy memory cell in FIG. 55.

FIG. 56 shows an equivalent circuit of the dummy memory cell DMCe.

Referring to FIG. 56, in the dummy memory cell DMCe, a combined resistance of the tunnel magnetic resistive elements 201 to 204 connected in series-parallel between the reference bit line BLref and the dummy access transistor ATRdd is equal to Rl. In the ON state, the dummy access transistor ATRdd has a channel resistance RTG(dm) given by RTG(dm)=RTG(MC)+(ΔR/2), where RTG(MC) is a channel resistance of the access transistor ATR in the memory cell MC in the ON state.

The channel resistance RTG(dm) can be obtained by reducing the ratio of channel width W to channel length L, that is, the ratio W/L, in the dummy access transistor ATRdd as compared to the access transistor ATR in the memory cell MC. More specifically, designing the access transistor ATR and the dummy access transistor ATRdd so that the respective channel widths are equal to each other and the channel length L of the dummy access transistor ATRdd is longer than that of the access transistor ATR enables fabrication of the dummy access transistor ATRdd having the channel resistance RTG(dm) in the ON state.

Such a structure enables a proper read reference voltage Vref to be produced on the reference bit line BLref by the dummy memory cell DMCe to which a sense current Is is applied in response to activation of the dummy read word line DRWL. Moreover, connecting a plurality of tunnel magnetic resistive elements in series between the reference bit line BLref and the ground voltage Vss allows for improved reliability of the tunnel barrier (insulating film) in the dummy memory cell to which a voltage is frequently applied, as in the case of the dummy memory cell DMCc in FIG. 52.

Second Modification of Fourth Embodiment

Figure 57:
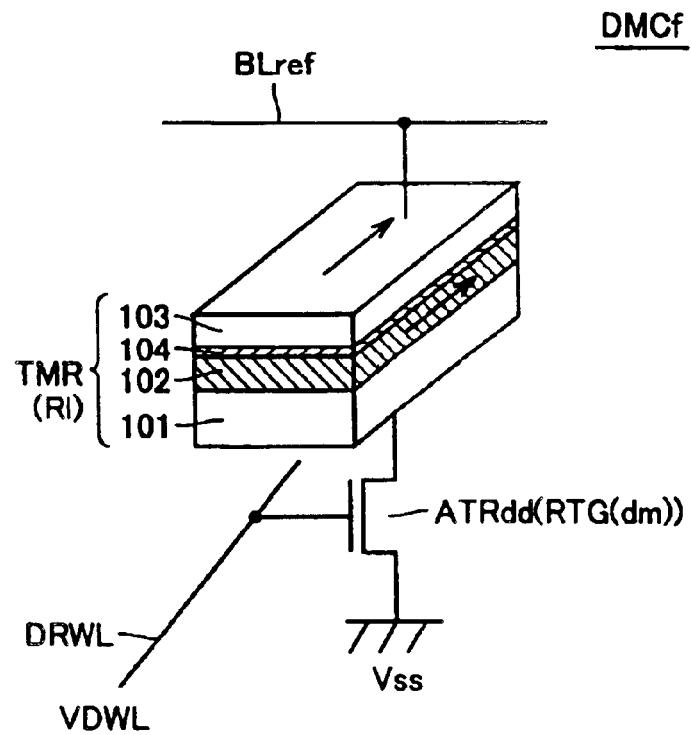
FIG. 57 is a schematic diagram showing the structure of a dummy memory cell according to a second modification of the fourth embodiment.

Referring to FIG. 57, a dummy memory cell DMCf according to the second modification of the fourth embodiment includes a tunnel magnetic resistive element TMR and a dummy access transistor ATRdd, which are connected in series between the reference bit line BLref and the ground voltage Vss. The tunnel magnetic resistive element TMR is the same as that in the memory cell MC. In the dummy memory cell DMCf, the magnetization direction of the free magnetic layer 103 in the tunnel magnetic resistive element TMR is fixed to the same direction as that of the fixed magnetic layer 102. As a result, the tunnel magnetic resistive element TMR has a fixed electric resistance value Rl. Instead of a single tunnel magnetic resistive element TMR, a plurality of tunnel magnetic resistive elements connected in series-parallel with each other and having a combined resistance Rl as shown in FIG. 55 may be used.

Accordingly, like the dummy memory cell DMCe in FIG. 55, magnetization of the tunnel magnetic resistive elements in the dummy memory cell can be completed during manufacturing of a chip, eliminating the need to write data to the dummy memory cell during actual operation.

In the structure of the second modification of the fourth embodiment, a voltage VDWL on the activated dummy read word line DRWL is a variable voltage that is adjustable.

Hereinafter, operation of the dummy memory cell according to the second modification of the fourth embodiment will be described in connection with FIG. 58.

Figure 58:
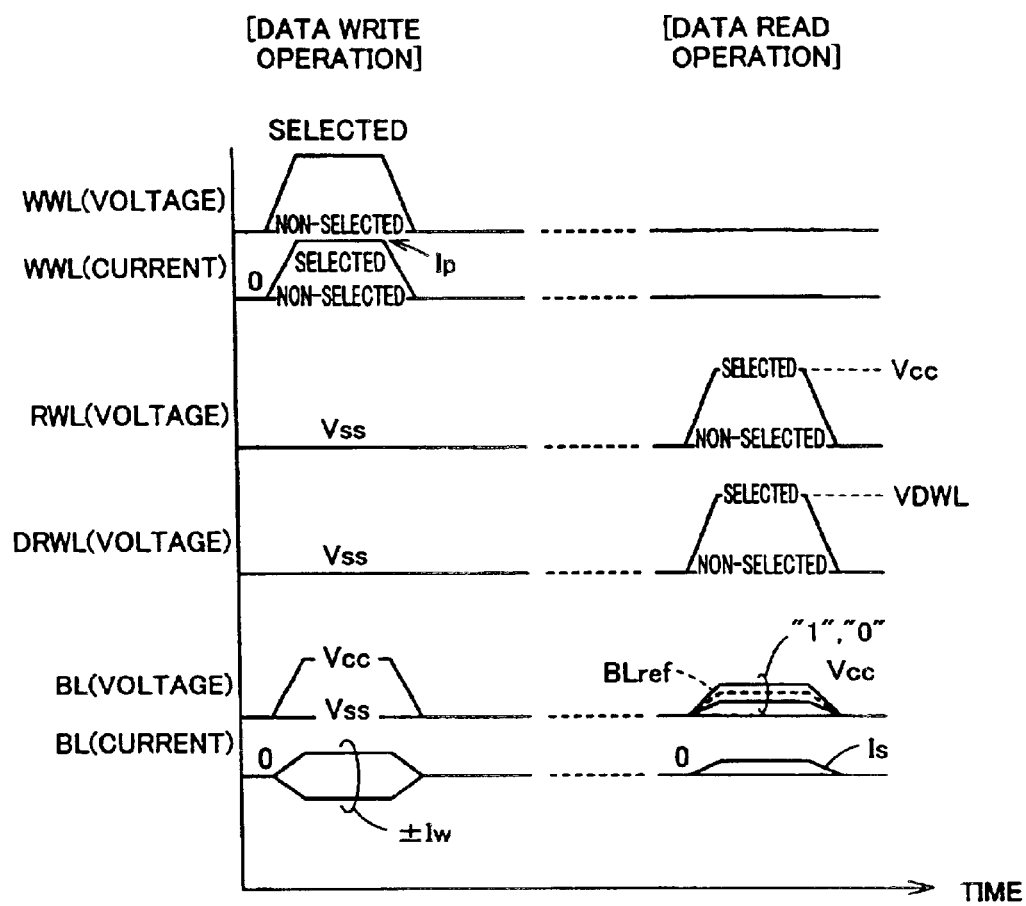
FIG. 58 is a timing chart illustrating operation of the dummy memory cell according to the second modification of the fourth embodiment.

Referring to FIG. 58, regarding the data write operation, operating waveforms upon writing data to the memory cell MC are shown. More specifically, in data write operation, the dummy read word line DRWL is inactive at L level (ground voltage Vss), and data is written to the selected memory cell by data write currents Ip and ±Iw respectively flowing through the write word line WWL and the bit line BL. As described before, data write operation to the dummy memory cell DMCf is not required during actual operation.

In data read operation, the read word line RWL corresponding to the selected row is activated to H level (power supply voltage Vcc). The dummy read word line DRWL is activated to H level in order to couple the dummy memory cell DMCf to the reference bit line BLref. In the active state (H level), the dummy read word line DRWL is set to a variable voltage VDWL. A sense current Is is supplied to the bit line corresponding to the selected memory cell and the reference bit line BLref coupled to the dummy memory cell.

The variable voltage VDWL is adjustable so that the dummy access transistor ATRdd in the dummy memory cell DMCf has a channel resistance RTG(dm). As a result, a read reference voltage Vref that is equal to an intermediate value of the bit line voltages respectively corresponding to the case where the storage data in the selected memory cell is "1" and "0" can be produced on the reference bit line BLref.

Such a structure enables the electric resistance produced by the dummy memory cell DMCf to be optimally adjusted according to manufacturing variation of the dummy access transistor ATRdd and the tunnel magnetic resistive element TMR. As a result, the read reference voltage Vref can be adjusted to the level capable of assuring the maximum data read margin.

Third Modification of Fourth Embodiment

Figure 59:
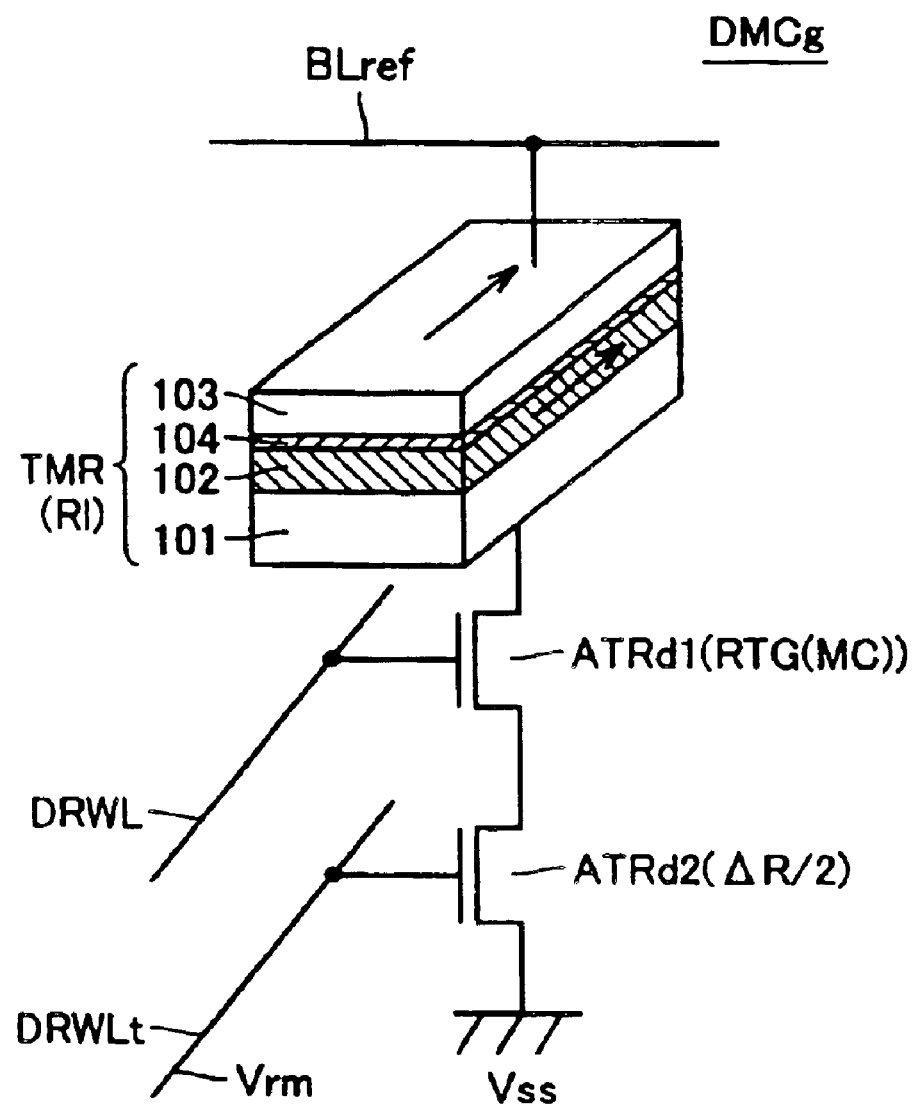
FIG. 59 is a conceptual diagram showing the structure of a dummy memory cell according to a third modification of the fourth embodiment.

Referring to FIG. 59, the dummy memory cell DMCg according to the third modification of the fourth embodiment includes a tunnel magnetic resistive element TMR and dummy access transistors ATRd1 and ATRd2. The tunnel magnetic resistive element TMR and the dummy access transistors ATRd1 and ATRd2 are coupled in series between the reference bit line BLref and the ground voltage Vss.

In the tunnel magnetic resistive element TMR, the magnetization direction of the free magnetic layer 103 is fixed to the same direction as that of the fixed magnetic layer 102, as in the case of the dummy memory cell DMCf in FIG. 57. As a result, the tunnel magnetic resistive element TMR has a fixed electric resistance value Rl.

The access transistor ATRd1 has its gate connected to a corresponding dummy read word line DRWL. The access transistor ATRd2 has its gate connected to a wiring DRWLt for supplying a control voltage Vrm. The access transistor ATRd1 is designed to have the same ratio of channel width to channel length, W/L, as that of the access transistor ATR in the memory cell MC. The access transistor ATRd2 is designed to have the same ratio of channel width to channel length, W/L, as that of the dummy access transistor ATRdd.

Hereinafter, operation of the dummy memory cell DMCg will be described.

Figure 60:
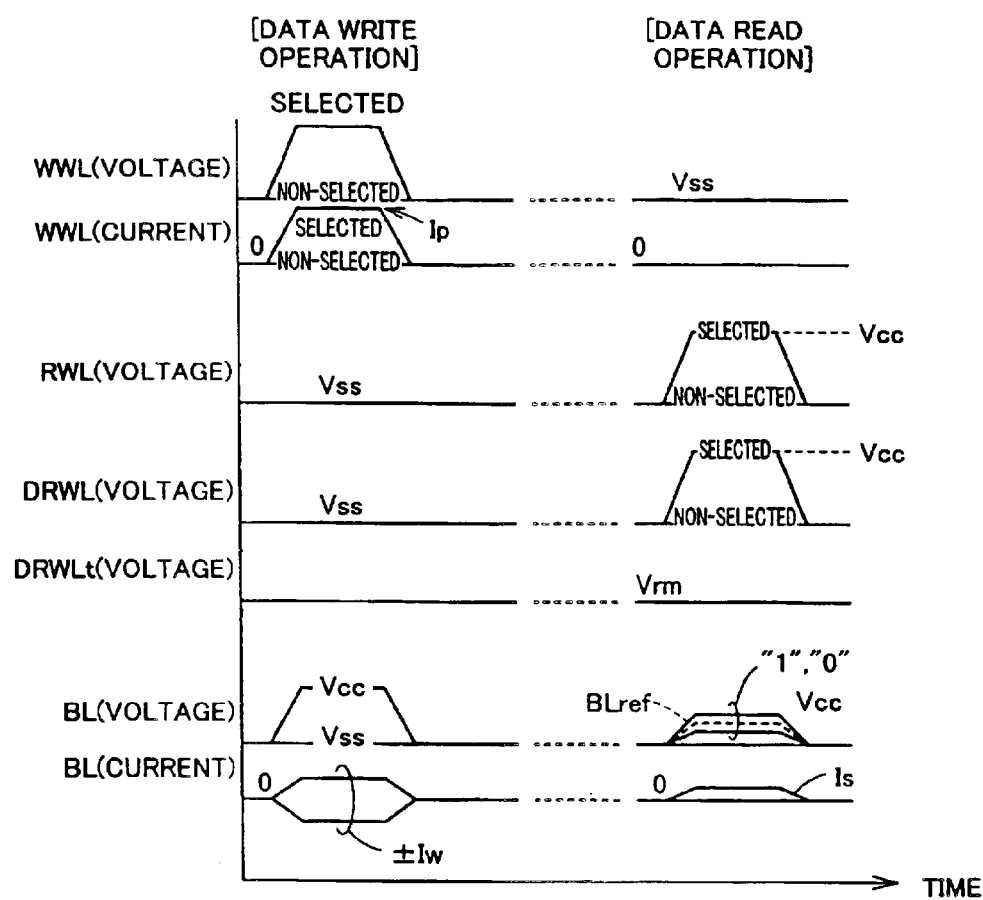
FIG. 60 is a timing chart illustrating operation of the dummy memory cell according to the third modification of the fourth embodiment.

Referring to FIG. 60, in data read operation, a voltage on the activated dummy read word line DRWL is set to the power supply voltage Vcc, as in the case of the read word line RWL corresponding to the selected memory cell. The wiring DRWLt connected to the gate of the access transistor ATRd2 transmits the control voltage Vrm.

Accordingly, the dummy access transistor ATRd1 turned ON in response to activation of the dummy read word line DRWL has the same channel resistance RTG(MC) as that of the access transistor ATR in the selected memory cell MC turned ON in response to activation of the read word line RWL.

The channel resistance of the dummy access transistor ATRd2 varies according to the control voltage Vrm. Accordingly, adjusting the control voltage Vrm so that the dummy access transistor ATRd2 has a channel resistance ΔR/2 enables proper adjustment of the level of the read reference voltage Vref produced on the reference bit line BLref. Thus, by tuning the control voltage Vrm, the read reference voltage Vref can be adjusted to the level capable of assuring the maximum data read margin.

Since the data write operation is the same as that of FIG. 58, detailed description thereof will be omitted. Note that, since the dummy memory cell DMCg has a fixed magnetization direction, data write operation to the dummy memory cell need not be conducted during actual operation. Supply of the control voltage Vrm to the wiring DRWLt may be discontinued in the data write operation.

Fourth Modification of Fourth Embodiment

Figure 61:
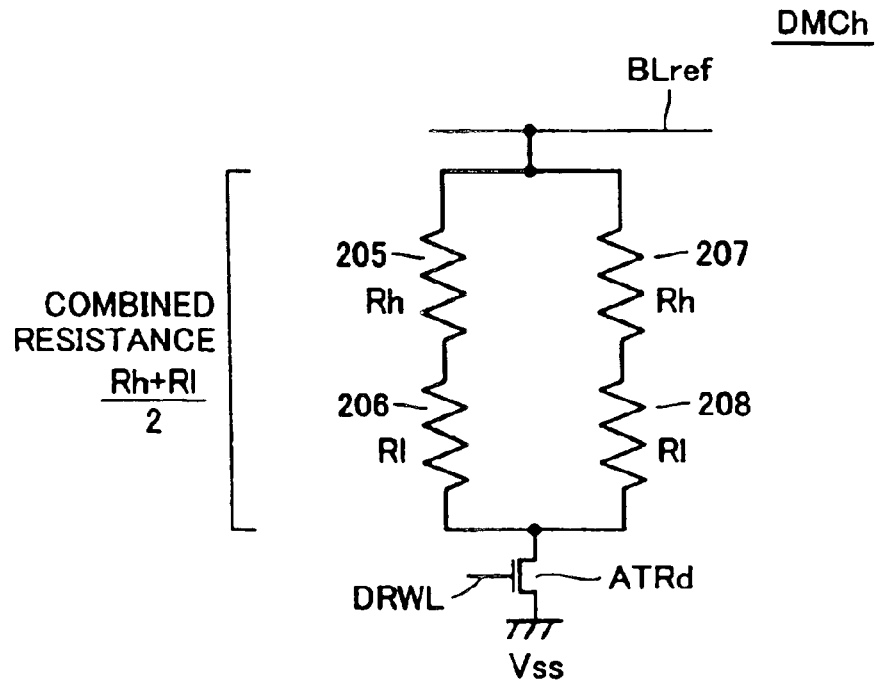
FIG. 61 is a conceptual diagram showing the structure of a dummy memory cell according to a fourth modification of the fourth embodiment.

Referring to FIG. 61, a dummy memory cell DMCh according to the fourth modification of the fourth embodiment includes tunnel magnetic resistive elements 205, 206, 207 and 208 and a dummy access transistor ATRd. The tunnel magnetic resistive elements 205, 206, 207 and 208 are connected in series-parallel between the reference bit line BLref and the dummy access transistor ATRd. Each of the tunnel magnetic resistive elements 205 to 208 has the same shape and structure as those of the tunnel magnetic resistive element TMR in the memory cell MC.

One of the tunnel magnetic resistive elements 205 and 206 has storage data "1" written therein and thus has an electric resistance value Rh. The other tunnel magnetic resistive element has storage data "0" written therein and thus has an electric resistance value Rl. Similarly, one of the tunnel magnetic resistive elements 207 and 208 has an electric resistance value Rl and the other has an electric resistance value Rh. Accordingly, the combined resistance of the tunnel magnetic resistive elements 205 to 208 is (Rh+Rl)/2=Rl+(ΔR/2).

The dummy access transistor ATRd is turned ON in response to activation of the dummy read word line DRWL, and has the same channel resistance RTG(MC) as that of the access transistor ATR in the memory cell MC. Accordingly, a proper read reference voltage Vref can be produced on the reference bit line BLref in response to activation of the dummy read word line DRWL.

Hereinafter, data write operation to the tunnel magnetic resistive elements in FIG. 61 will be described in connection with FIG. 62.

Figure 62:
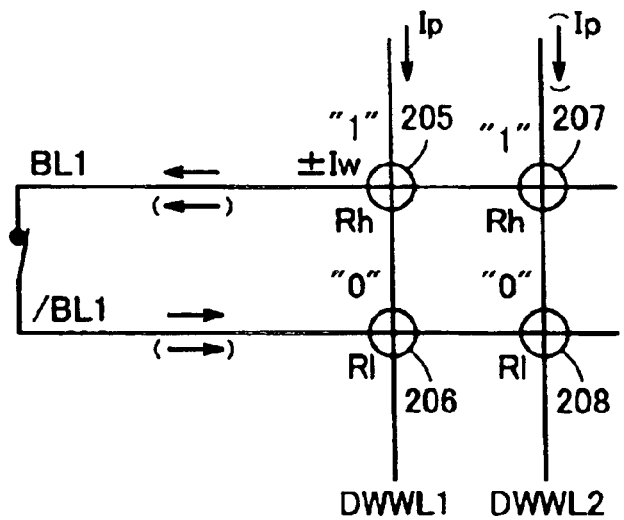
FIG. 62 is a conceptual diagram illustrating data write operation to a tunnel magnetic resistive element in FIG. 61.

In FIG. 62, the tunnel magnetic resistive elements 205 to 208 in a single dummy memory cell DMCh are arranged in two rows by two columns. Such a structure enables the dummy memory cell DMCh to be provided on each memory cell column. FIG. 62 shows arrangement of the dummy memory cell on the first memory cell column. In data write operation, bit lines BL1 and /BL1 are electrically coupled to each other at their respective one ends, so that a data write current ±Iw flows therethrough as a reciprocating current.

First, a data write current Iw is applied to the bit lines BL1 and /BL1 with a dummy write word line DWWL1 being activated, whereby the storage data "1" and "0" can be written to the tunnel magnetic resistive elements 205 and 206, respectively. As a result, the electric resistance values of the tunnel magnetic resistive elements 205 and 206 are set to Rh and Rl, respectively.

Then, a dummy write word line DWWL2 is activated so that a data write current Ip flows therethrough, and the data write current Iw is applied to the bit lines BL1 and /BL1 in the same direction as that described above. Thus, the storage data "1" and "0" can be written to the tunnel magnetic resistive elements 207 and 208, respectively. As a result, the electric resistance values of the tunnel magnetic resistive elements 207 and 208 are set to Rh and Rl, respectively.

Thus conducting the data write operation to the tunnel magnetic resistive elements 205 to 208 enables implementation of the dummy memory cell DMCf producing a proper read reference voltage Vref.

Note that, as described in the fourth embodiment, the data write operation to the dummy memory cell may be conducted periodically (e.g., in each data write cycle) during operation of the MRAM device in order to retain storage data of a prescribed content in the dummy memory cell in a more reliable manner. Alternatively, in order to write data of a prescribed content to the dummy memory cell without increasing the time required for data write operation in the normal operation, a test mode independent of the normal operation may be provided in operation test after manufacturing a chip or in initialization cycle after power-on of the MRAM device so that data write operation to the dummy memory cells corresponding to the respective memory cell columns is conducted in parallel in the test mode.

Fifth Modification of Fourth Embodiment

Figure 63:
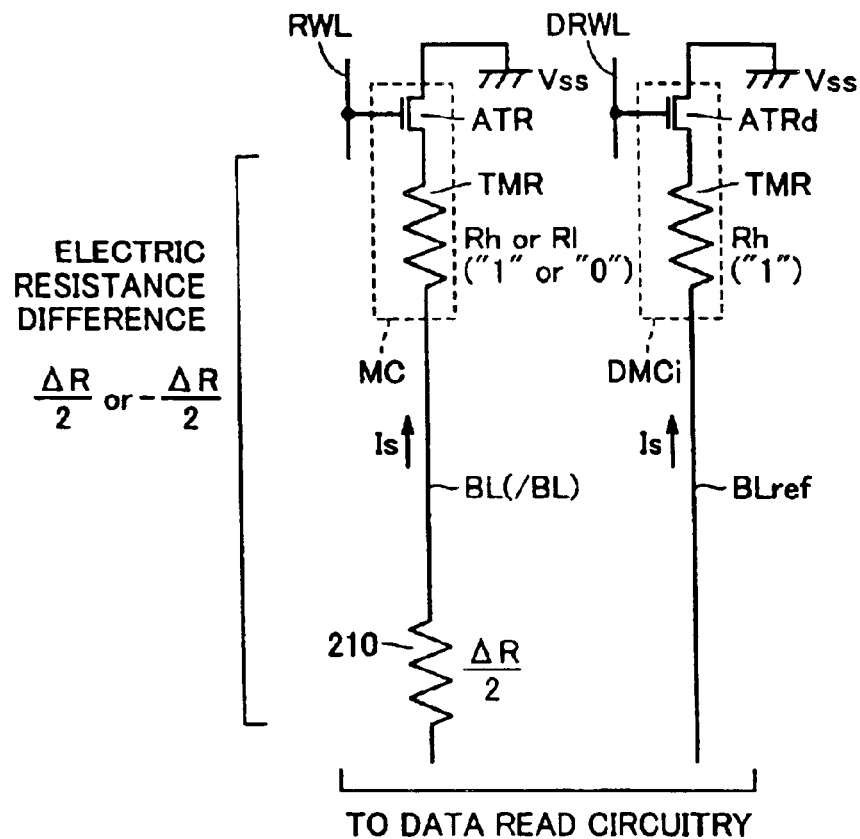
FIG. 63 is a conceptual diagram illustrating the structure of a dummy memory cell according to a fifth modification of the fourth embodiment.

Referring to FIG. 63, a dummy memory cell DMCi according to the fifth modification of the fourth embodiment includes a tunnel magnetic resistive element TMR and a dummy access transistor ATRd, which are connected in series between the reference bit line BLref and the ground voltage Vss.

The tunnel magnetic resistive element TMR in the dummy memory cell DMCi has the same structure and shape as those of the tunnel magnetic resistive element TMR in the memory cell MC, and is magnetized in such a direction that it has an electric resistance value Rh. In the ON state, the dummy access transistor ATRd has a channel resistance RTG(MC) like the access transistor ATR in the memory cell MC.

The memory cell MC includes an access transistor ATR and a tunnel magnetic resistive element TMR, which are connected in series between the bit line BL (/BL) and the ground voltage Vss. In the ON state, the access transistor ATR in the memory cell MC has a channel resistance RTG(MC). The electric resistance of the tunnel magnetic resistive element TMR in the memory cell MC is either Rh or Rl according to the storage data level.

In the structure of the fifth modification of the fourth embodiment, a resistive element 210 is provided in series between a data read circuit and the selected memory cell. The electric resistance value of the resistive element 210 is smaller than the difference between electric resistances, AR, corresponding to the difference between the storage data levels in the memory cell MC, and is desirably set to ($\Delta R/2$).

The not-shown data read circuit generates read data according to the voltage difference between the bit line BL (/BL) coupled in series with the selected memory cell and the resistive element 210 and the reference bit line BLref on which a read reference voltage Vref is produced. The difference in electric resistance between the path of the sense current Is corresponding to the selected memory cell and the path of the sense current Is corresponding to the dummy memory cell DMCi is therefore either ($\Delta R/2$) or $-(\Delta R/2)$. Accordingly, data read operation can be conducted by comparing the voltages on the bit line BL (/BL) and the reference bit line BLref with each other.

Such a structure enables the memory cell MC and the dummy memory cell DMC to have the same structure on the memory array. As a result, the data read margin can be assured according to manufacturing variation of the tunnel magnetic resistive element TMR.

For example, the dummy memory cell DMCi is provided for each of the bit lines BL and /BL.

Figure 64:
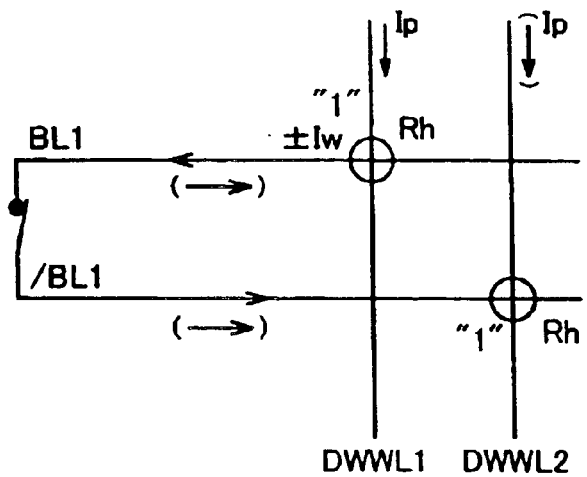
FIG. 64 is a conceptual diagram illustrating data write operation to the dummy memory cell in FIG. 63.

FIG. 64 is a conceptual diagram illustrating data write operation to the dummy memory cell in FIG. 63. FIG. 64 shows the arrangement of dummy memory cells on the first memory cell column.

Referring to FIG. 64, in data write operation, bit lines BL1 and /BL1 are electrically coupled to each other at their respective one ends, so that a data write current +Iw flows therethrough as a reciprocating current.

In the first cycle, a dummy write word line DWWL1 is activated so that a data write current Ip flows therethrough. Moreover, a data write current +Iw is supplied to the bit line BL1. This enables the storage data "1" to be written to the dummy memory cell DMCi corresponding to the dummy write word line DWWL1, whereby the electric resistance thereof is set to Rh.

In the following cycle, a dummy write word line DWWL2 is activated and a data write current Iw is supplied in the direction opposite to that described above. This enables the storage data "1" to be written to the dummy memory cell DMCi corresponding to the dummy write word line DWWL2. Thus conducting two write cycles allows the storage data "1" to be written to each of the dummy memory cells DMCi corresponding to each memory cell column, whereby the respective electric resistance values thereof are set to Rh.

As described before, the data write operation to the dummy memory cell DMCi may be conducted during operation of the MRAM device (for example, in each data write cycle), or in the test mode that is set either during operation test after manufacturing a chip or in the initialization cycle after power-on of the MRAM device.

Figure 65:
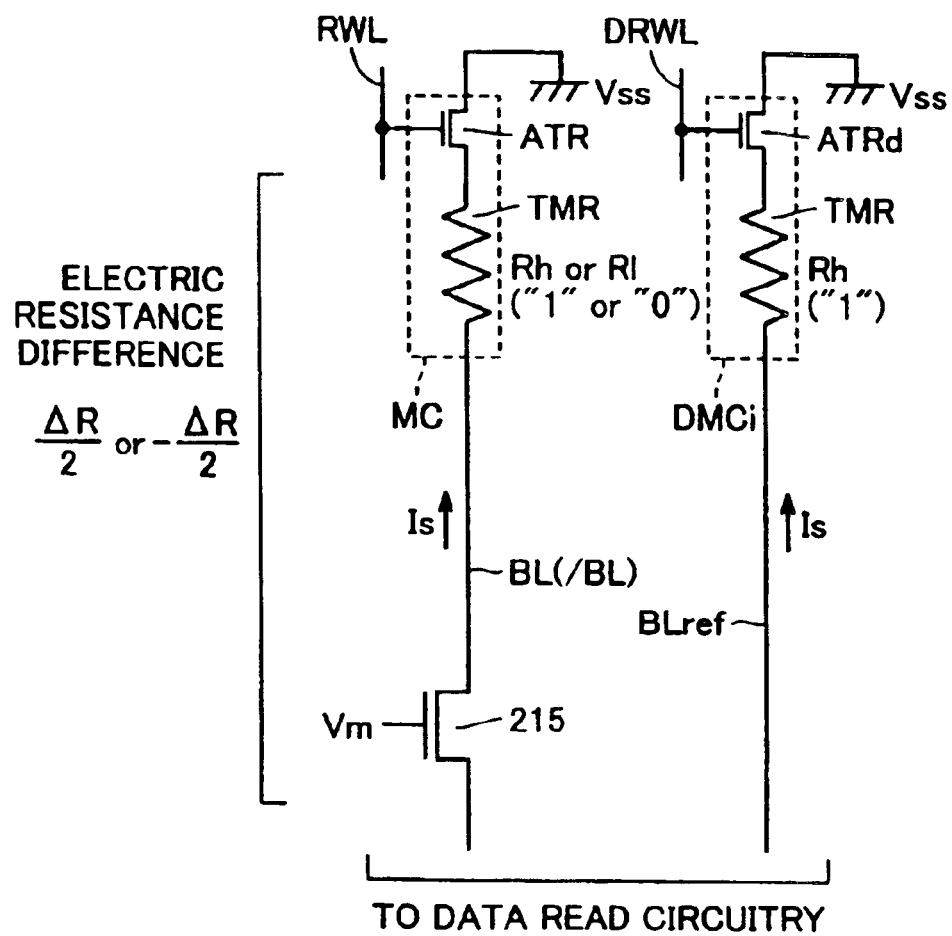
FIG. 65 is a diagram showing another structural example of a resistive element in FIG. 63.

As shown in FIG. 65, the resistive element 210 may be formed from a MOS (metal oxide semiconductor) transistor 215 receiving an adjustable control voltage Vm at its gate. Such a structure enables the resistance value of the MOS transistor 215 to be adjusted according to the value of the control voltage Vm. Accordingly, adjustment capable of assuring the maximum read operation margin in the MRAM device can be conducted according to manufacturing variation and the like.

Note that the fourth embodiment and the modifications thereof may be applied to an MTJ memory cell using a diode as access element as shown in FIGS. 14 and 15.

Although the present invention has been described and illustrated in detail, it is clearly understood that the same is by way of illustration and example only and is not to be taken by way of limitation, the sprit and scope of the present invention being limited only by the terms of the appended claims.

What is claimed is:

1. A thin film magnetic memory device, comprising:
    a plurality of memory cells for storing data, wherein each of said memory cells includes
        an access gate selectively turned ON in data read operation, and
        a magnetic storage portion connected in series with said access gate, and having either a first electric resistance or a second electric resistance higher than said first electric resistance depending on the stored data, and
    said thin film magnetic memory device further comprising:
    a data line that is electrically coupled to a selected memory cell through a turned-ON access gate of said selected memory cell in said data read operation, said selected memory cell being a memory cell selected from said plurality of memory cells for said data read operation;
    a reference data line for transmitting in said data read operation a read reference voltage for comparison with a voltage on said data line; and
    a plurality of dummy memory cells for producing said read reference voltage, wherein each of said dummy memory cells includes
        a dummy access gate selectively turned ON in said data read operation, and
        a plurality of dummy magnetic storage portions are electrically coupled to said reference data line in response to turning-ON of said dummy access gate, and each having either said first electric resistance or said second electric resistance depending on data written therein,
    each of said dummy magnetic storage portions is connected in series with at least another one of the plurality of dummy magnetic storage portions.

2. A thin film magnetic memory device comprising:
    a plurality of memory cells for storing data, wherein each of said memory cells includes
        an access gate selectively turned ON in data read operation, and
        a magnetic storage portion connected in series with said access gate, and having either a first electric resistance or a second electric resistance higher than said first electric resistance depending on the stored data, and
    said thin film magnetic memory device further comprising:
    a data line that is electrically coupled to a selected memory cell through a turned-ON access gate of said selected memory cell in said data read operation, said selected memory cell being a memory cell selected from said plurality of memory cells for said data read operation;

a reference data line for transmitting in said data read operation a read reference voltage for comparison with a voltage on said data line; and a plurality of dummy memory cells for producing said read reference voltage, wherein each of said dummy memory cells includes
a dummy access gate selectively turned ON in said data read operation, and
a plurality of dummy magnetic storage portions that are electrically coupled to said reference data line in response to turning-ON of said dummy access gate, each of said dummy magnetic storage portions is connected in series with at least another one of the plurality of dummy magnetic storage portions; and wherein each of said dummy magnetic storage portions is further connected in parallel with at least another one of the plurality of dummy magnetic storage portions.

3. A thin film magnetic memory device composing:

a plurality of memory cells for storing data, wherein each of said memory cells includes
an access gate selectively turned ON in data read operation, and
a magnetic storage portion connected in series with said access gate, and having either a first electric resistance or a second electric resistance higher than said first electric resistance depending on the stored data, and said thin film magnetic memory device further comprising:

a data line that is electrically coupled to a selected memory cell through a turned-ON access gate of said selected memory cell in said data read operation, said selected memory cell being a memory cell selected from said plurality of memory cells for said data read operation;

a reference data line for transmitting in said data read operation a read reference voltage for comparison with a voltage on said data line; and a plurality of dummy memory cells for producing said read reference voltage, wherein each of said dummy memory cells includes
a dummy access gate selectively turned ON in said data read operation, and
a plurality of dummy magnetic storage portions that are electrically coupled to said reference data line in response to turning-ON of said dummy access gate, each of said dummy magnetic storage portions is connected in series with at least another one of the plurality of dummy magnetic storage portions; and wherein a combined resistance of said plurality of dummy magnetic storage portions is equal to a third electric resistance corresponding to an intermediate value of said first and second electric resistances, and said dummy access gate in an ON state has an electric resistance equal to an electric resistance of said access gate in an ON state.

4. A thin film magnetic memory device comprising:

a plurality of memory cells for storing data, wherein each of said memory cells includes
an access gate selectively turned ON in data read operation, and
a magnetic storage portion connected in series with said access gate, and having either a first electric resistance or a second electric resistance higher than said first electric resistance depending on the stored data, and said thin film magnetic memory device further comprising:

a data line that is electrically coupled to a selected memory cell through a turned-ON access gate of said selected memory cell in said data read operation, said selected memory cell being a memory cell selected from said plurality of memory cells for said data read operation;

a reference data line for transmitting in said data read operation a read reference voltage for comparison with a voltage on said data line; and a plurality of dummy memory cells for producing said read reference voltage, wherein each of said dummy memory cells includes
a dummy access gate selectively turned ON in said data read operation, and
a plurality of dummy magnetic storage portions that are electrically coupled to said reference data line in response to turning-ON of said dummy access gate, each of said dummy magnetic storage portions is connected in series with at least another one of the plurality of dummy magnetic storage portions; and wherein, in normal data write operation, data is written to at least one of said dummy magnetic storage portions in parallel with said magnetic storage portion in a memory cell selected from said plurality of memory cells for said data write operation.

5. A thin film magnetic memory device comprising:

a plurality of memory cells for storing data, wherein each of said memory cells includes
an access gate selectively turned ON in data read operation, and
a magnetic storage portion connected in series with said access gate, and having either a first electric resistance or a second electric resistance higher than said first electric resistance depending on the stored data, and said thin film magnetic memory device further comprising:

a data line that is electrically coupled to a selected memory cell through a turned-ON access gate of said selected memory cell in said data read operation, said selected memory cell being a memory cell selected from said plurality of memory cells for said data read operation;

a reference data line for transmitting in said data read operation a read reference voltage for comparison with a voltage on said data line; and a plurality of dummy memory cells for producing said read reference voltage, wherein each of said dummy memory cells includes
a dummy access gate selectively turned ON in said data read operation, and
a plurality of dummy magnetic storage portions that are electrically coupled to said reference data line in response to turning-ON of said dummy access gate, each of said dummy magnetic storage portions is connected in series with at least another one of the plurality of dummy magnetic storage portions, and further comprising a test mode for writing prescribed data to each of said dummy memory cells, said test mode being conducted independently of normal operation, wherein data is written to at least one of said dummy magnetic storage portions in said test mode.

* * * * *